(12) United States Patent
Nakasuji et al.

(10) Patent No.: US 7,420,164 B2
(45) Date of Patent: Sep. 2, 2008

(54) OBJECTIVE LENS, ELECTRON BEAM SYSTEM AND METHOD OF INSPECTING DEFECT

(75) Inventors: Mamoru Nakasuji, Yokohama (JP); Tohru Satake, Chigasaki (JP); Hirosi Sobukawa, Isehara (JP); Takeshi Murakami, Tokyo (JP); Kenji Watanabe, Hiratsuka (JP); Nobuharu Noji, Zushi (JP)

(73) Assignee: Ebara Corporation, Tokyo (JP)

( * ) Notice: Subject to any disclaimer, the term of this patent is extended or adjusted under 35 U.S.C. 154(b) by 402 days.

(21) Appl. No.: 11/136,668

(22) Filed: May 25, 2005

(65) Prior Publication Data

US 2005/0263715 A1   Dec. 1, 2005

(30) Foreign Application Priority Data

| | | | |
|---|---|---|---|
| May 26, 2004 | (JP) | ............................. | 2004-156386 |
| Jun. 8, 2004 | (JP) | ............................. | 2004-169675 |
| Jun. 30, 2004 | (JP) | ............................. | 2004-192654 |
| Jun. 30, 2004 | (JP) | ............................. | 2004-192655 |

(51) Int. Cl.
  *H01J 1/50* (2006.01)
(52) U.S. Cl. ...................... 250/307; 250/310
(58) Field of Classification Search .......... 250/396 ML, 250/396 R, 397, 398, 399, 306, 307, 310, 250/311

See application file for complete search history.

(56) References Cited

U.S. PATENT DOCUMENTS

| | | | | |
|---|---|---|---|---|
| 7,022,986 | B2 * | 4/2006 | Shinada et al. | ............... 250/310 |
| 7,129,485 | B2 * | 10/2006 | Nakasuji et al. | ............. 250/310 |
| 7,244,932 | B2 * | 7/2007 | Nakasuji et al. | ............. 250/306 |
| 7,247,848 | B2 * | 7/2007 | Nakasuji et al. | ............. 250/306 |
| 2002/0148961 | A1 * | 10/2002 | Nakasuji et al. | ............. 250/311 |
| 2003/0098415 | A1 * | 5/2003 | Matsuya et al. | ............. 250/306 |

* cited by examiner

*Primary Examiner*—Jack I. Berman
*Assistant Examiner*—Michael Maskell
(74) *Attorney, Agent, or Firm*—Westerman, Hattori, Daniels & Adrian, LLP.

(57) ABSTRACT

An electron beam system or a method for manufacturing a device using the electron beam system in which an electron beam can be irradiated at a high current density and a ratio of transmittance of a secondary electron beam of an image projecting optical system can be improved and which can be compact in size. The surface of the sample S is divided into plural stripe regions which in turn are divided into rectangle-shaped main fields. The main field is further divided into plural square-shaped subfields. The irradiation with the electron beams and the formation of a two-dimensional image are repeated in a unit of the subfields. A magnetic gap formed by the inner and outer magnetic poles of the objective lens is formed on the side of the sample, and an outer side surface and an inner side surface of each of the inner magnetic pole and the outer magnetic pole, respectively, forming the magnetic gap have each part of a conical shape with a convex having an angle of 45° or greater with respect to the optical axis.

1 Claim, 26 Drawing Sheets

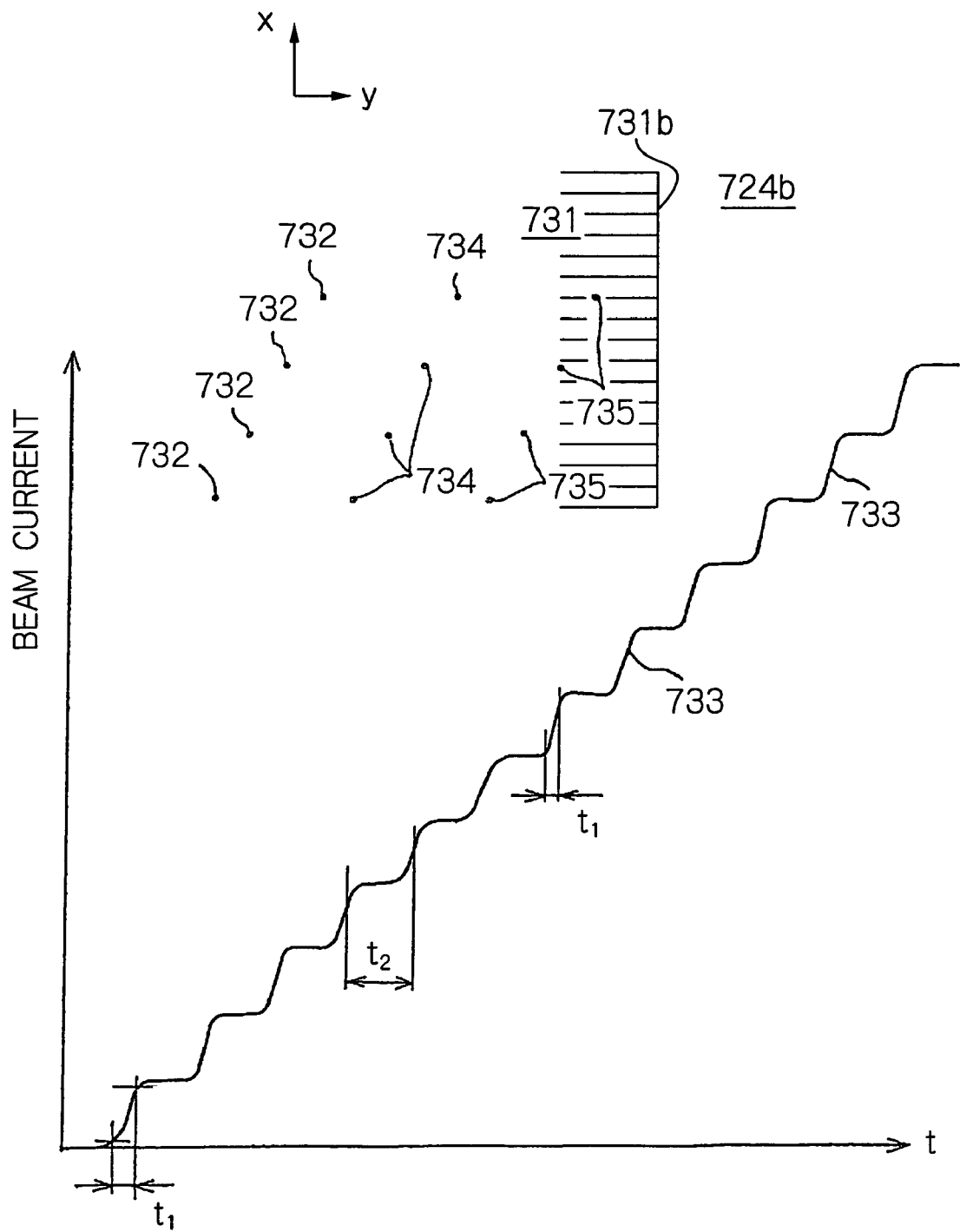

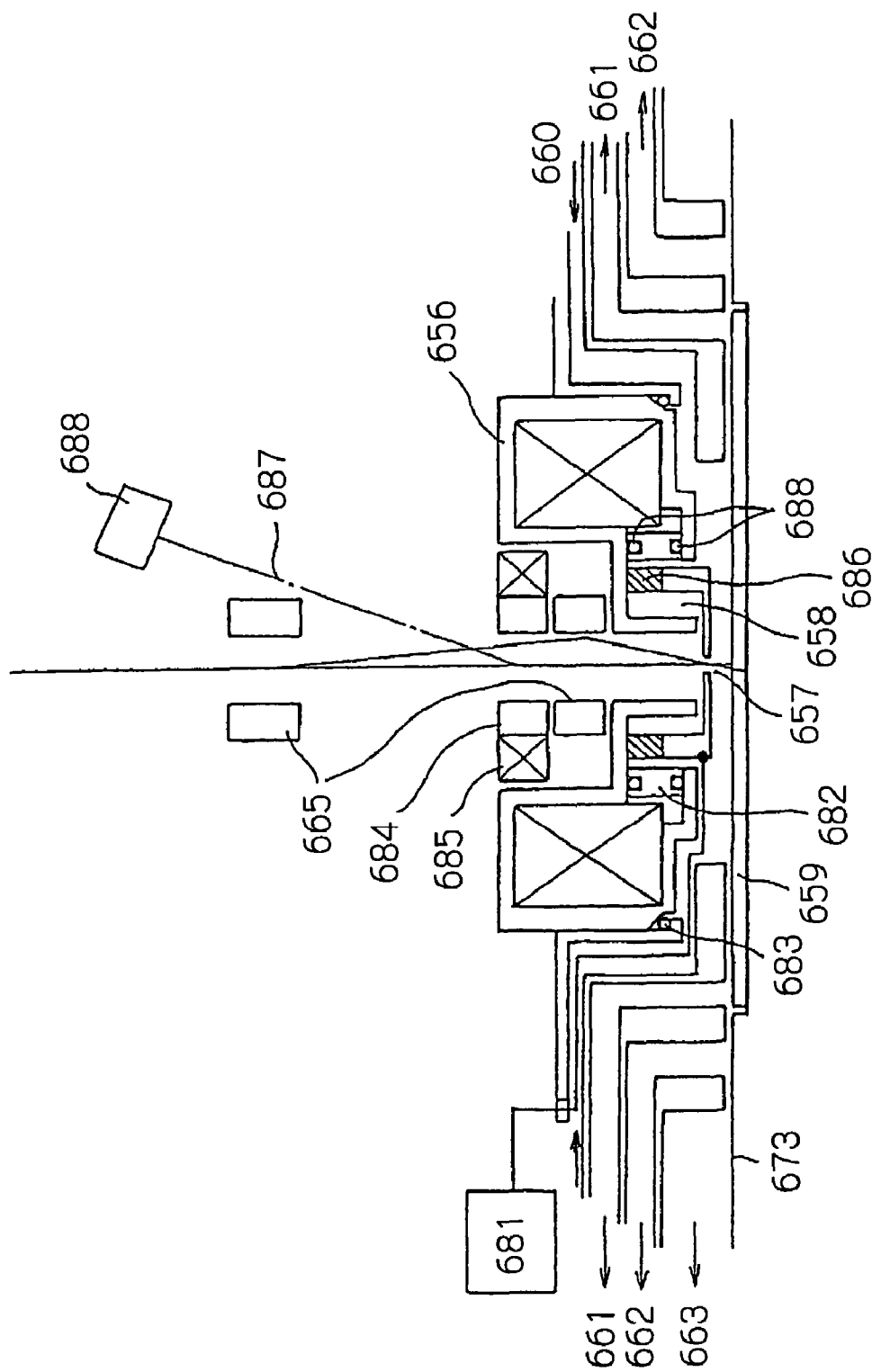

OBJECTIVE LENS, ELECTRON BEAM SYSTEM AND METHOD OF INSPECTING DEFECT

TECHNICAL FIELD

The present invention relates to a high throughput apparatus for evaluating a sample having a pattern with a minimum line width of 0.1 μm or less including, for example, a pattern on a substrate, a method for the evaluation of a pattern thereon and an objective lens for using the same.

The present invention also relates to an electron beam system and a method for the manufacturing of a device by using the same and, more particularly, to a apparatus for evaluating a sample including, but not being limited to a patterned wafer, a mask for forming a pattern, a substrate for use with a liquid crystal panel or a micromachine product, etc. with both a high precision and a high throughput and to a method for manufacturing a device by using the electron beam system.

The present invention further relates to a method for evaluating including inspecting etc. a defect on a sample having a pattern with a minimum line width of 0.2 μm or less with a high throughput and to a method for manufacturing a device by using the same.

Moreover, the present invention relates to a method for the formation of a pattern including, for example, IC pattern, etc. directly on a wafer or the like, a method for the formation of a pattern having a minimum line width of 0.1 μm or less by means of an electron beam delineating method and to a method for the repair of a mask to be used in a lithography for forming a pattern having a minimum line width of 0.1 μm or less. More particularly, the present invention further relates to a method for manufacturing a device by using the pattern-delineating method and to a method for manufacturing a device by using the mask repaired by the above method.

RELATED ART

Heretofore, there has been known an electron beam system for the evaluation of a pattern by irradiating a patterned wafer (a sample) with electron beams. Such an electron beam system is arranged in such a manner that a wafer surface is divided virtually into plural stripe regions and each stripe region is irradiated with electron beams as a unit for evaluation of the patterns formed on the wafer. The electron beams for use in this evaluation are arranged in a rectangular shape in which the longitudinal length of the electron beams corresponds to the width of the stripe region. The rectangular electron beams are further arranged such that they are continually moved longitudinally along the stripe region and the full area of the stripe region is irradiated with the electron beams. Upon irradiation of the wafer surface with the electron beams, secondary electrons are emitted from the wafer surface so that a two-dimensional image of the pattern on the wafer can be formed by convergence of the secondary electrons.

Concerning the present invention 3-1, a method has been proposed in which a pattern is evaluated by using a plurality of electron beams, that is, multiple beams. This method, however, has not yet been made commercially available. Moreover, no report has been found that describes a way of observing multiple beams and evaluating a pattern by using the multiple beams.

Regarding the present invention 3-2, a method has hitherto been proposed in which approximately eight electron beams are positioned at equal separation from the optical axis, etc. to scan a surface of a sample and evaluate the sample by magnifying secondary electrons emitted from the sample by means of an image projecting an optical system. In order to arrange multiple beams at equal separation from the optical axis, however, it is necessary to locate the beams on the circumference with the optical axis centered. Moreover, problems have become apparent in the case of arrangement for ten or more beams, namely, a large diameter is required for the arrangement of the multiple beams and a great burden is imposed on an electron gun causing a lens aberration.

In respect of the present invention 3-3, there have hitherto been proposed some types of pattern evaluation apparatuses which use multiple beams. Such conventional multiple beam systems, however, have the problems that resolution of the beams located apart from the optical axis are decreased due to aberration of lenses including not only an objective lens but also a reducing lens and a condenser lens if the number of beams is increased.

In respect of the present invention 4-1, the method for delineating a pattern directly on a wafer (the directly delineating method) includes conventional methods in which a beam energy of 50 keV or higher is utilized and in which a beam energy of 5 keV or lesser is utilized. The directly delineating method using an accelerating voltage of 50 keV or higher has the problems that a vastly large-scale apparatus is required and a cost-of-owner (COO) may become too large due to a low throughput. On the other hand, the directly delineating method using the beam energy of 5 keV or lesser have the problem that an edge roughness increases, although it has the merits that a resist is highly sensitive so that the number of irradiating electrons per unit area becomes smaller.

Regarding the present invention 4-2, a method has been proposed in which a boundary of main fields, subfields or stripes is made in a roughened and uneven fashion in order to improve precision of connecting a projection apparatus. Further, a method has been proposed in which a sloping connection is effected in order to improve a precision of connecting a projection apparatus. Likewise, a method has further been proposed in which an electron gun is preferably operated under space-charge limit conditions in order to reduce an edge roughness of a projection apparatus.

For the projection apparatus using electron beams, all patterns to be formed on a sample are needed to be formed on a mask so that an expensive mask has to be used. Furthermore, the projection apparatus has the problem that a throughput is greatly reduced compared to ArF lithography or $F_2$ lithography.

In respect of the present invention 4-3, there is known a repair apparatus in which a mask is repaired by spraying a reactive gas onto a mask surface which is irradiated with electron beams from a nozzle disposed in a scanning electron microscope (SEM).

For the repair apparatus, a detection means for detecting the completion of repair is not sufficient. In other words, a conventional detection means has the problems that, in the course of obtaining an SEM image by scanning a region wider than a sharpening portion in order to observe whether the repair has been finished or not, a region which is not sought to be shaped is also scraped off by scanning, rendering a chromium layer thinner or chromium become deposited on a transparent region in a thin layer.

SUMMARY OF THE INVENTION

Upon conducting an evaluation of a pattern formed on a substrate by using an electron beam system, an objective lens has hitherto been used for focusing electron beams on a sample and forming an image thereof on the sample surface. As the objective lens, an electromagnetic lens been conventionally used which has a magnetic gap formed on the side of the sample with an inner electrode on the side of the optical axis and an outer electrode opposite thereto. The objective lens, however, has the problem that a number of ampere turns (ATs) needed for operating lenses becomes larger. Further, the objective lens presents the problem that a distribution of an axial magnetic distribution cannot be obtained at a necessary level for the reasons that a magnetic flux density within a magnetic pole becomes too large due to a remote distance between the position of the magnetic gap and the position of the beam passing therethrough, thereby saturating a magnetic permeability of a magnetic material and as a result gaining no necessary distribution of the axial magnetic field. Therefore, the present invention has the object of providing an objective lens which does not make a number of ATs of an exciting current for obtaining focusing conditions larger and making a magnetic flux density of the magnetic pole higher.

Further, in the event that the magnetic lens is used as the objective lens regardless of its aberration coefficient being smaller than an electrostatic lens, electrons emitted from the sample surface in a direction of the normal of the sample do not cross the optical axis thereof when they are condensed with the objective lens. Therefore, the magnetic lens has the problem that no NA aperture can be disposed at the cross-over position so that no image having a high resolution can be obtained. In other words, the problem resides in that, in the event where the NA aperture is disposed at the cross-over position, electrons coming from a position apart from the optical axis is blocked to an extent more than needed, thereby darkening an image at the neighboring portion. Therefore, the present invention has another object of decreasing aberration by using a magnetic lens as the objective lens, forming a cross-over on the optical axis and mounting an NA aperture at the cross-over position.

An electrostatic lens has been used for an objective lens in a conventional optical system in order to improve a throughput, which is arranged so as to project secondary electrons emitted from a sample onto a detector by forming multiple beams and scanning the sample therewith. Therefore, such a conventional system has suffered from the problem of aberration becoming large and as a result a large beam current cannot be obtained when the beams are narrowed down to a smaller size. The present invention has the object, accordingly, to provide an objective lens that comprises a magnetic lens having a lens gap on the sample side, which can narrow down the multiple beams to a smaller size and obtain a large beam current.

Moreover, if a magnetic field exists on a sample, beams coming out vertically from the sample do not cross the optical axis so that no NA aperture can be disposed and that, as a result, a crosstalk between a secondary beam and the adjacent beam becomes large. Therefore, the present invention has the object of providing an image with a high precision by making such a crosstalk between the adjacent beams.

Moreover, a conventional method arranges multiple beams such that resolution is improved by narrowing a beam size of a primary beam down to a smaller beam size. The conventional method has the defect, however, that narrowing the beam size down makes a beam current smaller in proportion to the fourth power of the beam size so that a longer duration of time is required to obtain a signal having a better S/N ratio. Therefore, the present invention has the object of providing an image having a higher resolution by using a large beam size of a primary beam as it is and improving the resolution of a secondary optical system.

In carrying out a conventional inspection for detecting a defect of a sample by irradiating a sample with electron beams and forming or focusing an image of the electron beams generated or reflected from the sample on a detector surface with an optical system, the defect detection has been effected by dividing an entire die as an inspection object into stripes, each having an equal width and conducting a comparison of an image to be inspected with a reference image for each stripe. This defect detection technique presented the problem, however, that, in the event where the die is divided into equally wide stripes in its entirety, each main field (in an x-dimensionally scanning direction) of each stripe is composed of a mixture of a region where the inspection has to be done by a die-to-die comparison and a region where the inspection has to be done by a cell-to-cell comparison. For this reason, a circuit for carrying out a die-to-die comparison and a circuit for carrying out a cell-to-cell comparison have to be shifted within one main field. These shift operations are difficult to carry out. Therefore, the present invention has the object of providing an inspection method that does not require any shift operations to be carried out within one main field.

In addition, the conventional electron beam system had the following problems. An electron beam applied to the conventional electron beam system is in a rectangular form; however, such a rectangular electron beam cannot be used for irradiation at a high current density when the electron beam in the rectangular form is set so as to have a constant current density as a whole. Further, for the conventional electron beam system, electron beams distant from the optical axis are also used so that aberration is magnified. In order to sustain aberration within a constant scope, it is needed to make an angle of an aperture smaller. As a result, a permeability ratio of secondary electrons of an image projecting optical system (a secondary optical system) becomes reduced. Moreover, although the length of the optical system can be elongated in order to reduce aberration, the problem may be caused to occur such that it may result in an increase in a space charge effect and so on. The permeability ratio of the secondary electrons for the image projecting optical system referred to herein is intended to mean a ratio of an amount of the secondary electrons coming into the surface of a scintillator coated on an FOP with respect to an amount of the secondary electrons generating from a sample.

The present invention 2-1 has an object of solving the problems involved in the conventional electron beam apparatuses and, more particularly, to provide an electron beam system that can realize an irradiation of the sample with electron beams having a high current density, improve a detection yield of secondary electrons of an image projecting optical system and further making an electron optical lens barrel compact and to provide a method for manufacturing a device using the same.

The present invention 3-1 has been made with the above-described problems taken into account and has an object of providing a pattern evaluation method in which weight is given to a method for adjusting multiple beams and to provide a method for manufacturing a device with a high yield rate by using the pattern evaluation method.

The present invention 3-2 has been made by overcoming the above-described problems and has an object of providing a pattern evaluation method for evaluating a sample with a high throughput by generating ten or more multiple beams and scanning the sample with the multiple beams and, further, to provide a device production method for the production of a device with a high yield rate by using the same.

The present invention 3-3 has been made by taking the above-described problems into account and has an object of providing a beam formation method for forming a beam which enables a beam to separate from an optical axis by some distance to be formed on a sample in a minimally narrowed form and which can focus a primary beam concurrently with a secondary beam.

The present invention 4-1 has been made by paying attention to the above-described problems and has an object of providing a method for drawing a pattern which enables turning on and off the irradiation of electron beams at a high speed or shifting dimensions of a variably sharpening beam or characters of character masks at a high speed and further which can pass through a monolayer resist on a wafer over the entire thickness and provide an electron beam with energy high enough to sensitize the resist and, further, to provide a device production method for the production of a device with a high yield rate by using the same.

The present invention 4-2 has been made with the above-described problems taken into account and has an object of providing a pattern-delineating method for the formation of a pattern which can form a pattern in a substantially mask-free manner and which can connect stripes in an appropriate way simply by forming only patterns occurring frequently in a repetitive way with a mask, and a method for forming a pattern having a good edge roughness. The present invention further provides a device production method for the production of a device by using the same.

The present invention 4-3 has been made with the above-described problems taken into account and has an object of providing a repair method for repairing a pattern which does not cause a deletion of an unnecessary pattern or deposition of chromium during a course of inspection concerning whether the repair has been completed or not. The present invention further provides a device production method for the production of a device by using a mask repaired by the repair method.

In order to achieve the above-described objects, the present invention 1-1 provides an objective lens that can focus electron beams on a sample, which comprises a magnetic gap formed by an inner magnetic pole located on the side of an optical axis and an outer magnetic pole located on the side opposite thereto is formed on the side of the sample, at least one side of the outer side and the inner side of the inner magnetic pole and the outer magnetic pole, respectively, which forms the magnetic gap, constitutes part of a conical shape having a vertical angle at which an angle respect to the optical axis is 45° or larger and a cross section of each of the magnetic poles in the vicinity of the sample has an angle of 90° or larger.

In accordance with the present invention 1-2, the electron beam system comprises an electron gun, an irradiation optical system, a sample capable of transmitting electron beams, and an image formation optical system, all of which are disposed on one optical axis in a manner in which a cross-over image to be formed with the electron gun is focused at a position in the vicinity of a main surface of the objective lens system containing a magnetic lens of the image focusing optical system, an image of an aperture for determining an irradiation field is focused on the sample, the electron beams transmitted through the sample is magnified with the objective lens to form a magnified image in front of an magnifying lens disposed at the rear position of the objective lens, and a further magnified image is formed on a detector with the magnifying lens.

In accordance with the present invention 1-3, the electron beam system is provided which is arranged such that plural beams are formed in the vicinity of one optical axis and then focused to form an image on the sample with the objective lens, the sample surface is scanned with a two-stage deflector of the objective lens disposed on the side of the electron gun, secondary electrons generated from a scanning point on the sample are separated from a primary optical system with an electromagnetic deflector (an ExB separator) after passing through the objective lens, and the image is formed and detected on the detector with an magnifying lens having at least one stage. The electron beam system comprises a deflection ratio of the two-stage deflectors is adjusted in such a manner that a deflection pivot of the two-stage deflectors is located on the side of the electron gun rather than the principal plane of the objective lens and further the deflection pivot of the two-stage deflection becomes located between the position at which a coma aberration becomes minimal at the time of deflection and the position at which a deflecting chromatic aberration becomes minimal.

In the present invention 1-4, there is provided the electron beam system which comprises shaping the electron beams emitted from the electron gun with a shaping aperture, focusing them on a plane of the sample, separating from the primary beam the electrons emitted from the sample using the beam separator after passage through the objective lens, magnifying them with plural lenses, and focusing them on the principal plane of the objective lens, wherein the principal light beams of the primary and secondary beams are arranged so as to pass at different positions in a distance between the electrostatic deflector and the sample plane.

The present invention 1-5 provides a defect detection method for detecting a defect which comprises irradiating a sample with an electron beam, passing the electron beam through the sample, and detecting an electron emitted from the sample, reflected from the sample or to be reflected before striking the sample by focusing or focussing on a plane of a detector with an image projecting optical system, the defect detection method comprising the steps of:

recognizing a region on the sample plane where defect detection is effected in a die-to-die detection system and a region on the sample plane where defect detection is effected in a cell-to-cell detection system;

recognizing an x-coordinate of a boundary between the above two regions;

dividing an entire area of a die into stripes each acquiring an image of the sample while continually moving a sample stage in a y-direction;

acquiring the image of the sample in a stripe unit and effecting defect detection; and dividing the stripe in a manner that an x-coordinate of the stripe existing at the end is brought in agreement with an x-coordinate of the above boundaries.

The present invention 1-6 provides the electron beam system wherein the electron gun, the deflector, the objective lens and the beam separator (an ExB separator) having at least the electromagnetic deflector, the condenser lens, and the sample are disposed at different positions on the optical axis, wherein a deflectiondeflection chromatic aberration generated by the deflector is offset by a deflectiondeflection chromatic aberration generated by the electromagnetic deflector. The electron beam system is further configured in such a manner that the electron gun, the condenser lens and the deflector are disposed on one optical axis, the objective lens and the electromagnetic deflector are disposed on another optical axis distant from the optical axis, and the electron beam is deflected with the deflector toward a central direction of the beam separator having at least the electromagnetic deflector.

The present invention 1-7 provides the electron beam system wherein the electron beam emitted from the electron gun is deflected with the electromagnetic deflector, the electron beam vertically strikes the sample, the secondary particle emitted from the sample is deflected with the electromagnetic deflector toward a central direction of the deflector having another optical axis parallel to a normal line direction of the sample, and the deflected secondary particle is combined with the other optical axis by means of the deflector.

The present invention 1-8 provides a device production method for the production of a device, which comprises the steps of:

preparing a wafer;
carrying out a wafer process; and
evaluating the wafer after the process has been carried out by using the objective lens according to the present invention 1-1, wherein the above steps are repeated as many times as needed to assemble a device.

In order to achieve the objects as described above, the present invention 2-1 provides an electron beam system for forming a two-dimensional image by irradiating a sample with an electron beam and magnifying an image of a secondary electron emitted from the sample or an image of a transmitting electron transmitting the sample with an image projecting optical system, wherein the sample surface is divided virtually into plural stripe regions in a manner that a longitudinal direction thereof is arranged parallel to a predetermined axis, the stripe region is divided into main field regions, each being rectangular and parallel to a latitudinal direction thereof, the main field is further divided into plural subfields, and irradiation with the electron beams and formation of the two-dimensional image are repeated in a unit of the subfield.

With the configuration of the electron beam system as described above, the electron beams can be irradiated in a unit of small square-shaped subfields, thereby enabling the increasing of a current density of the electron beams and improving a transmittance ratio of the secondary electrons of the image projecting optical system. Further, the electron optical mirror mount can be made more compact in size. Moreover, the present invention 2-2 permits the formation of the image in a unit of the subfields, wherein a correction corresponding to a distance from the optical axis of each subfield is made whenever the irradiation with the electron beams or the formation of the two-dimensional image is effected, and the principal light beams of the secondary electrons or the transmitting electrons are arranged so as to substantially coincide with the optical axis of the lens on the downstream side by means of a lens of the image projecting optical system for forming the two-dimensional image, which is located closer to the sample.

The present invention 2-3 comprises a first-stage lens of the image projecting optical system contains a predetermined electromagnetic lens, a deflector having a deflection magnetic field distribution approximating to a distribution of differential coefficients of an axial magnetic field distribution of the electromagnetic lens is disposed in the vicinity of the first-stage lens, and the first-stage lens and the deflector are operated under a condition approximating to a MOL (moving object lens) operation condition. Further, the present invention 2-4 is comprises the first-stage lens of the image projecting optical system comprises the electromagnetic lens in which a lens gap to be formed with the two magnetic poles faces the sample side and an axially symmetric electrode disposed between the magnetic poles and the sample.

The present invention 2-5 comprises the deflector is enclosed with an insulating case, the outside face of the insulating member is coated with metal, and the metal coated side thereof is applied with voltage. The present invention 2-6 comprises the two-dimensional image by the secondary electron images is formed on a scintillator plane of a FOP (fiber optical plate) composed of plural optical fibers (cellfock) each having a focussing action.

The present invention 2-7 comprises the scintillator plane is supplied with voltage that accelerates electron beams to a better sintilation efficiency. The present invention 2-8 comprises an image is formed while the sample placed on a sample stage is being moved continually in one axial direction and the position of the sample stage is measured with a laser interferometer and further that a correction is made so as to cause no moving of the two-dimensional image to be focused on the detector at the time of forming the image of one subfield.

The present invention 2-12 comprises the two-dimensional image to be formed by the secondary electrons is converted into a light image, the converted light image in turn is condensed to a photoelectric transfer detector acting as a detector through a predetermined optical lens where the image is converted into electric signals, and, in the event where a pixel size of the two-dimensional image is changed, at least a magnification of the optical lens is varied. The present invention 2-10 comprises an electron beam irradiation system for irradiating the sample with the electron beams is provided with a beam separator having at least an electromagnetic deflector, the electron beams are generated from a direction at an angle of approximately $2.8\alpha$ with respect to the normal line of the sample, and the electron is deflected with the electromagnetic deflector at an angle of $-\alpha$ with respect to the normal of the sample.

The present invention 2-11 comprises the electron beam irradiation system is provided with an aperture in a shape approximating to the subfield and, in the event where the pixel size of the two-dimensional image is to be changed, an aperture with a different dimension is disposed in vacuum and then aligned on the optical axis.

The present invention 2-12 provides a secondary image-forming method for forming the two-dimensional image by irradiating the sample with the electron beam and magnifying the secondary electron emitted from the sample or a transmitting electron transmitting the sample with the image projecting optical system, the secondary image-forming method comprising the steps of; dividing a surface of the sample into plural stripe regions in which a longitudinal direction thereof is arranged parallel to a predetermined axis; dividing the stripe region into main field regions, each being rectangular and parallel to a latitudinal direction thereof; dividing the main field into plural subfields; repeating irradiation with the electron beam or formation of the secondary image in a unit of the subfields; and making a correction of a distance from an optical axis of each subfield whenever the irradiation with the electron beam and the formation of the secondary image is effected.

As the main field is divided into the subfields and an irradiation area is set to be in a small square-shaped form, a primary beam having a high current density can be irradiated. Further, a combination lens of an electromagnetic lens having low aberration and an electrostatic lens can be used as an objective lens. Moreover, as the electron beams having a high current density can be used as described above and the image projecting optical system has a high transmittance ratio regarding the secondary electrons, a course of time for irradiation of the electron beams can be shortened. As a result, an evaluation for samples can be effected with a high throughput.

The present invention 3-1 provides a pattern evaluation method for evaluating a pattern on a sample by irradiating the sample with plural electron beams, which comprises the steps of:

(a) forming multiple beams by using a multi-aperture;
(b) scanning a marker existing on a Z-coordinate on which a sample to be evaluated exists by focussing the multi-beams and using the condensed multiple beams;
(c) separating the electron beams emitted from a scanning point on the marker from a primary electron beam with a beam separator containing at least an electromagnetic deflector and detecting the electron beams with a single detector;
(d) evaluating at least one of beam resolution, beam separation and beam intensity by detection with the detector;
(e) leading a secondary electron group emitted from a scanning point on the sample to a secondary optical system; and
(f) evaluating a pattern on the sample plane by detecting a signal corresponding to each beam of the multi-beams of the secondary electron group with plural detectors.

In the present invention 3-1, there is provided a pattern evaluation method for evaluating a pattern on a sample plane by irradiating the sample with plural electron beams, which comprises the steps of:
(a) forming multiple beams;
(b) scanning a sample to be evaluated by focussing the multi-beams and using the condensed multiple beams;
(c) leading the plural electron beams to a secondary optical system by separating plural electron beams of a secondary electron group emitted from a scanning point on the sample plane by separating the electron beams from a primary electron beam with an electromagnetic deflector (an ExB separator) and
(d) evaluating a pattern on the sample plane by detecting a signal corresponding to each beam of the multi-beams with plural detectors corresponding to the plural electron beams;
wherein a distance between an objective lens of a primary optical system and a lens disposed upstream thereof is set to be larger than a distance between an objective lens of the secondary optical system and a next lens disposed downstream thereof.

In the pattern evaluation method according to the present invention 3-1, the distance between the objective lens of the primary optical system and the lens disposed upstream thereof can be set to double or more than double the distance between the objective lens of the secondary optical system and the next lens disposed downstream thereof. In the pattern evaluation method according to the present invention 3-1, the marker may be disposed on a flat substrate and may be a dot pattern consisting of plural dots of heavy metal each having a dimension smaller than the beam distance or a marker having plural holes each having a dimension smaller than the beam separation or a pattern in the form of a knife edge magnifying parallel to the x-axial or y-axial direction and having a dimension larger than the beam separation.

Further, the present invention 3-1 provides a device production method for the production of a device, which comprises the steps of:
(a) preparing a wafer;
(b) carrying out a wafer process;
(c) evaluating the wafer after the process by means of either of the methods as described above;
(d) repeating the step b and the step c as many times as necessary; and
(e) dividing the wafer into dies and assembling them into a device.

As another embodiment according to the present invention 3-1, there is provided a pattern evaluation system for evaluating a pattern on a sample plane by irradiating the sample with plural electron beams, which comprises:
(a) a multiple beam former;
(b) optical system for scanning a sample to be evaluated by focussing the multiple beams and using the condensed multiple beams;
(c) a beam separator for leading the plural electron beams to a secondary optical system by separating plural electron beams of a secondary electron group emitted from a scanning point on the sample plane by separating the electron beams from a primary electron beam with an electromagnetic deflector; and
(d) a deflector for evaluating a pattern on the sample plane by detecting a signal corresponding to each beam of the multi-beams with plural detectors corresponding to the plural electron beams;
wherein a distance between the objective lens of the primary optical system and the lens disposed upstream thereof is set to be larger than a distance between the objective lens of the secondary optical system and the next lens disposed downstream thereof.

In the above pattern evaluation system, it is advantageous that the distance between the objective lens of the primary optical system and the lens disposed upstream thereof be set so as to double or more than double the distance between the objective lens of the secondary optical system and the next lens disposed downstream thereof.

As the present invention 3-2, there is provided a pattern evaluation method on the sample plane with plural beams, which comprises the steps of:
(a) forming multiple beams by irradiating plural apertures with an electron beam emitted from an electron gun having a cathode;
(b) forming a cross-over of a beam passed through the plural apertures on a NA aperture having a dimension substantially larger than a dimension of the cross-over or at a position in the vicinity of the NA aperture;
(c) focusing an magnified cross-over at a Z-coordinate position in the vicinity of a principal plane of an objective lens;
(d) forming a reduced image of an image of the multiple beams on the sample plane with at least a reducing lens and an objective lens;
(e) scanning the sample with the multiple beams by using at least a two-stage deflector disposed between the reducing lens and the objective lens;
(f) accelerating and focussing a secondary electron group emitted from the scanning point on the sample with an objective lens;
(g) deflection the secondary electron group passed through the objective lens with an electromagnetic deflector and sending it to a secondary optical system;
(h) magnifying a mutual separation of the secondary electron group by the secondary optical system and leading the secondary electron group to plural secondary electron detectors; and
(i) evaluating a pattern on the sample plane from a signal detected with the detector.

The present invention 3-2 further provides a pattern evaluation method on the sample plane with plural beams, which comprises the steps of:
(a) forming multiple beams by irradiating plural apertures with an electron beam emitted from an electron gun having a cathode, which is a diverging beam whose third order spherical aberration is negative or which forms no cross-over on the side of the sample other than the cathode;

(b) forming a cross-over of a beam passed through the plural apertures on a NA aperture or at a position in the vicinity of the NA aperture;

(c) focusing an magnified image of the cross-over at a position in the vicinity of a principal plane of an objective lens;

(d) forming a reduced image of an image of the multiple beams on the sample plane with a reducing lens and an objective lens;

(e) scanning the sample with the multiple beams by using at least a two-stage deflector disposed between the reducing lens and the objective lens;

(f) accelerating and focussing a secondary electron group emitted from the scanning point on the sample with an objective lens;

(g) deflecting the secondary electron group passed through the objective lens with an electromagnetic deflector (an ExB separator) and sending it to a secondary optical system;

(h) magnifying a mutual separation of the secondary electron group by the secondary optical system and leading the secondary electron group to plural secondary electron detectors; and (i) evaluating a pattern on the sample plane from a signal detected with the detector.

In any one of the above mentioned pattern evaluation methods of the present invention 3-2, the lens for forming the cross-over image on the aperture or in the vicinity of the aperture may comprise a condenser lens disposed immediately before or behind the multi-aperture and a condition for exciting the condenser lens may be set as a condition for focusing an image of the beam passed through an aperture distant from the optical axis of the multi-aperture on the aperture.

In any one of the above mentioned pattern evaluation methods of the present invention 3-2, all the secondary electron groups emitted from the sample plane at an angle within the range of ±90° with respect to the normal line of the sample plane can be led toward the secondary electron detector without being blocked during leading thereof.

As the present invention 3-2, there is provided a device production method for the production of a device, which comprises the steps of:

(a) preparing a wafer;

(b) carrying out a wafer process;

(c) evaluating the wafer after the process by means of either of the methods as described above;

(d) repeating the step b and the step c as many times as necessary; and (e) dividing the wafer into dies and assembling them into a device.

The present invention 3-3 provides a pattern evaluation method for evaluating a pattern by scanning the pattern on a sample with plural electron beams, which comprises the steps of:

(a) forming multiple beams;

(b) reducing the plural beams and focusing them on a plane of the sample with at least a two-stage lens;

(c) concurrently scanning the plane of the sample by the plural beams with a deflector;

(d) accelerating and focussing a secondary electron emitted from a scanning point on the sample, a reflected electron or a transmitting electron toward a direction of an objective lens and transmitting it through the objective lens;

(e) separating the plural secondary electron beams passed through the objective lens from a primary optical system with an electromagnetic deflector (an ExB separator) and (f) magnifying a mutual separation of the plural secondary electron beams with a secondary optical system and sending to a detector;

wherein an outer shape of a lens disposed immediately behind the electromagnetic deflector is in the form of a cone or a truncated cone having a vertex with a small radius.

In the present invention 3-3, there is also provided a pattern evaluation method for evaluating the pattern by scanning the pattern on the sample with plural electron beams, which comprises the steps of:

(a) generating plural beams;

(b) reducing the plural beams and focusing them on a plane of the sample by using at least a two-stage lens;

(c) concurrently scanning the plane of the sample by the plural beams with a deflector;

(d) accelerating and focussing a secondary electron emitted from a scanning point on the sample, a reflected electron or a transmitting electron toward a direction of an objective lens and transmitting it through the objective lens;

(e) magnifying plural secondary electron beams passed through the objective lens with an image-forming optical system; and (f) detecting plural secondary electron beams magnified by the image-forming optical system with a detector corresponding to a number of the secondary electron beams and forming a two-dimensional image, wherein a one-stage lens of at least the two-stage lens has three electrodes in which a central electrode comprises an electrostatic lens or an electromagnetic lens to which a positive high voltage is applied.

In the pattern evaluation method according to each of the present inventions 3-3, it is advantageous that a system for generating the plural beams comprises a system in which the plural apertures are irradiated with electron beams emitted from the electron gun having a cathode with its sharp tip. Further, in the pattern evaluation methods according to the first and second modes of the present invention 3-3, it is advantageous to use a system having plural optical axes for generating the plural beams.

In the present invention 3-3, there is further provided a device production method for the production of a device, which comprises the steps of:

(a) preparing a wafer;

(b) carrying out a wafer process;

(c) conducting an evaluation of the wafer after the process by using either of the methods described above;

(d) repeating the step b and the step c as many times as necessary; and (e) dividing the wafer into dies and assembling them into a device.

As another mode according to the present invention 3-3, there is provided a pattern evaluation system for evaluating a pattern on the plane of a sample by scanning the pattern on the plane of the sample with plural electron beams, which comprises:

(a) a multiple beam generator;

(b) lens system for the plural beams and focusing them on a plane of the sample with at least a two-stage lens;

(c) a deflector for concurrently scanning the plane of the sample by the plural beams with a deflector;

(d) an objective lens for accelerating and focussing a secondary electron emitted from a scanning point on the sample, a reflected electron or a transmitting electron;

(e) a lens separater for separating plural secondary electron beams passed through the objective lens from a primary optical system with an electromagnetic deflector and sending it to a secondary optical system; and (f) an optical system for magnifying a mutual interval between the plural secondary electron beams with a secondary optical system and sending it thereto;

wherein an outer shape of a lens disposed immediately before the electromagnetic deflector is of a conical shape or of a truncated conical shape with a convex having a small radius.

In the pattern evaluation system according to the present invention 3-3, it is advantageous that a system for generating the plural beams comprises a system in which the plural apertures are irradiated with electron beams emitted from the electron gun having a cathode with its sharp tip. Further, in the pattern evaluation methods according to the present invention 3-3, it is advantageous to use a system having plural optical axes in the step for generating the plural beams.

The present invention 4-1 provides a pattern-delineating method for forming a pattern by an exposure of electron beams to a wafer coated with a resist, which comprises the steps of:

(a) accelerating an electron beam emitted from a cathode discharging a thermo electron and sending it to a square-shaped aperture to shape the electron beam into a square-shaped form;

(b) forming a pattern of the electron beam shaped in a square-shaped form by passage through a character mask and sending the patterned electron beam; and (c) reducing the patterned electron beam, aligning it, focusing it with an objective lens and irradiating the wafer therewith;

wherein the patterned electron beam is accelerated between the objective lens and the wafer into energy to transmit through the resist.

In the pattern-delineating method as described firstly in the present invention 4-1, the cathode can be operated under space-charge limit conditions. In the pattern-delineating method as described firstly in the present invention 4-1, it is advantageous that the energy of the electron beam is set within a range from 1 to 5 keV upon striking the square-shaped aperture and sending after being patterned. In the pattern-delineating method as described firstly in the present invention 4-1, it is advantageous that the objective lens and the main deflector are of an electromagnetic type and the other lenses and the deflector are of an electrostatic type.

In the present invention 4-1, there is provided a device production method for producing a device which comprises the steps of:

(a) preparing a wafer;

(b) carrying out a wafer process;

(c) effecting an evaluation of the wafer after the process by means of either of the methods as described above;

(d) repeating the step b and the step c as many times as necessary; and (e) dividing the wafer into dies and assembling them into a device.

The present invention 4-2 provides a pattern-delineating method for forming a pattern with electron beams, which comprises the steps of:

(a) determining a pattern-delineating layer on which the pattern is to be formed with an electron beam;

(b) dividing a chip region into plural stripes each having a small width equal to or smaller than a dimension of a main field of an electron optical system for the pattern-delineating layer to which the pattern is to be formed with the electron beam;

(c) extracting a pattern which is divided by a boundary line of the stripes in the pattern-delineating layer;

(d) extracting a pattern of problem, among the patterns to be divided, which may cause a problem if divided;

(e) reviewing whether a number of the patterns of problem of problem is reduced by setting a stripe width to a small dimension within a predetermined scope and determining the stripe width to the small dimension for the reduced number of the patterns of problem in all the pattern-delineating layers, if a number of the patterns of problem would be reduced more than preset when reviewed above; and (f) forming a pattern by a variable stripe so as for a dimension of a main field to meet the stripe width having the smaller dimension determined by using an electron beam.

The present invention 4-2 further provides a pattern-delineating method for forming a pattern by an electron beam, which comprises the steps of:

(a) determining a layer to which a pattern is formed by the electron beam;

(b) dividing a chip region into plural stripes each having a small width equal to or smaller than a size of a main field of an electron optical system for the pattern-delineating layer to which the pattern is to be formed with the electron beam;

(c) extracting a pattern which is divided by a boundary line of the stripes in the pattern-delineating layer;

(d) extracting a pattern of problem, among the patterns to be divided, which may cause a problem if divided;

(e) reviewing whether the pattern of problem does not exist any longer by making the boundary line of the stripes in an uneven shape;

(f) reviewing whether, in the event where a dimension of a substantially effective main field of an electron optical system is expressed as L, a dimension between a convex portion of an uneven shape of a stripe having a boundary line of the uneven shape and another convex portion thereof exceeds the dimension L;

(g) bringing a direction of unevenness of the uneven shape of the boundary line of the stripes reviewed in the step e in at least two layers into agreement with each other for all the layers to which the pattern is to be formed with the electron beams, on condition that a difference of an x-coordinate and a y-coordinate between the boundary line of the stripes in each layer is equal to or smaller than a preset value between at least two layers, when it is reviewed in step (f) and provided that the dimension between the two convex portions does not exceed the dimension L;

(h) reviewing whether a new pattern of problem which is divided by the boundary line does not exist as a result of step (g) and determining an uneven shape of the boundary line of the stripes when such a new pattern of problem does not exist as a result of reviewing in step (g); and (i) forming a pattern by delineating with electron beams in accordance with the stripes having the uneven shapes determined in step (h).

In the present invention 4-2, there is further provided a pattern-delineating method for delineating a pattern with electron beams, which comprises the steps of:

(a) dividing a layer into plural stripes on which a pattern is to be formed with electron beams;

(b) extracting a pattern to be divided by a boundary line of stripes;

(c) extracting a pattern of problem from the patterns to be divided thereby, which may cause a question if divided;

(d) reviewing whether a number of the patterns of problem is reduced by setting a stripe width to a small dimension within a predetermined scope and, in the event where the review reveals that the number of the patterns of problem is reduced more than preset, and setting all the stripe widths to the small dimension for the patterns of problem which may cause a problem with a precision of alignment among plural layers for forming a pattern with electron beams; and (e) providing two mutually neighboring stripes with an overlap region, the mutually neighboring stripes having a boundary line in common which divides the pattern of problem, in the event where the pattern of problem to be divided by the boundary line thereof still remains as a result of reviewing in step (d), and carrying out a double exposure to light for the pattern of problem in the overlap region in such a manner that, for each stripe, an amount of exposure to light for the divided pattern of problem is reduced stepwise from its central portion to its end and a total amount of exposure to light for the divided pattern of problem is equal to that of another pattern.

In a pattern-delineating method described firstly, secondly or thirdly in the present invention 4-2, it is advantageous that the pattern is formed with the electron beam system in which the $LaB_6$ cathode is operated under space-charge limit conditions, the landing energy for the wafer is set to 3 KeV or lower, a cell portion of the pattern is formed by a character projection system while the other portion of the pattern is formed by a variable sharpening system, and a distance between a character mask and the wafer is set to 30 cm or smaller.

The present invention 4-2 further provides a device production method for the production of a device, which comprises the steps of:

(a) preparing a wafer;

(b) carrying out a wafer process;

(c) evaluating the wafer after the process by means of either of the pattern evaluation methods as described above;

(d) repeating steps (b) and (c) as many times as necessary; and (e) dividing the wafer into dies and assembling them into a device; in which a lithography process among the steps for carrying out the wafer process is carried out by the above pattern-delineating method.

In the present invention 4-3, there is provided a mask repair method for scanning the finely narrowed mask with electron beams, filling a portion in the vicinity of the optical axis of the mask with reactive gas, and selectively etching a mask or depositing, which comprises the steps of:

(a) obtaining an image of a region containing a location of a defect on a plane of the mask with a scanning electron microscope, that is, a SEM image;

(b) identifying the location of the defect and determining a region which is to be scanned by electron beams;

(c) scanning the region determined by step (b) with electron beams by filling the area in the vicinity of the optical axis of the mask with reactive gas;

(d) obtaining a two-dimensional image by scanning a region containing the location of the defect with electron beams, wider than the area scanned in step (c); and (e) deciding a completion of repairing on the basis of the image obtained by step (d).

In the repair method as described firstly in the present invention 4-3, a secondary electronic signal can be used at the time of obtaining the SEM image, the secondary electronic signal being obtained by absorbing electrons in an electrode which are generated as a result of secondary electron multiplication that is caused to occur upon collision of the secondary electrons with gases. In the repair method as described firstly in the present invention 4-3, it is advantageous to use a signal used for the detection of the secondary electrons, when the SEM image is to be obtained, which are accelerated and condensed in an electric field formed on the mask and the pressure control aperture, passed through them, and deflected toward the secondary electron detector with an ExB separator. In the repair method as described firstly in the present invention 4-3, the pressure and kind of the gas on the mask can be changed at the time of repairing and obtaining the SEM image. Further, the present invention 4-3 can provide a device production method for the production of a device characterized in that lithography is carried out by using the mask which is repaired by either of the methods as described above.

BRIEF DESCRIPTION OF THE DRAWINGS

FIG. 17 is a diagram for explaining a beam resolution.

FIG. 27 is a schematic representation showing a mask repair system to be used for the second mode according to the present invention 4-3.

EXPLANATION OF REFERENCE NUMERALS AND SIGNS

Figure 1:
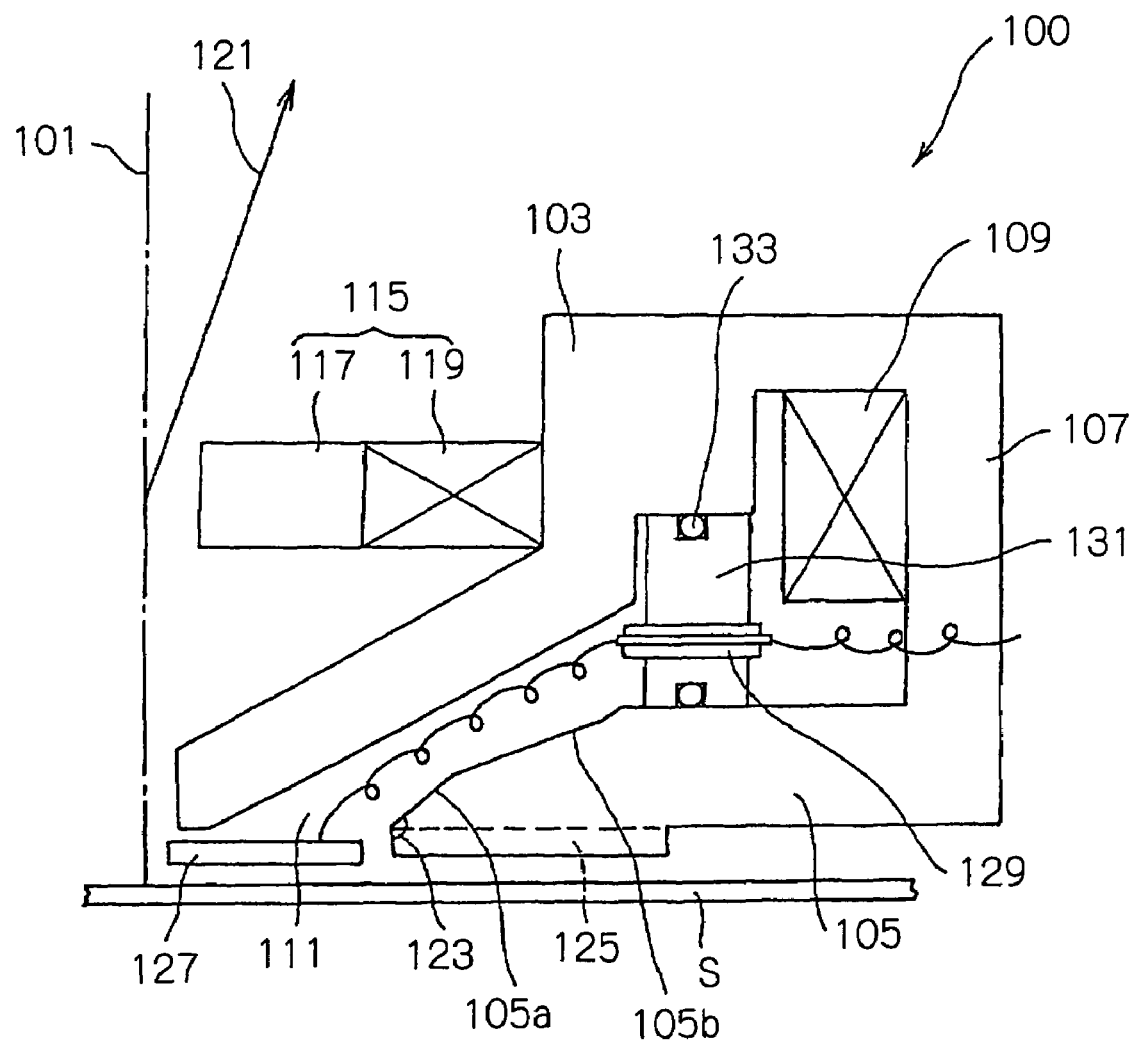
FIG. 1 is a view in section showing an objective lens composed of a combination of an electromagnetic deflector and an electrostatic deflector according to an embodiment of the present invention 1-1.

100: objective lens system, 101: optical axis, 103: inner magnetic pole, 105: outer magnetic pole, 105a: plane of outer magnetic pole forming magnetic gap, 105b: inside plane of outer magnetic pole plane forming magnetic gap, 109: exciting coil, 117: electrostatic deflector, 119: electromagnetic deflector for beam separator, 121: trajectory of secondary beam, 123: obtuse-angled cross section, 125: additional member for getting rid of an acute-angled portion of a magnetic material, 127: axially symmetric electrode, 129: hermetic sealing, 131: vacuum sealing member, 133: O-ring, 201: electron gun, 205: shaping aperture, 207: irradiating lens, 211: objective lens, 219: magnifying lens, 223: first magnified image, 225: FOP window coated with scintillator, 303: condenser lens, 309: multi-aperture, 305: rotating lens, 307: NA aperture, 311: reducing lens, 313: objective lens, 317: axially symmetric electrode, 323: beam separator having an electromagnetic deflector, 325: scanning deflector. 327: direction of deflection of beam separator at sample plane, 329: direction of deflection of beam separator, 331: direction of secondary optical system, 333: rotation of secondary electrons with objective lens, 335: fulcrum of scanning deflection, 337: second magnifying lens, 339: lens gap, 341: magnetic shield for minimizing leakage of magnetic field, 343: third magnifying lens, 345: scintillator plane, 347: optical lens, 349: PMT arbeam, 351: aperture for adjusting signal intensity, 353: deflector for dynamic correction, 355: exciting coil, 359: O-ring, 357: vacuum sealing ring, 401: electron gun, 403: multi-aperture, 405: condenser lens, 407: objective lens, 411: cross-over, 413: beam separator having an electromagnetic deflector, 415: trajectory of principal light beams of primary beams, 417: cross-over image, 419: scanning deflector, 423: image of secondary beams, 427: MCP, 429: deflector for dynamic correction.

431: light magnifying lens, 433: PMT array, 501: electron gun, 503: condenser lens, 505: axis-aligning deflector, 507: trajectory of principal light beams of primary beams, 511: electrostatic deflector for beam separator, 513: electromagnetic deflector for beam separator, 515: objective lens, 519: amount of deflection with electromagnetic deflector, 521: amount of deflection with electrostatic deflector, 523: trajectory of secondary beams, 601: die, 603: region for dye-to-dye inspection, 605: cell-to-cell inspectable region, 607: stripe width of stripe containing cell-to-cell inspectable region, 609: stripe for die-to-die inspection region, S: sample.

A: electron beam system, $A_1$: primary optical system (electron beam irradiation optical system) $a_2$: secondary optical system (image projection optical system) $a_3$: stage part, 1: electron gun, 2: condenser lens, 3: square-shaped aperture, 4: point of formation of cross-over, 5: condenser lens, 6: deflector, 7, 8: beam separator having an electromagnetic deflector, 9: electrostatic deflector, 10: objective lens, 11: electromagnetic deflector for MOL operations, 12: stage, S: sample, 14: laser-moving mirror, 15: laser-stationary mirror, 16: reflecting mirror, 17: beam separator, 18: beam receiver and oscillator, 19: second magnifying lens, 20: NA aperture, 21: point of cross-over formation.

22: FOP, 22a: scintillator plane, 23: zoom-magnifying optical lens, 24: detector (CCD camera), 26: stripe region, 27: subfield, 28: trajectory for MOL, 29: small aperture, 30: power source, 31: inner magnetic pole, 32: outer magnetic pole, 34: vacuum sealing tube, 35: O-ring, 36: hermetic sealing, 37: electromagnetically deflection coil 1 for MOL, 38: electromagnetically deflection coil 2 for MOL, 39: ceramic case, 91: point of formation of first image, 92: normal line of sample plane, 93: trajectory for avoidance of a space-charge effect, W: stripe width.

701, 801, 901: cathode, 702, 802, 902: Wehnelt, 703, 803, 903: anode, 705, 706, 804, 805, 808, 809, 904, 905: axis-aligning deflector, 707, 806, 906, 907, 909: condenser lens, 708, 807, 910: multi-aperture, 709, 710: deflector for aligning axis of NA aperture with axis of reducing lens, 711, 810, 913: NA aperture, 712, 811, 914, 915, 917: reducing lens, 713, 812: scanning deflector, 715, 716, 814: beam separator, 717, 815, 921, 922, 924: objective lens, 719, 721, 818, 820, 928, 929, 930: magnifying lens, 720, 722, 819, 821, 931, 935: axis-aligning deflector, 723, 822, 936: MCP, 726: Faraday cup, 727, 728, 729, 730: dot, 740, 823: multi-anode, 741, 824, 937: resistance, 742, 825: multi-amplifier, 743, 825, 938: A/D converter, 744, 826, 939: image forming circuit, 827, 940: comparator, 828: tungsten filament for heating, 829: axially symmetric electrode.

451: LaB$_6$ cathode, 452: Wehnelt, 453: anode, 454: beam shaping aperture, 455: shaping lens (condenser lens), 456: shaping lens, 457: shaping deflector, 458: blanking deflector, 459: character mask, 460: NA aperture, 461: reducing lens, 462: objective lens, 463, 464, 465, 466: main deflector, 467: laser oscillator and light receiver, 468: reflecting mirror, 469: beam splitter, 470: laser-stationary mirror, 471: laser-moving mirror, 472: electrostatic chuck, 473: electrostatic chuck electrode, 474: y-stage, 475: x-stage, 476: high-voltage power source (positive power source), 477: wafer; 478: electrostatic deflector; 479: electrostatic deflector; 480: power source (chuck power source), 551: cathode, 552: Wehnelt, 553: anode, 554: square-shaped aperture, 555: lens, 556: electrostatic deflector, 557: character selecting deflector, 558: lens, 559: character mask, 560: correcting deflector, 561: NA aperture, 562: reducing lens, 563: objective lens, 564: electromagnetic deflector.

565: wafer, 566: blanking deflector, 567: sub-field deflector, 571: divided stripe of gate layer, 572: divided stripe of first contact hole layer, 573: divided stripe of second contact hole layer, 574, 575, 576, 577: stripe boundary line, 581: stripe boundary line to be determined from substantially maximum field of EO, 582: stripe boundary line at layer forming source, drain pattern, 583: pattern, 584: stripe boundary line at gate layer, 585: pattern at gate layer, 586: stripe boundary line at contact hole layer, 587: contact hole pattern, 141: stripe boundary line to be determined from substantially maximal field of EO, 142: stripe boundary line having a small crossing with pattern by making stripe width smaller, 143: pattern, 144: pattern, 145: pattern crossing boundary line, 146: left stripe, 156: right stripe, 147 or 155: smaller-divided pattern, 162: overlap region (substantially maximal field of EO=maximal field of EO minus field to be used for correction)

651: electron gun cathode, 652: Schottkey shield, 653: anode, 654: condenser lens, 655: reducing lens, 656: objective lens, 657: pressure-limiting aperture and NA aperture, 658: lens gap, 659: mask, 660: gas inlet, 661: rotary pump, 662: mechanical booster, 663, 664: TMP pump, 665: scanning deflector, 666: scanning power source, 667: CRT monitor, 668: resistance, 669: amplifier, 670: pattern image, 671: black defect, 672: scan upon correction of defect, 673: guard ring for differential exhaust, 674: XY-alignment mechanism, 675: white defect, 676: scanning region upon correction of white defect, 681: positive power source, 682: sealing member, 688: O-ring, 684: electrostatic deflector for beam separator, 685: electromagnetic deflector for beam separator, 686: insulating spacer, 687: trajectory of secondary electron, 688: detector for secondary electrons.

DETAILED DESCRIPTION OF THE INVENTION

First Embodiment

FIG. 1 shows a cross-sectional shape of an objective lens system 100 to be used for an electron beam system in accordance with the present invention 1-1. An actual structure of the objective lens system 100 can be represented by rotating it around the optical axis 101. An electron gun is disposed at an upper side of FIG. 1, although not shown herein, and primary electron beams generated from the electron gun are focused onto the surface of a sample S through the optical axis with the objective lens system 100. The objective lens system has a structure surrounding the exciting coil 109 with the inner magnetic pole 103 disposed on the side of the optical axis, the outer magnetic pole 105 disposed on the side opposite thereto, and the magnetic circuit 107, and it is arranged such that the lens gap 111 is located having an aperture directed toward sample S. Reference numeral 115 refers to a beam separator for deflecting secondary electrons to be emitted from the sample toward sample S and may comprise the electrostatic deflector 117 and the electromagnetic deflector 119. Reference numeral 121 refers to an trajectory of the principal light beams of the secondary electrons. A negative high voltage is applied to sample S.

The objective lens system 100 to be used for the present invention may be arranged, unlike the conventional objective lens systems, in such a manner that the lens gap may have a truncated-conical shape in cross section in which the optical axis thereof is not parallel to the optical axis and the radius on the side of the sample becomes smaller and that on the side of the electron gun becomes larger. A simulation has revealed that the lens gap in the shape of the truncated cone can reduce a number of the ampere turns (ATs) of the exciting current for obtaining focusing conditions by approximately a half as compared to when the lens gap is disposed in parallel to the optical axis.

The inner magnetic pole 103 is disposed as part of a conical structure having an angle greater by more than 45° with respect to the optical axis in order to permit the mounting of the beam separator 115. Similarly, the outer magnetic pole 105 constitutes a part of an inner side of the conical structure. By setting the angle of the conical planes of the inner magnetic pole 103 and the outer magnetic pole 105 with respect to the optical axis 101 to 45° or greater, a material having a magnetic pole with small magnetic flux density and a lower saturated flux density can be used. Such a structure of the magnetic pole, however, may cause the problems of a magnetic flux density passing through each of the magnetic poles is rendered larger at a portion at which the inner magnetic pole 103 faces the outer magnetic pole 105, thereby resulting in approximation to the saturated flux density In particular, in the event where the inner surface of the outer magnetic pole 105 is configured in such a conical shape, a portion having an acute-angled cross section at the portion of the obtuse-angled cross section 123 is formed on the side of the sample of the lens gap. If this state would be sustained as it is, the magnetic flux is concentrated onto the acute-angled portion resulting in too large a magnetic flux density and a saturation of permeability rate of a ferromagnetic material. If the permeability rate would be saturated, the magnetic flux will not pass through the original position resulting in expanding magnetic density on the axis in the axial direction and worsening aberration characteristics. In order to avoid this occurrence, an additional member 125 can be added to make the angle at the portion 123 an obtuse angle and to change no inner conical shape as well. By changing the angle of the cross-sections of the inner and outer magnetic poles in the vicinity of the sample to an angle of 90° or greater, the problem with a saturation of the magnetic permeability ratio of the magnetic material can be avoided.

The exciting coil 109 is actually arranged such that the outer diameter is further made larger so as to enlarge the Z-directional dimension, thereby permitting a large number of large wires to be wound thereon. Reference numeral 127 is an electrode of an axially symmetric disc type to which a positive high voltage is applied in order to make the potential larger at a position where the axial magnetic field is large. This electrode is fixed to the outer magnetic pole 105 through an insulating spacer (not shown). In order to improve concentricity between an aperture of the inner magnetic pole 103 and a pole of the main electrode, the hole of the electrode 127 may be subjected to final sharpening after the lenses have been assembled as a whole, followed by dissembling, washing and re-assembling. A lead wire for applying high voltage to the electrode 127 may be disposed leading outside by mounting the hermetic seal 129 between both of the magnetic poles or leading from the lower portion of the outer magnetic pole 105. Reference numeral 131 refers to a vacuum wall member for separating the exciting coil portion 109 from the vacuum part of the electron beam system in order to permit the exciting coil portion 109 to be disposed in the atmosphere, and the vacuum sealing member 131 is kept in a vacuum state with the O-ring 133.

Alignment of the core of the electromagnetic deflector 119 of the beam separator 115 in common with the inner magnetic pole 103 can achieve an improved concentricity of the objective lens system 100 with each deflector of the beam separator 115. Reference numeral 117 refers to an electrostatic deflector of the beam separator 115, which is of an integral structure made of ceramic so as for the outer size to assume a small dimension. In the embodiment as depicted in the drawing, the conical planes 105a and 105b of the outer magnetic pole are each arranged so as to assume a different angle with the optical axis. This feature has been found appropriate by a simulation, however, it is to be noted that they may be on an equal conical plane.

As described above, the embodiment as illustrated in FIG. 1 can provide an objective lens system that can reduce the number of the ampere turns (ATs) of the exciting current for obtaining focusing conditions and that can avoid the problem with the saturation of the magnetic permeability of the magnetic material.

Second Embodiment

Figure 2:
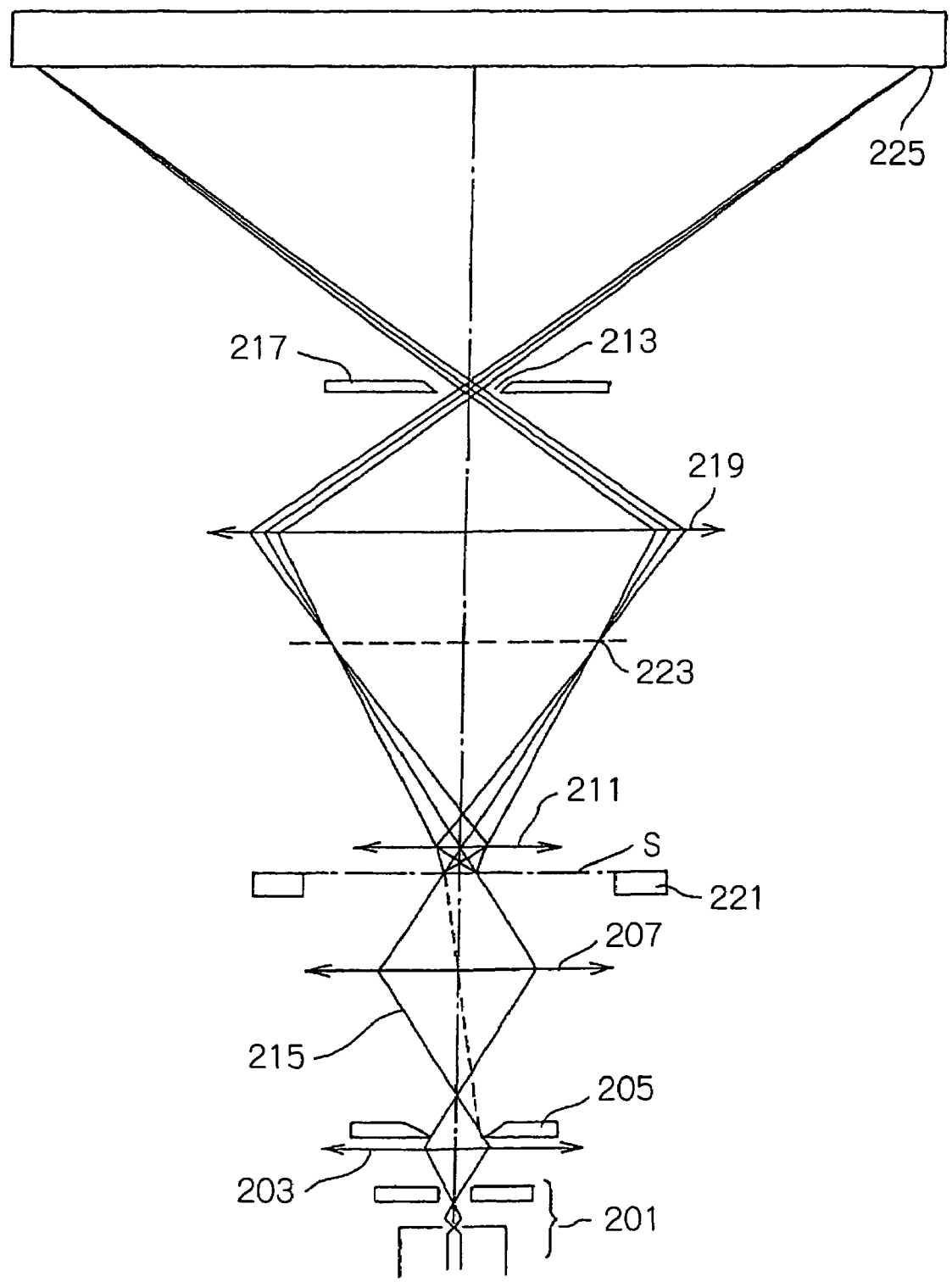
FIG. 2 is a schematic representation showing a defect inspection system for a stencil mask according to an embodiment of the present invention 1-2.

FIG. 2 shows an optical system of an inspection apparatus for a transmission mask using the objective lens system according to the present invention. The optical system of the inspection apparatus may be disposed in such a manner that the LaB$_6$ cathode electron gun 201 is operated under space-charge limit conditions, electrons generated from the electron gun 201 are condensed with the condenser lens 203, the shaping rectangular aperture 205 are irradiated with the electron beams at a homogeneous intensity, and an image is formed on a stencil mask (sample) 209 with the irradiating lens 207. Then, a cross-over image formed with the electron gun is formed on a principal plane of the objective lens 211. The objective lens 211 is set to have a still larger axial magnetic field at the position of the sample S. Therefore, the electrons emitted in the normal direction from the sample S do not cross the optical axis at a cross-over 213.

Hitherto, the principal light beams from the irradiating lens 207 are sent vertically to the stencil mask 209. With this structure, the beams coming vertically from the stencil mask 209 disposed at the position where the axial magnetic field is not zero do not intersect with the optical axis at the cross-over 213. Therefore, the conventional system is provided with a NA aperture at this position so that it presents the problem that an image at the peripheral portion may become darkened because the beams coming from the positions distant from the optical axis are blocked by the NA aperture to an extent greater than needed.

In the present invention 1-2, the principal light beams from the irradiating lens 207 are sent at an angle crossing the principal plane of the objective lens 211 in such a manner as represented by reference numeral 215, unlike the above conventional system where they are sent vertically to the sample S. Therefore, the cross-over image can be formed at 213 so that the NA aperture can be disposed at this position, thereby resulting in a decrease of aberration.

Figure 2B:
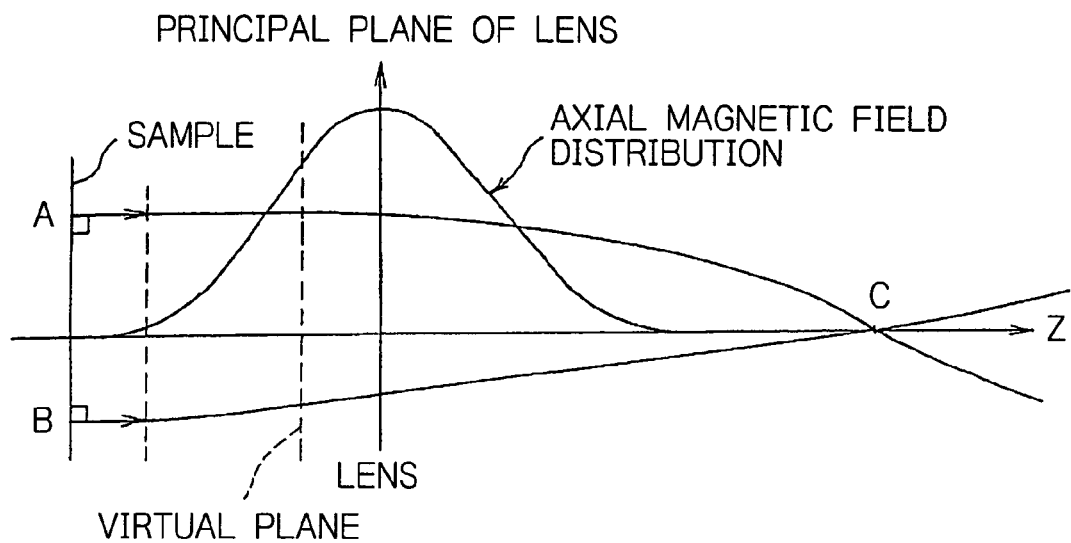
FIG. 2B is a view showing a relationship of a distribution of an axial magnetic field with the trajectory of a beam in a magnetic lens.
Figure 2C:
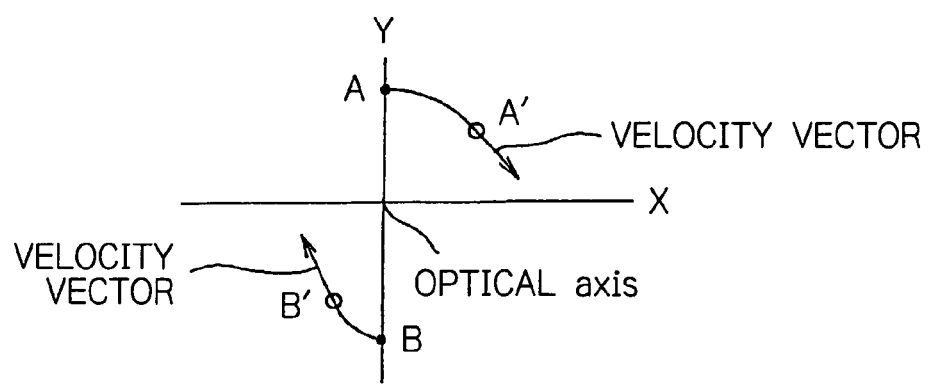
FIG. 2C is a view for explaining a velocity vector of a beam on a virtual plane of FIG. 2.

This embodiment according to the invention 1-2 will be described in more detail. In this embodiment, the electron beams are condensed with the magnetic lens while rotating them around the optical axis. Therefore, as shown in FIG. 2B, as the sample is located at the position where the axial focal distribution is zero, the beams generated vertically from the position, e.g., the beams generated from the points A and B of the sample, are rotated toward the points A' and B', respectively, on a virtual plane as indicated by dotted lines, as shown in FIG. 2C. Therefore, the trajectories are not parallel to the axis Z (the optical axis) at the points A' and B' and they have a component of the rotational direction as indicated by a "velocity vector". Only the beams having the trajectories as indicated above can form a cross-over at the point C, i.e., crosses the optical axis. If the sample is located at the position on a virtual plane, the beams emitted vertically therefrom do not intersect with the optical axis at the point C because they do not have any velocity vector in the rotational direction. If the beams outgoing from the points A and B would have a radiation component only, but no vertical component, they form a cross-over when they are focused at the position where the axial magnetic field of the lens is zero. Generally, the beams which have formed a cross-over at the position where the axial magnetic field is zero form a cross-over when they are focused at the position where the axial magnetic field of the lens is zero.

In the embodiment as shown in the drawing, the principal light beams of electron beams outgoing from the stencil mask 209 are beams which focus in the radial direction, but which have an angle in the directionally angled direction with respect to the normal lines. Therefore, the beams are directed toward the principal plane of the objective lens 211 while rotating, and they form a cross-over and at the same time intersect with the optical axis. The beams cross the optical axis at the cross-over 213 formed with the magnifying lens 219, accordingly, so that the NA aperture 217 can be disposed at the position 213 forming an image of a high resolution.

Reference numeral 215 refers to an image-forming line of the cross-over. The stencil mask S is fixed to a stage., and an investigation is carried out while a sample stage 221 is continually moved in the latitudinal direction of a rectangle-shaped irradiation region. Transmitting electrons emitted from the stencil mask S form an magnified image with the first magnifying lens 223, which in turn is further magnified with the magnifying lens 219 forming an image at the FOP (fiber optics plate) window 225 with a scintillator coated thereon. The image is then converted to a light image on the scintillator plane, and the light image is withdrawn outside vacuum with the FOP window and detected with the optical lens on the detection plane of TDI or CCD detector, followed by conversion into electrical signals and formation of an image to effect the detection of a defect.

Third Embodiment

Figure 3:
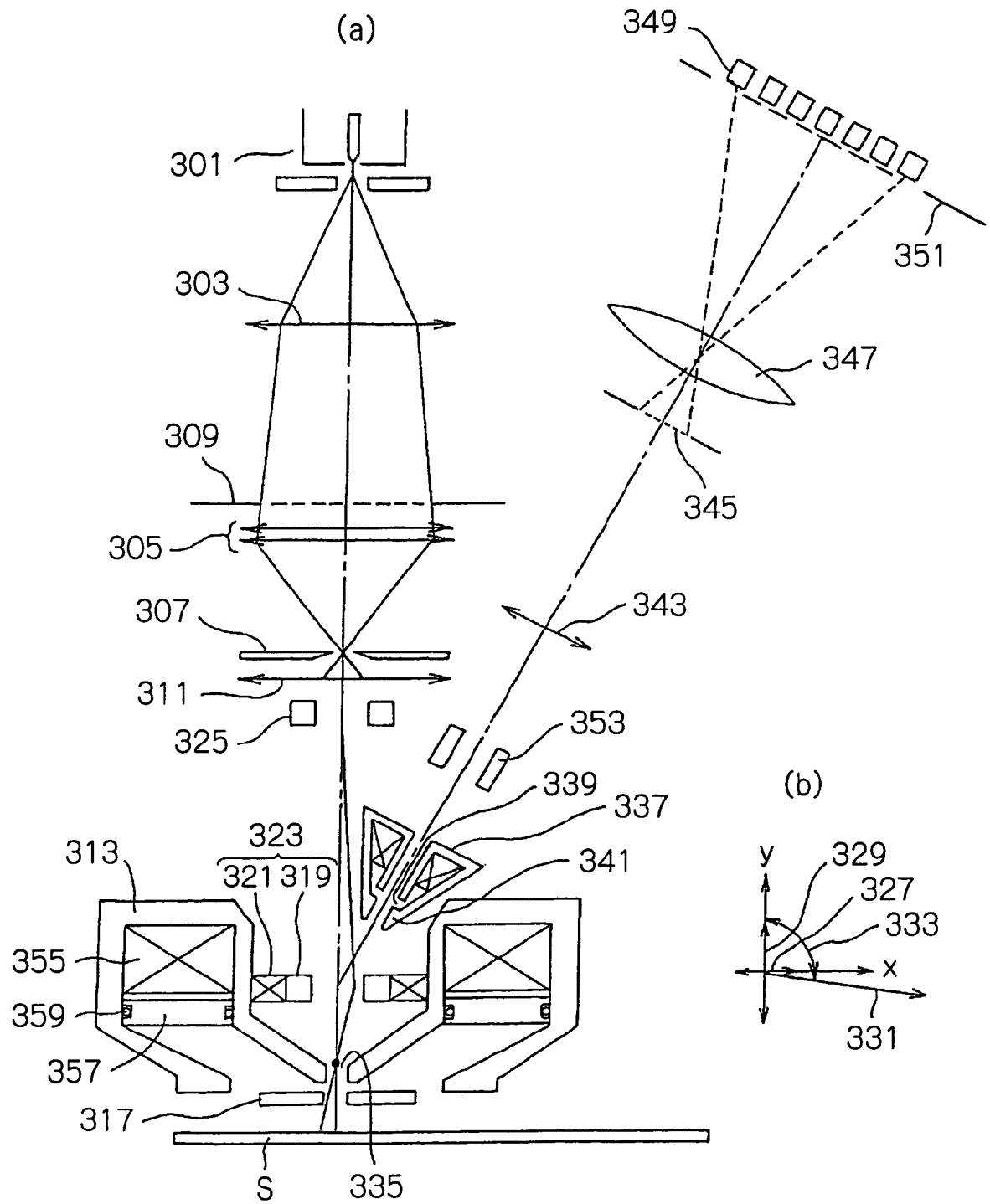
FIG. 3 is a schematic representation showing an electron optical system for multiple beams according to an embodiment of the present invention 1-3.

FIG. 3 shows an embodiment in which the objective lens according to the present invention 1-3 is used for an optical system for irradiation with multi-beams. The electron gun 301 is arranged such that a LaB$_6$ cathode electron gun is operated under space-charge limit conditions in substantially the same manner as described in the embodiment as shown in FIG. 2. The electron beams emitted from the electron gun 301 form a cross-over at the NA aperture 307 in an association of the condenser lens 303 with the rotating lens 305 whose rotation can be adjusted. Multiple beams are formed by mounting the multi-aperture 309 in front of the rotating lens 305. The condenser lens 303 adjusts a density of beam current at the multi-aperture by varying a cross-over magnification at the NA aperture 307 without forming a cross-over in association with the lens 305 disposed adjacent thereto. In the optical system, all the lenses are needed to align the posture of the multiple beams with the ordinates on the sample because they are all electromagnetic lenses.

The rotating lens 305 has two lens gaps which are set so as to have the magnetic fields at the lens gaps in the opposite directions, thereby enabling the adjustment of an amount of rotation without changing lens intensity by the magnetic fields generated at both lens gaps. The beams shaped with the multiple beams into the multi-aperture 309 are reduced with the reducing lens 311 and the objective lens 313, thereby focusing the multiple beams onto the sample S in a finely narrow form. The aberration and the beam current value can be optimized by optimizing the dimension of the NA aperture 307 at this timing. The objective lens 313 has the magnetic pole on the side of the sample S and the perforated electrode 317 of an axially symmetric type for applying the positive high voltage is disposed between the objective lens 313 and the sample S, thereby reducing an aberration constant The beam separator 323 containing the electrostatic deflector 319 and the electromagnetic deflector 321 is disposed inside the objective lens 313. The secondary electrons emitted from the sample S are accelerated and condensed with the objective lens 313 and deflected with the beam separator 323 to the right, when the drawing is viewed, leading to the secondary optical system. A simulation reveals that the primary electrons are rotated by approximately 103° with the objective lens 313 and the secondary electrons are rotated by approximately 115° in the opposite direction.

The beam separator 323 is applied with direct voltage and direct current for deflection while voltage and current having constant values are applied always regardless of scanning. On the other hand, a sawtooth wave is applied for scanning and alternating voltage is applied to the electrostatic deflector 325 and the electromagnetic deflector 319 of the beam separator 323. Therefore, the electrostatic deflector 319 of the beam separator 323 is fed with the direct voltage for operations of separating the secondary electrons and with the amtooth wave for scanning the primary electron in a superimposed way.

The beam separator 323 causes no deflection primary beams but produces a deflection chromatic aberration. In other words, the beam separator permits the primary beams having a constant beam energy to pass straight but slightly deflects the electron beams having energy somewhat different therefrom without passing straight, i.e., produces a chromatic aberration. In the event where the direction of the deflection aberration produced by the beam separator 323 and the direction of the deflection aberration produced by the electrostatic deflector 325 are changed by 90°, the deflection aberrations of the two deflectors are not added to each other. For an apparatus for inspecting the sample stage while continuously moving it in a y-direction, the deflection direction of the beam separator 323 may be preferably set to rotate in a y-direction on the sample plane because the scanning direction is larger in an x-direction than in the y-direction.

Figure 3B:
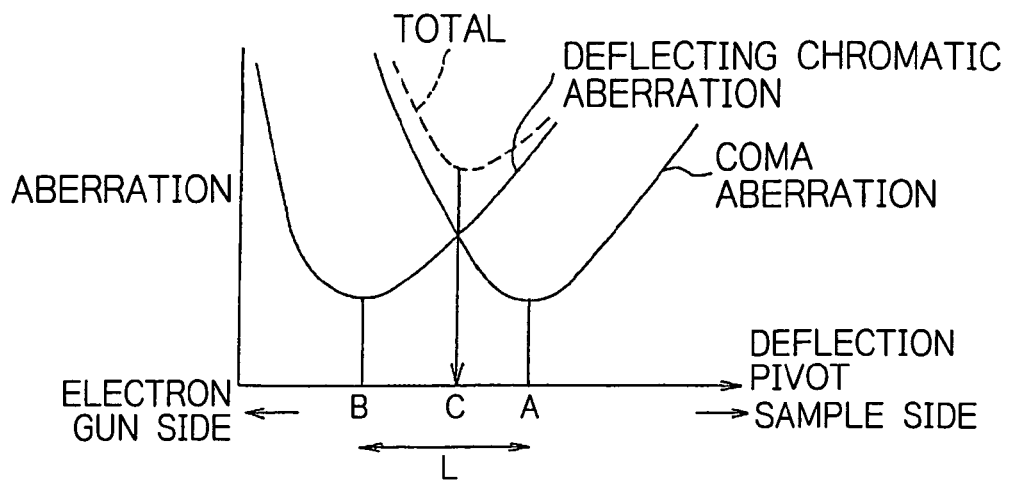
FIG. 3B is a representation showing a relationship of a deflection pivot and an aberration in the electron optical system of FIG. 3.

Therefore, the direction of the secondary optical system may be preferably arranged in such a manner that the objective lens is rotated by 1150 with respect to the y-direction after passage through the objective lens 313. This feature is indicated in FIG. 3B. In this figure, reference numeral 327 refers to a scanning direction on the sample by the sawtooth wave of the electrostatic deflector 325 and the electrostatic deflector 319 of the beam separator, reference numeral 329 to the deflection direction of the beam separator on the sample by the direct voltage of the electrostatic deflector 319 and the voltage of the electromagnetic deflector 321, reference numeral 331 to a direction of the secondary optical system, and reference numeral 333 to a rotation of the secondary electrons caused by the objective lens 313.

The trajectory of the principal light beams at the time of scanning is deflected with the electrostatic deflector 325 and returned with the electrostatic deflector 319 of the beam separator 323, deflecting around the deflection pivot 335. The position of the deflection pivot 335 can be adjusted by changing a ratio of amounts of deflection of the two-stage electrostatic deflectors 325 and 319. The position of the deflection pivot 335 may be determined by simulation or by actual observations as a value that can minimize the aberration. In other words, as shown in FIG. 3B, a ratio of the deflection sensitivities of the two-stage electrostatic deflectors 325 and 319 may be adjusted in such a manner that the deflection pivot be located on the side of the electron gun rather than the principal plane of the objective lens 313 and at a position L between the position A where the coma aberration at the time of deflection becomes minimal and the position B where the deflection chromatic aberration becomes minimal, preferably at a position C where the aberration becomes minimal.

The secondary electrons emitted from the sample are designed to be condensed with the objective lens 313 forming an magnified image in the vicinity of the main deflection plane of the beam separator 323. This can make the deflection chromatic aberration substantially null which is generated at the magnified image by the deflection chromatic aberration of the beam separator. As the secondary electrons which formed the image in the vicinity of the principal plane of the beam separator is returned toward the direction of the optical axis with the electrostatic deflector 319 of the beam separator, a bore dimension of the magnifying lens 337 of the second stage can be made relatively small because they pass near the optical axis after passage through the beam separator even if the sample is scanned by approximately 100 μm. It is necessary, however, that the length of the lower magnetic pole 341 of the objective lens 337 in the direction of the optical axis be set to double or more than double the bore dimension in order for the magnetic field leaked from the lens gap 339 to cause no occurrence of astigmatism of the primary beams. Moreover, this can be prevented in a more secure way when the vacuum wall for the primary beams is made from permalloy. As permalloy is a ferromagnetic material, the magnetic flux generated at the lens gap 339 and leaked from the lower magnetic pole 341 can be magnetically shielded. The lens 337 may comprise an electrostatic lens which causes no rotation even if the lens adjustment is carried out.

Reference numeral 343 refers to an electromagnetic lens that can adjust a position of multiple beams and the direction of arrangement of the detector by changing an amount of rotation without substantially changing the image-forming conditions of the lens having a long focusing distance. Reference numeral 345 refers to the vacuum window having FOP (fiber optics plate) which is coated with a scintillator on the vacuum side. Reference numeral 347 refers to an optical lens for which a zoom mechanism and an automatic focusing mechanism of a commercially available camera can be applied as it is without modification. Reference numeral 349 refers to a PMT array for which a commercially available PMT array with eight columns and eight rows of PMTs combined in one unit can be used. The PMT array 349 can be used by superimposing it on an X-Y stage capable of moving in the direction normal to the optical axis and aligning the positions of optical signals from the multiple beams with the positions of the PMTs. Alternatively, an eight-pole electrostatic deflector may be mounted behind the magnifying lens 337 to align the positions of the multiple beams on the plane of the vacuum wall 345. The eight-pole electrode may be supplied with signals in synchronization with the scanning of the primary beams, thereby permitting the secondary electrons from the identical beams always to radiate the scintillator at the same positions without relationship with the scanning position. In addition, astigmatism caused to occur on the scintillator plane can be corrected by sending signals for correcting astigmatism to the electrode.

FIG. 3B illustrates the direction of the secondary optical system. As shown in FIG. 3B, the direction of scanning the sample by the primary beams is expressed as reference numeral 327, which is parallel to the x-axis, and the direction of deflection on the sample with the beam separator 323 is parallel to the y-axis for both of the electrostatic deflector 319 and the electromagnetic deflector 321, as expressed as reference numeral 329. In the event where the direction of deflection of the beam separator 323 is set to the direction on the sample as indicated by reference numeral 329, the primary beams can be deflected toward the direction as indicated by reference numeral 331 when the rotational amount 333 of the secondary beams with the objective lens 313 is taken into account. As a result, the secondary beam is deflected toward the direction as expressed by 331 so that the secondary optical system 331 is disposed in the direction 331.

As the focal depth of the lens 333 at the scintillator is deep enough, the blur in the beams on the scintillator plane does not increase even if the amount of rotation of the secondary beam is changed. Therefore, the electromagnetic lens 343 can be omitted by using a rotation-adjustable lens for the lens 337. Reference numeral 351 refers to a multi-aperture for adjusting a quantity of light which is disposed on the front side of the PMT array 349. At a portion near the optical axis, the intensity of the primary beams is so strong and an aberration of an image of the secondary electrons is so small that the number of signals may become large. On the other hand, at a peripheral portion apart from the optical axis, the intensity of the primary beam is so small and an aberration of a secondary system is so large that the number of signals may become small. Therefore, the multi-aperture 351 can be set to have a smaller aperture area at the portion near the optical axis and a larger aperture area at the portion apart from the optical axis. In particular, a crosstalk is small even if no aperture is disposed outside because no detector is disposed adjacent to the end of each line and each row.

In FIG. 3, reference numeral 353 refers to a deflector for conducting a dynamic correction; reference numeral 355 to an exciting coil of the objective lens 313; reference numeral 357 to a sealing for separating the exciting coil from the vacuum portion of an electron beam apparatus in order to permit the exciting coil to be mounted in the atmosphere; and reference numeral 359 to an O-ring for the sealing.

As described above, the embodiment as illustrated in FIG. 3 can produce a large beam current even if the beams are reduced to a smaller size because the electromagnetic lens and the lens gap as well contract the multiple beams using the lens disposed on the side of the sample. The conventional system has a great problem, however, such that, as the magnetic field is present on the sample, the beams emitted vertically from the sample do not cross the optical axis so that the NA aperture cannot be disposed and, as a result, the crosstalk with adjacent beams may become large. In this embodiment, on the other hand, an image having a high precision can be formed by mounting a small aperture in front of the detector in place of the NA aperture and by making a crosstalk with adjacent beams smaller.

Fourth Embodiment

Figure 4:
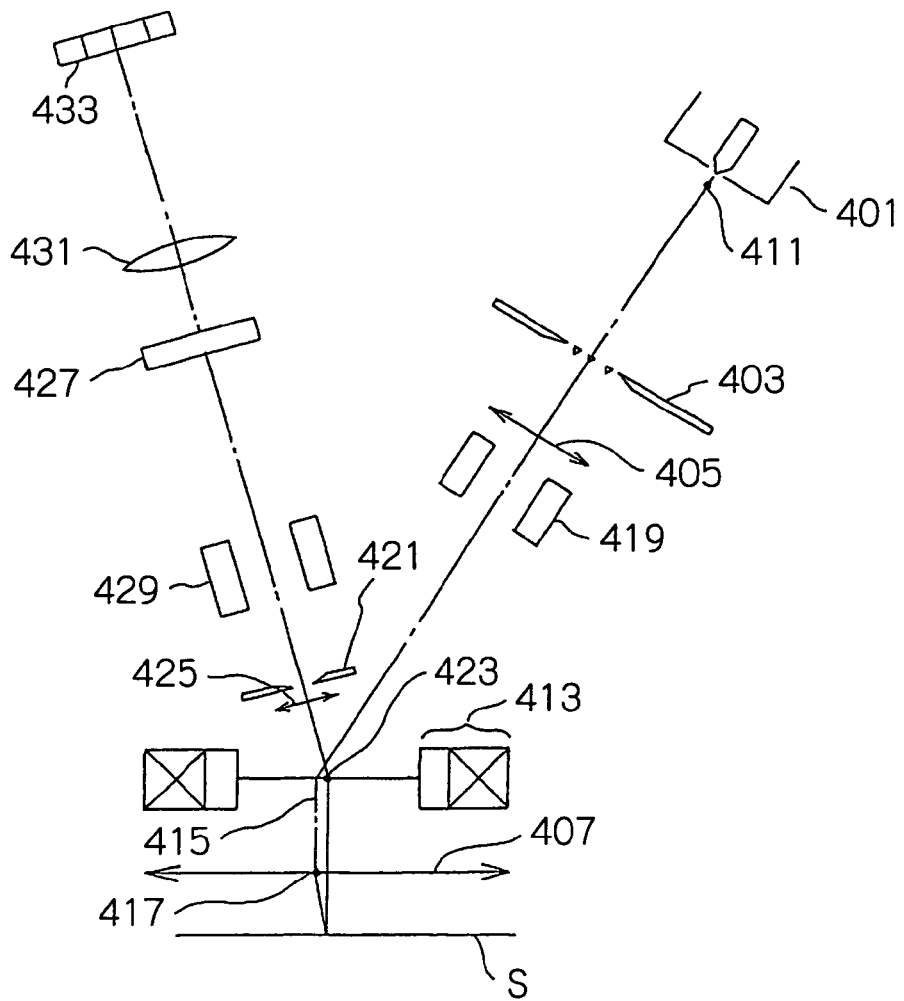
FIG. 4 is a schematic representation showing an electron optical system with its detecting plane reduced to a smaller dimension to obtain a high resolution by scanning with large beams according to an embodiment of the present invention 1-4.

FIG. 4 illustrates an electron beam system in which the sample is scanned by primary beams having a low resolution, but large beam current, and an image of the secondary electrons is magnified on the detecting plane with the magnifying secondary optical system and which is provided with an aperture on the detecting plane in order to obtain an image of a high resolution. The primary beams (as shown on the right-hand side in the drawing) irradiate the sample S from the direction inclined by approximately 30° with respect to the normal line of the sample S. The aperture 403 is irradiated with the beams emitted from the electron gun 401, and a reduced image is formed on the plane of the sample plane 409 in association of the condenser lens 405 with the objective lens 407. The cross-over 411 to be generated by the electron gun is formed on the principal plane of the objective lens 407 with the one-stage magnetic lens 405. The aperture 403 may be disposed in a single or plural number.

The primary beams are deflected with the beam separator 413 leading toward the sample S passing through the trajectory 415 and forming the cross-over on the principal plane 417 of the objective lens 407. The sample is subjected to raster scanning with the electrostatic deflector 419 and the electrostatic deflector of the beam separator 413. The sample S is applied with a negative voltage of several kv. For the objective lens 407, there may be selected, for example, from the lens as illustrated in FIG. 1, a combination lens of a normal electromagnetic lens and an electrostatic lens, or just an electrostatic lens. It is provided, however, that, in the event where the lens as illustrated in FIG. 1 is selected, the NA aperture 421 cannot be disposed in the secondary optical system. In other words, in this event, as the axial magnetic field of the magnetic lens 407 is not zero or null on the sample plane, the secondary electrons emitted from the sample in the direction of the normal line form no cross-over, i.e., they do not cross the optical axis, so that no NA aperture can be disposed.

In the event where either objective lens other than the objective lens of FIG. 1 is selected, an accelerating electrical field for the secondary electrons is formed between the sample S and the objective lens 407 so that the secondary electrons emitted at a wide angle with respect to the normal line of the sample plane is converged into a smaller size. Therefore, a high resolution can be achieved without decreasing a detection efficiency of the secondary electrons, even if the NA aperture 421 is an aperture having a small dimension. As shown in FIG. 4, at least the principal light beams of the primary beam and the secondary beam pass through different paths during the course between the beam separator 413 and the sample plane S. This arrangement does not increase the blur of the secondary beam due to the space-charge effects of the primary beams. Moreover, as an image of the secondary electrons is formed on the main deflection plane of the beam separator 413 so that no deflection chromatic aberration occurs at this portion. In addition, no chromatic aberration is caused to occur. In addition, no chromatic aberration will occur because the amount of electromagnetic deflection doubles the amount of electrostatic deflection.

This occurs because the deflection chromatic aberration caused by the electromagnetic deflector of the beam separator 413 is equal in an absolute value to a chromatic aberration of the electrostatic deflectors (the electrostatic deflector 419 and the electrostatic deflector of the beam separator) and the directions of deflections are opposite to each other. The image of the secondary electrons formed on the deflection principal plane 423 of the beam separator is further magnified with the magnifying lens 425 forming an magnified image on the scintillator coated on the inner side of the vacuum window with the FOP disposed at the central portion. Reference numeral 429 refers to a deflector for dynamic correction; reference numeral 431 to a light magnifying lens; and reference numeral 433 to a PMT array. The system of the present invention which is different to a great extent from the invention as shown in FIG. 3 resides in that the resolution of the primary beam has to be improved whereas the resolution of the secondary beam has to be improved for the aspect of the invention as shown in FIG. 4. In order to improve the resolution of the secondary beam for this aspect of the present invention, accordingly, the image of the secondary electrons is formed on the deflection principal plane of the beam separator to remove a deflection chromatic aberration at the time of deflection of the secondary beam with the beam separator.

As described above, the embodiment as shown in FIG. 4 can form an image of a high resolution while the beam size of the primary beam is being kept magnified because the secondary electrons emitted from a small region of the sample can irradiate the detector by improving the resolution of the secondary optical system while the beam size of the primary beam is being kept magnified. In the event where the scanning is effected by the beam with a constant beam size while keeping the beam size of the primary beam magnified, the beam current in a pixel can be made smaller in proportion to the second power of pixel size, i.e., (pixel size)$^2$, so that a throughput at a high resolution can be decreased because the resulting signals are weakened at a slower rate as compared with the conventional case where the beam current becomes smaller in proportion to the fourth power of pixel size, i.e., (pixel size)$^4$.

Fifth Embodiment

Figure 5:
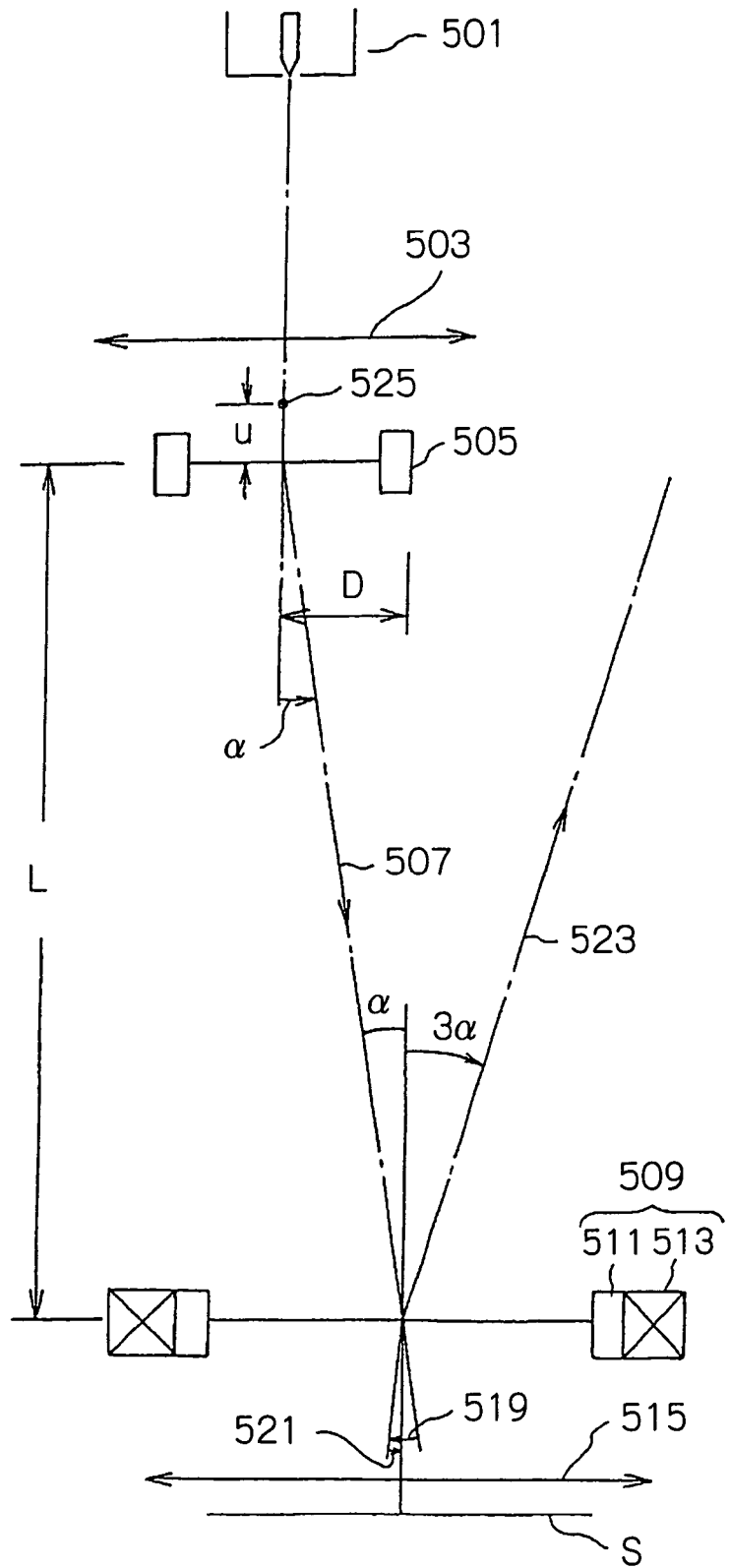
FIG. 5 is a schematic representation showing an optical system for removing a deflection chromatic aberration of a beam separator according to an embodiment of the present invention 1-6.

FIG. 5 shows an embodiment of the present invention 1-6. In the embodiment as shown in FIG. 5, neither the primary optical system nor the secondary optical system are disposed vertically to the sample plane so that the deflection chromatic aberration at either optical axis can be removed, but it is difficult to manufacture an optical system with a high precision. FIG. 5 illustrates an embodiment for an electron beam system that can manufacture a lens mount with a high precision by mounting either of the primary and secondary optical systems at a right angle to the sample. More specifically, FIG. 5 shows an embodiment in which the primary optical system is disposed at a right angle to the sample or, conversely, the secondary optical system can be disposed at a right angle to the sample by mounting the electron gun on the right-hand side of the drawing and passing the electron beams in the direction opposite to that indicated by arrows. The following description is made regarding the embodiment as shown in FIG. 5 alone, in which the primary optical system is disposed at a right angle to the sample.

FIG. 5 illustrates an essential portion of the electron beam system of the embodiment according to the present invention 1-6. In FIG. 5, reference numeral 501 refers to an electron gun; reference numeral 503 to a condenser lens; reference numeral 505 to an axial alignment deflector; reference numeral 507 to an trajectory of principal light beams of primary beams; reference numeral 509 to a beam separator containing an electrostatic deflector 511 and an electromagnetic deflector 513; reference numeral 515 to an objective lens; reference sign S to a sample; reference numeral 519 to an amount of deflection by the electromagnetic deflector 513; reference numeral 521 to an amount of deflection by the electrostatic deflector 511; and reference numeral 523 to an trajectory of principal light beams of secondary beams.

In this embodiment, the electron gun 501, the condenser lens 503 and the deflector 505 are disposed on one optical axis while the objective lens 515 and the beam separator 509 are disposed on another optical axis apart from the above optical axis, thereby deflection the electron beams to the center of the beam separator 509 with the deflector 505.

Suppose that a Z-directional distance between the deflector 505 and the beam separator 509 is expressed as L. When the electrons emitted from the sample S are intended to be deflected with the beam separator 509 by $3\alpha$ toward the right-hand side of the drawing, a deviation amount D between the two optical axes can be expressed as $D=L\alpha$. Then, formula (1) below can be given on the basis of the relation of the amounts of deflections and formula (2) can be given from the condition for removing the deflection chromatic aberration.

(i) Where the deflector 505 is an electrostatic deflector:

$$\text{(Deflection amount 519 of primary beams by deflector 513)} - \text{(Deflection amount 521 of primary beams by deflector 511)} = \alpha \quad (1)$$

$$2 \times \text{[Deflection amount 521 by deflector 511} + \text{(Deflection amount by deflector 505; } \alpha) \times u/L\text{]} = \text{(Defelction amount 519 by deflector 513)} \quad (2)$$

A ratio of the deflection amount 511 with respect to the deflection amount 513 can be determined from the simultaneous equations of the formulas (1) and (2).

(ii) Where the deflector 505 is an electromagnetic deflector, the formula (1) above is the same as described above while the formula (2) is amended to formula (2)' which can be read as follows:

$$2 \times \text{(Deflection amount 521 by deflector 511)} = \text{[(Deflection amount 519 by deflector 513)} - \text{(Deflection amount by deflector 505; } \alpha) \times u/L\text{]} \quad (2)'$$

A ratio of the deflection amount 511 with respect to the deflection amount 513 can be determined from the simultaneous equations of the formulas (1) and (2)' above.

Each of the formulas (2) and (2)' can be given from the condition of removing the deflection chromatic aberration by the following equation: deflection amount by the electromagnetic deflector=2×(deflection amount by the electrostatic deflector). It is provided herein, however, that a gradual decrease of the deflection chromatic aberration by the deflector 505 at a rate of 1/L with respect to the deflection chromatic aberration of the beam separator is taken into account. In the formulas above, symbol "U" refers to a length between a conjugate point of the objective lens 515 and the sample plane 517 and the deflector 505. The beam separator 509 may comprise an electromagnetic deflector alone.

In the event where the electron gun is disposed on the right-hand side of FIG. 5 and the electron beams advance in the direction opposite to that indicated by arrow, the electron beam emitted from the electron gun is deflected with the beam separator 509 irradiating vertically the sample S and the secondary electrons emitted from the sample are deflected with the beam separator 509 toward the center of the deflector 505 having another optical axis parallel to the normal direction of the sample, thereby aligning with the other optical axis with the deflector. As described above, the embodiment of FIG. 5 can mount either of the primary optical system or the secondary optical system at a right angle to the sample, thereby manufacturing a mirror mount having a high precision.

Sixth Embodiment

Figure 6:
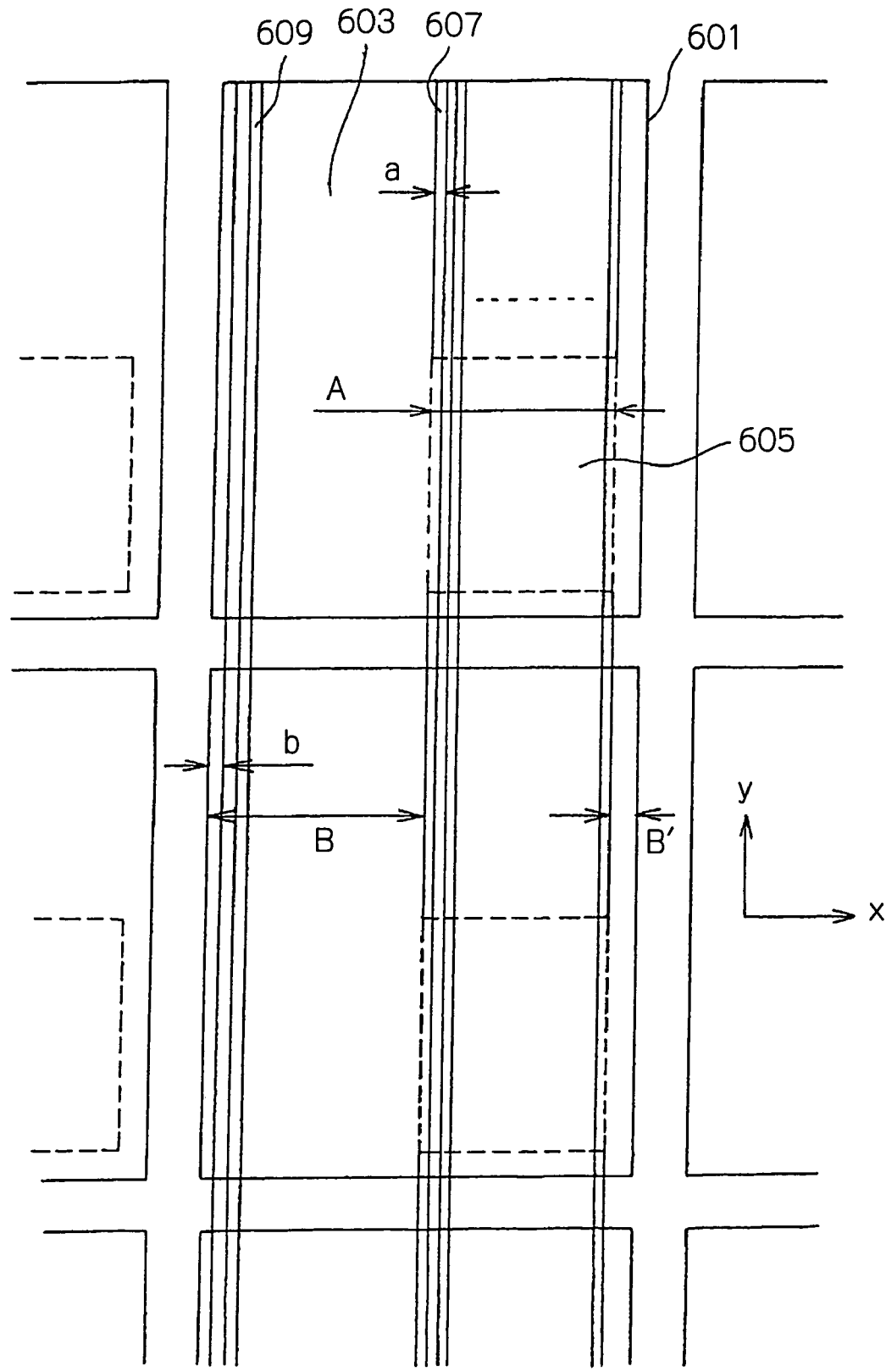
FIG. 6 is a schematic representation showing a stripe-dividing process in the defect inspection method according to an embodiment of the present invention 1-5.

FIG. 6 illustrates an embodiment according to the present invention 1-6 which is directed to the method for detecting a defect of a sample by focusing or focussing the electron beams emitted from the sample by irradiation of the sample and passage through the sample or reflected from the sample or reflected before striking the sample (for example, electron beams striking a sample having a negatively biased electron mirror surface) on the detector plane with an image projection optical system. In this method, there may be utilized a die-to-die process which is carried out by conducting a comparison of the image to be inspected with a reference image for each die and a cell-to-cell process which is carried out by conducting such a comparison for each cell. A die 601 on the sample may be composed of a mixture of a region 603 which has to be inspected only by the die-to-die process with a region 605 which can also be inspected by the cell-to-cell process.

The defect inspection may be carried out by acquiring an image of the sample for each stripe divided from a die or a cell while moving a stage continuously in a y-axial direction. In this case, a circuit for an image forming part may be different in some cases between a circuit for carrying out a die-to-die comparison and a circuit for carrying out a cell-to-cell comparison. Even if such a circuit would be identical to each other, software for use with the circuit may be different from each other in many cases. Further, it may require a certain duration of time to fetch an image in a circuit for use with the die-to-die comparison or with the cell-to-cell comparison and shift the fetched image from the circuit for the die-to-die comparison to the circuit for the cell-to-cell comparison or vice versa. Therefore, it is less preferred to carry out such a shift procedure within one field. In other words, for instance, in the event where a pixel frequency is supposed to be 100 MHz, it will require 10 ns or shorter for example to shift the image signals fetched in a circuit for the die-to-die comparison to a circuit for the cell-to-cell comparison within one field or vice versa. It is extremely difficult, accordingly, to carry out such work.

In the present invention 1-5, in order to require no shift procedure within one field as described above, a stripe is divided in such a manner that the boundary lines of the stripes come into agreement with each other for both regions, that is, the regions B and B' where the defect inspection is to be conducted by the die-to-die comparison and the region A where the defect inspection is to be conducted by the cell-to-cell comparison. In the region A where the cell-to-cell comparison is to be conducted, the x-directional width "a" of the stripe 607 is set to be wider by several times a pitch of the cell. In the regions B and B' where the die-to-die comparison is to be conducted, the x-directional width "b" of the stripe 609 is set to be as wide as a dimension of the field, that is, an x-directional dimension equal to a scanning width of the beam (a beam size in the case of the image projection type). This can facilitate the shift procedure because the shift of the circuits within one field is no longer needed unlike in the conventional method.

Seventh Embodiment

Figure 7:
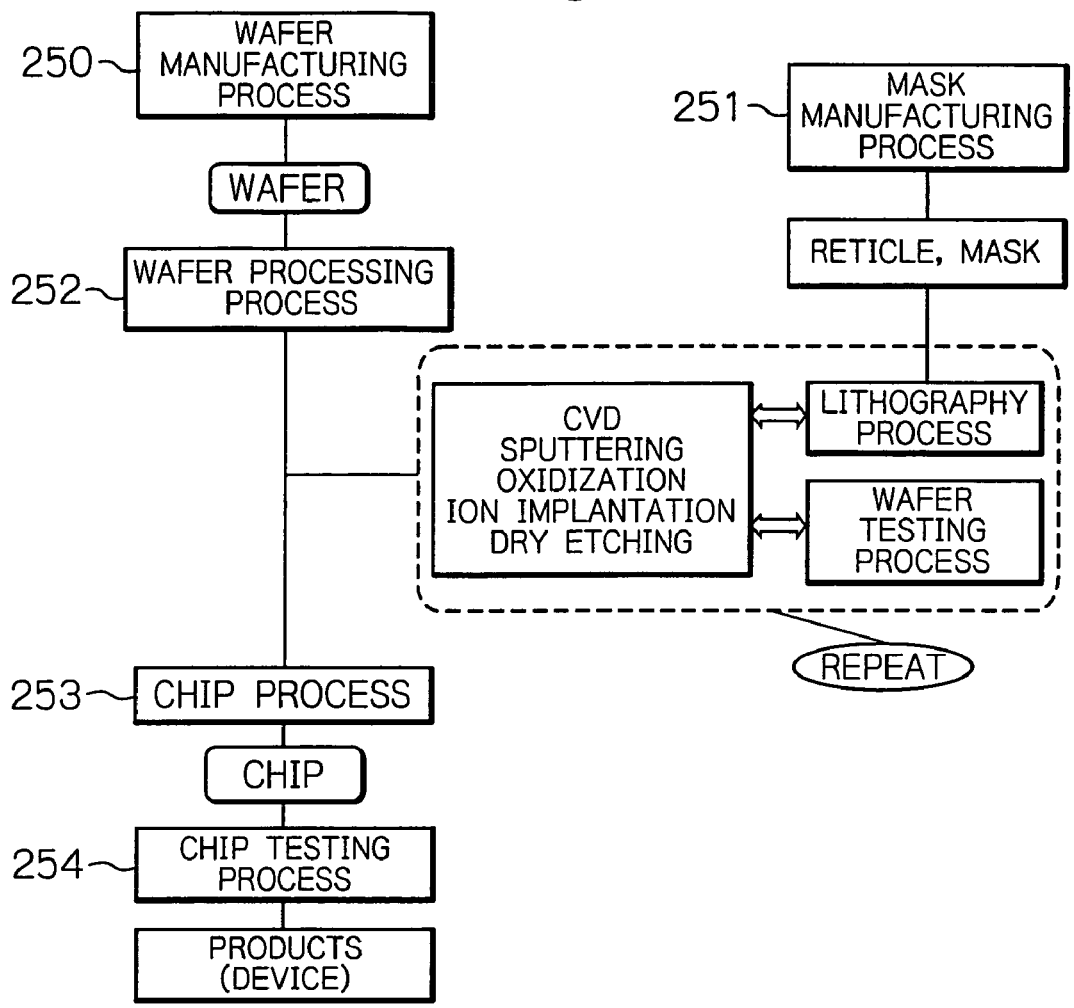
FIG. 7 is a flowchart showing a process for the production of a semiconductor device according to the present invention 1-8.

FIG. 7 is a flowchart of manufacturing process for semiconductor devices wherein the above mentioned electron beam apparatus is applied to evaluation of the wafers. An example of a device manufacturing process will be described according to the flowchart of FIG. 7. The manufacturing process of the example in FIG. 7 comprises the following main processes.
 (1) a wafer manufacturing process 250 for manufacturing a wafer (or a preparing process for preparing wafers);
 (2) a mask manufacturing process 251 for manufacturing masks required for exposure (or a preparing process for preparing the masks)
 (3) a wafer processing process 252 for providing any processing required for the wafer;
 (4) a chip assembling process 253 for cutting out those chips formed on the wafer one by one so as to make them operative;
 (5) a chip testing process 254 for testing the finished chips. Each of those processes includes some sub steps, respectively.

Among these main processes, the wafer processing process set forth in (3) exerts critical affections to the performance of resulting semiconductor devices. This process involves sequentially laminating designed circuit patterns on the wafer to form a large number of chips which operate as memories, MPUs and so on. The wafer processing process includes the following sub-processes:
 (1) a thin film forming sub-process for forming dielectric thin films serving as insulating layers, metal thin films for forming wirings or electrodes, and so on (using CVD, sputtering and so on);
 (2) an oxidization sub-process for oxidizing the thin film layers and the wafer substrate;
 (3) a lithography sub-process for forming a resist pattern using masks (reticles) for selectively processing the thin film layers, the wafer substrate etc.;
 (4) an etching sub-process for processing the thin film layers and the substrate in conformity to the resist pattern (using, for example, dry etching techniques);
 (5) an ion/impurity implantation/diffusion sub-process;
 (6) a resist striping sub-process; and
 (7) a sub-process for testing the processed wafer. The wafer processing process is repeated a number of times equal to the number of required layers to manufacture semiconductor devices which operate as designed.

Figure 8:
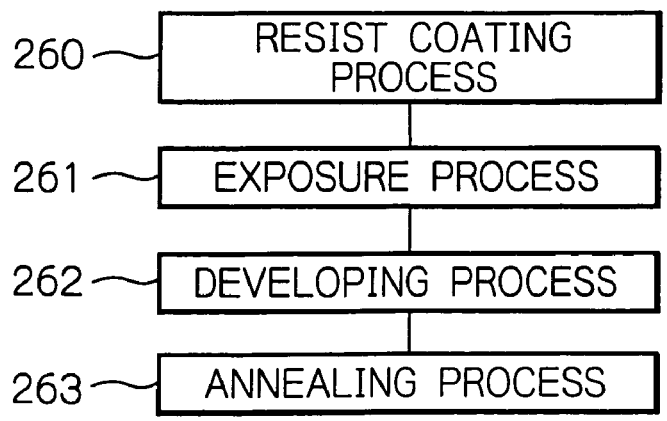
FIG. 8 is a flowchart showing a lithography process of the semiconductor device production method of FIG. 7.

FIG. 8 is a flow chart illustrating the lithography sub-process which forms the core of the wafer processing process mentioned above. The lithography sub-process includes the following steps:
 (1) a resist coating step 260 for coating a resist on the wafer on which circuit patterns have been formed in the previous process;
 (2) a step 261 of exposing the resist;
 (3) a developing step 262 for developing the exposed resist to produce a resist pattern; and
 (4) an annealing step 263 for stabilizing the developed resist pattern. Since the aforementioned semiconductor device manufacturing process, wafer processing process and lithography process are well known, and therefore no further description will be required.

In the event where the defect inspection system according to each embodiment as described above is used in the wafer inspection step (7) above for inspection of wafers, a defect can be inspected at a high precision with a semiconductor device having a fine pattern, too, in such a state in which an image of secondary electron beams is free from disorder. Therefore, a yield of products can be improved.

It is to be noted herein that a pattern evaluation method for evaluating a pattern can be applied extensively to evaluations of patterns of products including a defect inspection of samples such as, for example, photomasks, reticles, wafers, etc. and measurements for line widths, alignment precision, potential contrast, and so on.

Figure 9:
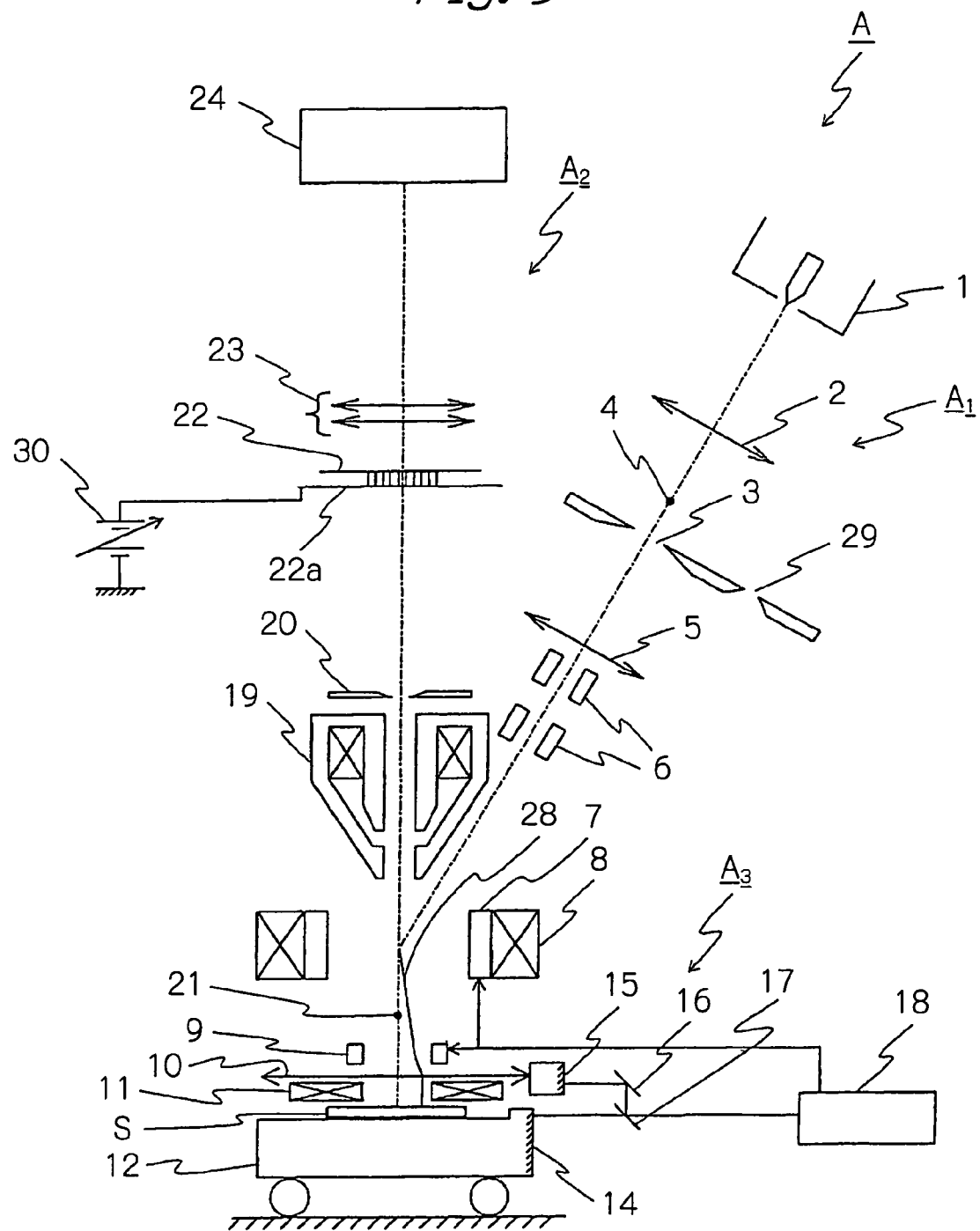
FIG. 9 is a schematic block diagram showing the electron beam system according to an embodiment of the present invention 2-1.

FIG. 9 is a schematic representation showing an electron beam system A of the embodiment of the present invention 2-1. As shown in FIG. 9, the electron beam system A comprises a primary optical system (electron beam irradiation optical system) a1, a secondary optical system (image projection optical system) a2, and a stage part A3.

The primary optical system A1 may comprise an electron gun 1, a condenser lens 2, a square-shaped aperture 3, a condenser lens 5, a deflector 6, beam separators 7 and 8, an electrostatic deflector 9, an objective lens 10, and an electromagnetic deflector 11 for MOL operation. The secondary optical system A2 may comprise a second magnifying lens 19, a NA aperture 20, a FOP (fiber optic plate) 22, a zoom-magnifying lens 23, and a detector 24. The stage part A3 may be provided with a laser-moving mirror 14, a laser-stationary mirror 15, a reflecting mirror 16, a beam splitter 17, and a laser oscillating-receiving machine 18.

With the construction as described above, the electron beam is emitted from the electron gun 1 and focused with the condenser lens 2. The focused electron beams then form a cross-over at a predetermined point 4 on the side upstream of the square-shaped aperture 3. The electron beams diverging from the predetermined point 4 where the cross-over is formed are then irradiated uniformly onto the square-shaped aperture 3. The electron beams passed through the square-shaped aperture 3 are deflected with the beam separator while they are being focused with the condenser lens 5, forming a cross-over on the principal plane of the objective lens 10. Moreover, the electron beam diverging from the square-shaped aperture 3 advances while being focused slightly with the condenser lens 5 and then deflected with the beam separators 7 and 8, and they pass through the objective lens 10 forming an image on the sample S.

The surface of the sample S may be divided virtually into stripes 26 each having a 400-μm width W and arranged in a longitudinal direction parallel to the y-directional axis. The stripe 26 is further divided virtually into main field regions, each having an elongated shape parallel to the latitudinal direction (the x-axial direction of FIG. 10). The main field region is further divided virtually into subfields 27, each having four 25-μm sides. In other words, the stripe 26 is divided into sixteen subfields 27 along the width W thereof. An image is formed in a 25-μm unit of each of the subfields 27 by irradiation with electron beams. For the electron beam system A according to this embodiment, a dimension of the sample S corresponding to one pixel upon forming a two-dimensional image is 0.1 μm so that each subfield 27 having four 25-μm sides corresponds to 250×250 pixels. Therefore, an image can be formed in a 250×250 pixel portion ($6.25 \times 10^4$ pixels) per unit.

Figure 10:
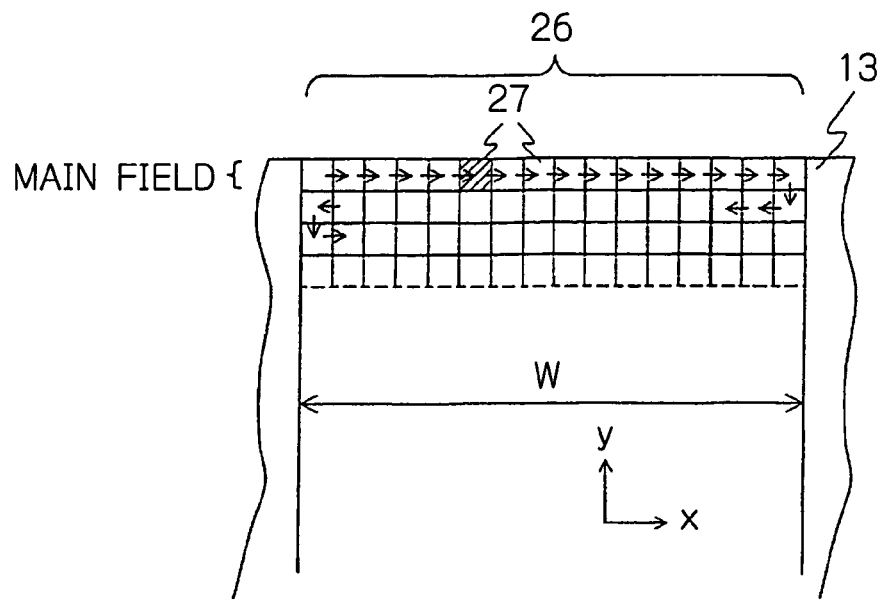
FIG. 10 is a view showing a state of a division of a sample surface into a stripe region, a main field region and a subfield region.

If a pixel frequency is assumed to be 1 GHz, time needed per one pixel is 1 ns so that the time needed for $6.25 \times 10^4$ pixels can be calculated by: 1 (ns)×$6.25 \times 10^4$ (pixels)=62.5 (μs). In other words, one subfield is irradiated with the electron beam for the duration as long as 62.5 μs and the electron beam is then moved to the adjacent subfield 27, followed by irradiation the subfield 27 with the electron beam and repetition of these operations thereafter. In the event, accordingly, where the main field 26 is divided along the stripe width W into sixteen subfields 27 in each row as shown in FIG. 10, the time needed for irradiation of all the subfields in each row will be 62.5 μs×16. Therefore, the speed for moving the stage 12 in the x-axial direction will be 25 μs/(62.5 μs×16)=25 mm/s. It is to be noted herein, however, that the size of subfield is not limited to the above particular one, needless to say, and it may have approximately 512×512 pixels.

Information regarding the speed, acceleration and position of the stage 12 can be measured by means of a laser interferometer and the current position and near-future positions of the stage 12 can be computed. In order to cause no moving of the image to be formed on the detector 24, the deflectors 7 and 9 are subjected to feedforward correction during the duration of time for which one subfield 27 is being irradiated with the electron beam.

On the other hand, the secondary electrons emitted from the surface of the sample S (and transmitting electrons transmitting through the sample as well) are magnified with the objective lens 10 and the magnifying lens 19 to several tens of times, forming an image having a region slightly larger than one subfield 27 on the inner side of the FOP 22. The secondary electrons are then converted into an optical image by the scintillator coated on the inner side of the FOP 22, i.e., by a sintilation substance emitting light upon absorption of an energy of the electron beam, and transmitted to the detector 24. Concurrently, voltage is applied to the inner side of the FOP 22 for accelerating the secondary electrons with the object to heighten a sintilation efficiency of the scintillator. It is to be noted herein that each fiber constituting the FOP 22 is configured in such a manner that an index of refraction is adjusted to become larger at the central portion and smaller gradually and continually as the positions are more distant from the central portion. At this end, the light passing from the exit side is substantially parallel to the axial line of the fiber even when the secondary electrons are sent to the FOP 22 at various angles. Therefore, the zoom-magnifying optical lens 23 disposed on the downstream side of the FOP 22 can transmit the irradiating light by approximately 100% to the detector (for example, a plane detector such as CCD sensor, etc.), even if it is a lens having a large F number.

It is to be noted herein that the electron beams of the secondary electrons to be emitted from the subfield at the position apart from the optical axis cause no aberration outside the optical axis by the electromagnetic lens because the objective lens 10 and the electromagnetic deflector 11 satisfy the conditions as MOL (moving object lens). The principal electron beams for this subfield outside the optical axis advance along the trajectory as indicated by line 28. In other words, the main electron beams from the subfield outside the optical axis are deflected in such a manner that they do not pass through the predetermined point 21 where the cross-over has been formed and they cross the optical axis at the deflection principal plane of the deflector 7 by means of the deflector 9. Then, they are deflected with the deflector 7 so as to become parallel to the optical axis. The conditions for the MOL, the deflector 9 and the deflector 7 are measured in advance for all the subfields 27 and saved in a memory, and they are each set to the electron beam system A before irradiation of each of the subfields 27 with the electron beams.

On the other hand, the electron beams irradiated from the electron gun 1 advance in a direction opposite to the trajectory of the secondary electrons along an trajectory nearby the trajectory as indicated by line 28 because the deflectors 7 and 9 are each an electrostatic deflector. Each of the electron beams has a slightly different amount of deflection because each has a different energy. In order to allow a correction of the difference of the amounts of deflection with the deflector 6, however, a correction amount is saved in a memory for each of the subfields 27.

The two-dimensional image of the subfield 27 formed with the detector 24 is saved in a predetermined memory at the position corresponding to the position of each subfield 27. The magnifying lens 19 is shaped in a truncated form in order to exert no influences on the primary electron beams. The order of forming the image of the subfield 27 is indicated by arrows in FIG. 10. The above description is directed to the case where one pixel in the two-dimensional image formed corresponds to 0.1 μm on a wafer. On the other hand, in the event where a mode is changed in order to make the size of one pixel 0.05 μm (i.e., corresponding to a half size), the square-shaped aperture 3 is changed to a smaller aperture 29 having a half dimension without basically changing the optical conditions of the primary optical system.

The laser interferometer is arranged in such a manner that a laser light generated from the laser oscillator 18 is divided with the beam splitter 17 and one is sent to the laser-moving mirror 14 while the other is sent to the laser-stationary mirror 15 through the reflecting mirror 16. The laser light reflecting from the laser-moving mirror 14 overlaps with the laser light reflecting from the laser-stationary mirror 15 through the reflecting mirror 16 and the laser lights interfere with each other. The interference of the laser light is received by the laser receiver 18, thereby computing the position, speed, etc. of the laser-moving mirror 14 from a variation with intensity caused thereby. It is further to be noted herein that the laser-stationary mirror 15 can accurately measure the position of the sample even if a relative vibration, a thermal expansion, etc. could be caused to occur between the objective lens 10 and the sample S because it is fixed to the outer magnetic pole of the objective lens 10.

Figure 11:
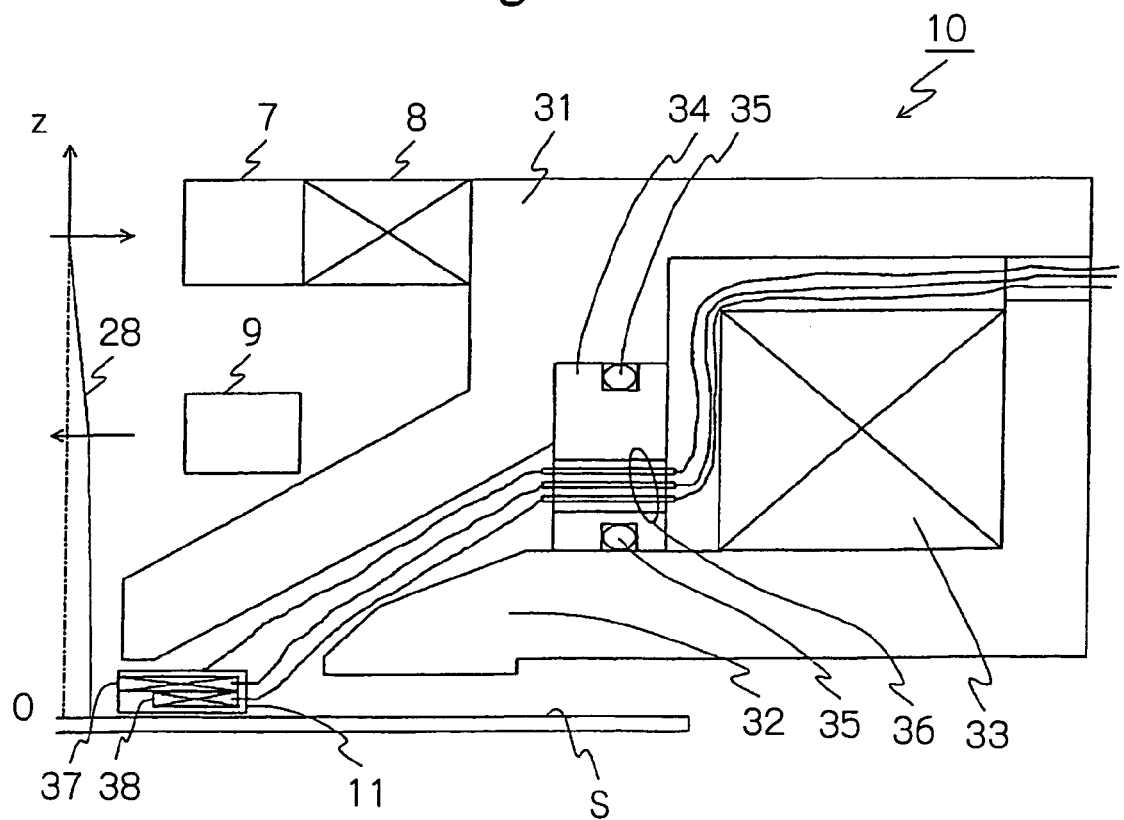
FIG. 11 is an magnified view in section showing an objective lens according to an embodiment of the present invention 2-3.

FIG. 11 illustrates examples according to the present inventions 2-3 to 2-8 and is an magnified view showing a sectional right-hand portion only when viewed from the optical axis of the axially symmetric objective lens 10. The objective lens 10 has the structure in which the magnetic gap occurring between the inner magnetic pole 31 and the outer magnetic pole 32 is positioned facing the sample S and the electron beam is condensed in a magnetic field which occurs in the magnetic gap. A focal distance can be changed by changing an electric current passing through the coil 33. The feature of the objective lens 10 is dependent to the axis Z (central lens axis) of the axial magnetic field distributuin B.

Figure 12:
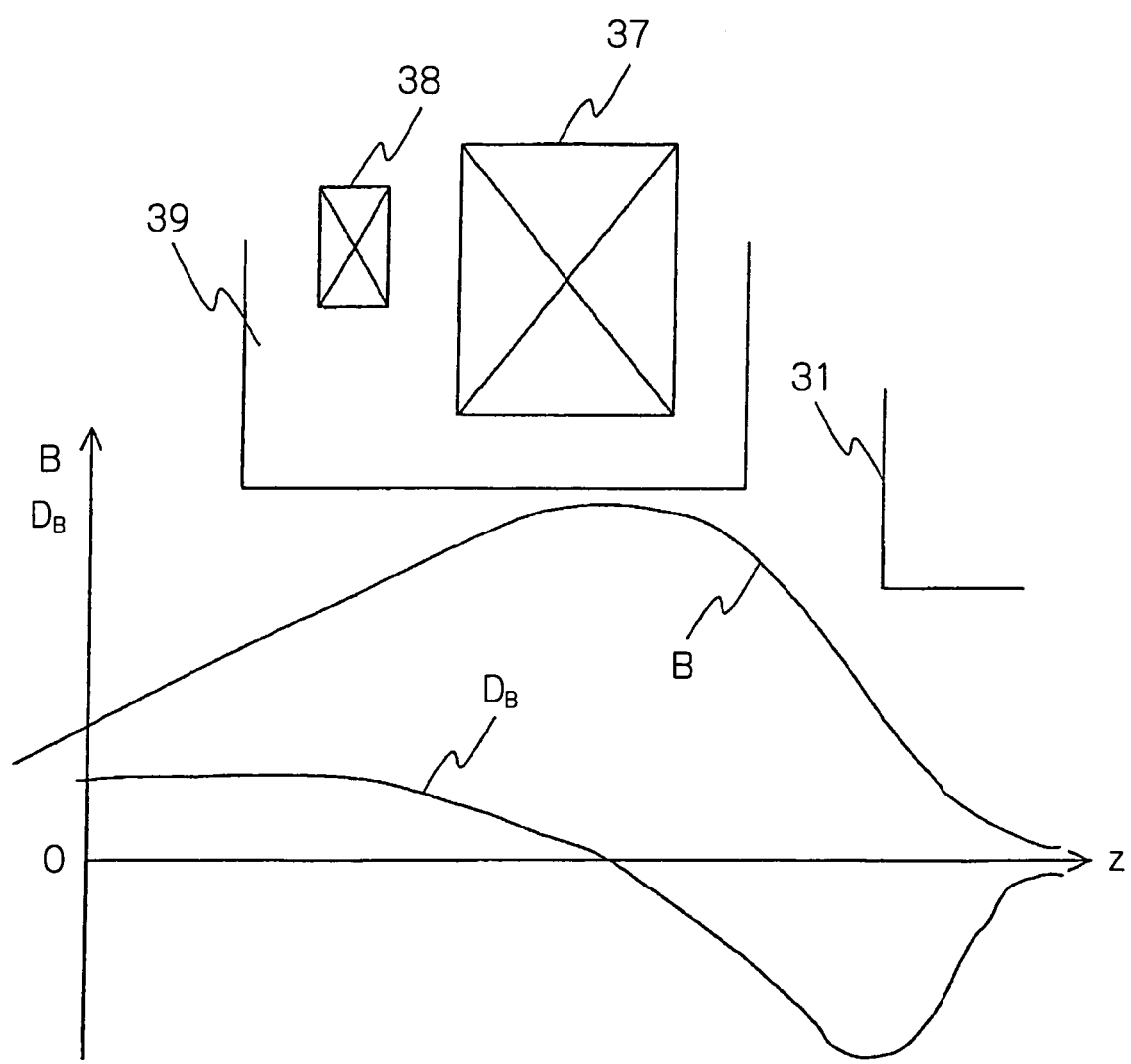
FIG. 12 is a graph showing a distribution of axial magnetic field intensities in the vicinity of a sample and their differential coefficients.

As shown in FIG. 12, the magnetic field distributuin B is not null at the sample position (Z=0) and has a predetermined magnitude. As the position in the Z-axial direction where the magnetic field distributuin becomes maximal is located to the side closer to the sample S than the inner magnetic pole 31, the main lens plane of the objective lens 10 is located closer to the sample S than the inner magnetic pole 31. As a result, the axial chromatic aberration and the spherical aberration increase to a great extent. Moreover, the deflectors (coils) 37 and 38 for carrying out MOL operations can be used as an axially symmetric electrode by accommodating it in a ceramic case and coating the surface thereof with metal. An aberration can be made smaller by applying a positive voltage to the axially symmetric electrode.

A differential value $D_B$ regarding the axis Z of the axial magnetic field distributuin B is also indicated in FIG. 12. The differential value $D_B$ is a positive value on the side of the sample S and a negative value at the side of the inner magnetic pole 31. In other words, in order to effect the MOL operations, it is needed to form a magnetic field deflection in proportion to the differential value $D_B$, and the deflector is divided into two deflectors 37 and 38, thereby forming deflection of a magnetic field having an inverse reference sign. The electric current for exciting the deflectors 37 and 38 is incorporated therefrom by mounting the hermetic seal 36 on the vacuum seal tube 39. The voltage to be applied to the axially symmetric electrode functioning as a coil case is also supplied from the hermetic seal 36.

Moreover, as shown in FIG. 11, the principal light beam passage 28 of the electron beams by the MOL operations is deflected in the direction of the optical axis only by the action of the electrostatic lens of the electrostatic deflector 9 and then deflected in a direction parallel to the optical axis with the electrostatic deflector 7 for the beam separator, thereby the light beams advancing on the optical axis. In the event where the principal beams advance on the optical axis, the beams pass through the center of the NA aperture 20 so that the NA aperture 20 can be disposed forming a projection image having a small aberration on the scintillator plane 22a of the FOP 22. More specifically, the main field is divided into subfields, and an trajectory of the electron beams emitted from the center of the subfield for each field is controlled to pass through the center of the NA aperture. Therefore, an aberration of the electron beams from the subfield distant from the optical axis can be made smaller, like in the event of the subfield closer to the optical axis, by carrying out the MOL operations that allow a lens to be used as the NA aperture, the lens being capable of causing a magnetic field on the sample S, which could not be used conventionally as an objective lens.

Further, the electron gun 1 is provided with energy of 4 keV when the scintillator plane 22a is earthed because a voltage of −4 kV is applied to the cathode. It is found that an amount of light in which the scintillator plane 22a emits when one electron enters becomes an increase function of a beam energy. The signal intensity can be strengthened by applying a positive voltage of approximately +10 kV to the scintillator plane 22a. Moreover, in the event where the pixel size is changed to a ½-fold dimension or a double dimension, etc., the same detector can be used if the square-shaped aperture 3 is changed and the zoom-magnifying optical lens 23 is magnified by a 2-fold or a ½-fold magnification, etc.

Figure 13:
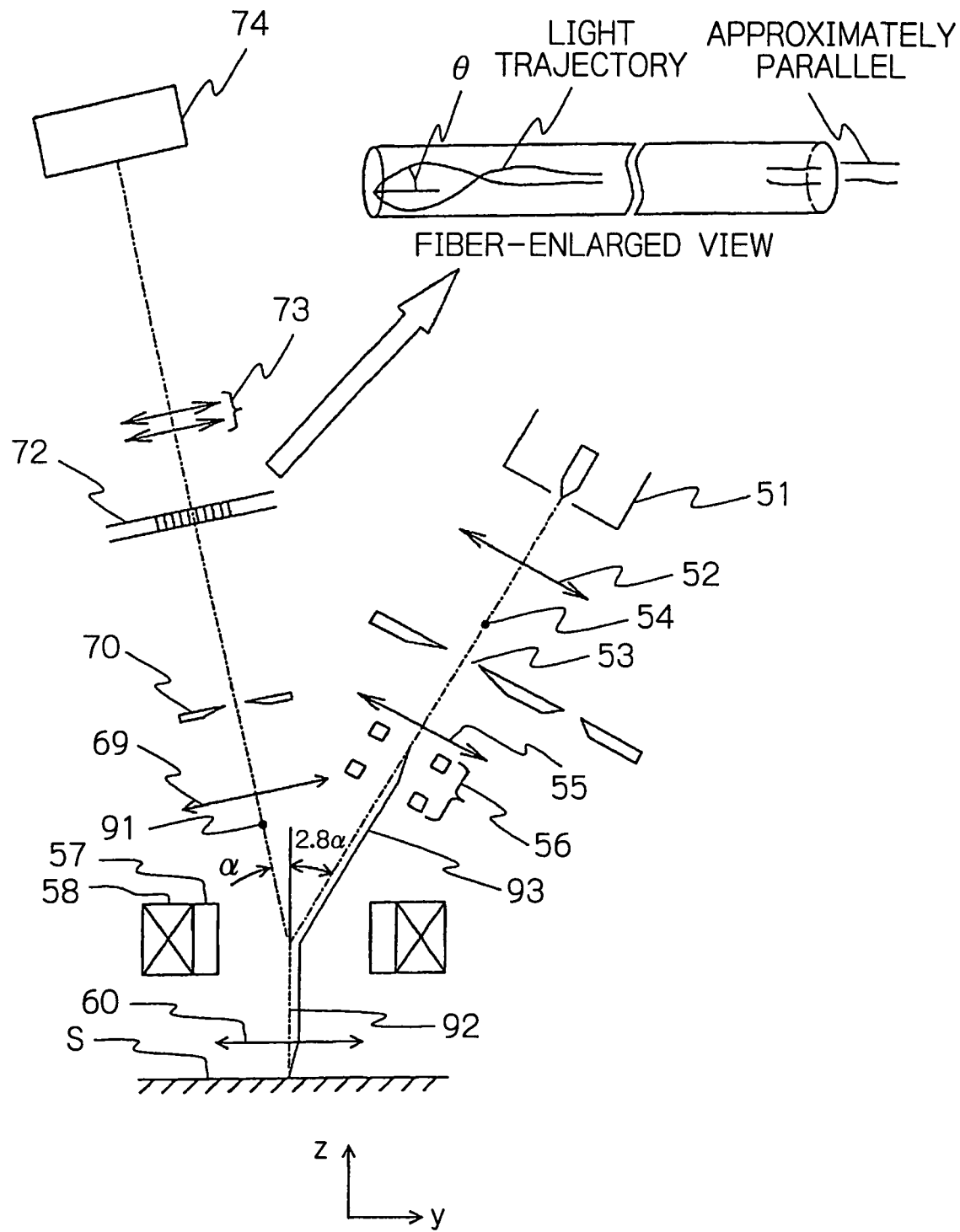
FIG. 13 is a schematic block diagram showing an electron beam system according to an embodiment of the present invention 2-10.

FIG. 13 illustrates an optical system effective particularly in the case where an magnification ratio of the secondary optical system is made larger. In this electron beam system, the primary electron beams are sent from the direction of 2.777 . . . α with respect to the normal line 92 of the sample S and deflected by 2α by electromagnetic deflection and by α by electrostatic deflection with the beam separators 57 and 58, i.e., by a total deflection amount of approximately 3α (this value being 2.777 . . . α, i.e., approximately 2.8α, in the event where the primary electron has 4.5 keV and the secondary electron has 4 keV), thereby the electron beams vertically irradiating the sample S. The secondary electron beams are deflected by 2α with the electromagnetic deflector and by −α with the electrostatic deflector so that they are deflected to the left-hand direction in a total amount of a and they then strike the lens 69. In FIG. 9, the image of the secondary electrons of the sample S are formed on the deflection principal plane of the beam separator so that the deflection chromatic aberration, etc. by the beam separator is corrected with the lens on the downstream side causing no occurrence of aberration on the surface of the scintillator plane 22a.

Moreover, in the case of FIG. 13, the secondary electron of the sample S is arranged to form a sample image at the predetermined point 91 in the vicinity of the lens 69. This structure results in shortening of a focal distance of the lens 69 and magnifying an magnifying ratio of the lens 69 to a great extent. Moreover, a magnifying ratio by the objective lens 60 is somewhat magnified, realizing a short mirror mount having two stages of lenses and a magnification of 100 times or more. It is noted herein as a matter of course that no chromatic aberration by the beam separators 57 and 58 is caused to occur because the amount of electrostatic deflection is a −½-fold amount of electromagnetic deflection. At an upper portion of FIG. 13, an magnified view of one fiber of the FOP 72 is shown. The optical fiber is arranged such that its central portion has a higher index of refraction and a peripheral portion has a lower index of refraction. Therefore, even if the electron beams strike at a wide angle θ as shown in the drawing, the light outgoing from the exit can advance in a direction substantially parallel to the optical axis of the optical fiber by setting the length of the FOP by odd times the focal distance of the optical fiber. This structure of the optical fiber can collect substantially all optical signals with the detector 74 even if the zoom-in optical lens 73 would comprise a lens having a relatively large F number.

Moreover, in order to make the space-charge effect small, the primary electron beam is deflected with the deflector 56, thereby advancing at a position apart by approximately 100 μm from the optical axis, that is, on an trajectory as indicated by passage 93, and returning to the optical axis with the objective lens 60. This permits the primary and secondary electron beams to pass at different positions in a distance between the beam separators 57, 58 and the sample, so that the space charge of the primary electron beam can prevent the secondary electron beam from blur and deviating. As shown in FIG. 13, for example, if the value α is set to approximately 7° or greater, the electron beams of the primary optical system may be separated from that of the secondary optical system by approximately 26.60 or greater. This value is satisfactory.

The electron beam system or the pattern-delineating method for forming a pattern according to the present invention 2-12 can be preferably applied to the method of manufacturing a semiconductor device as shown in FIGS. 7 and 8. More specifically, when the present inventions 2-1 to 2-12 are applied to the inspection step 254 of FIG. 7, fine patterns can be inspected with a high precision and stability, thereby it becomes possible to improve the yield of products.

Figure 14:
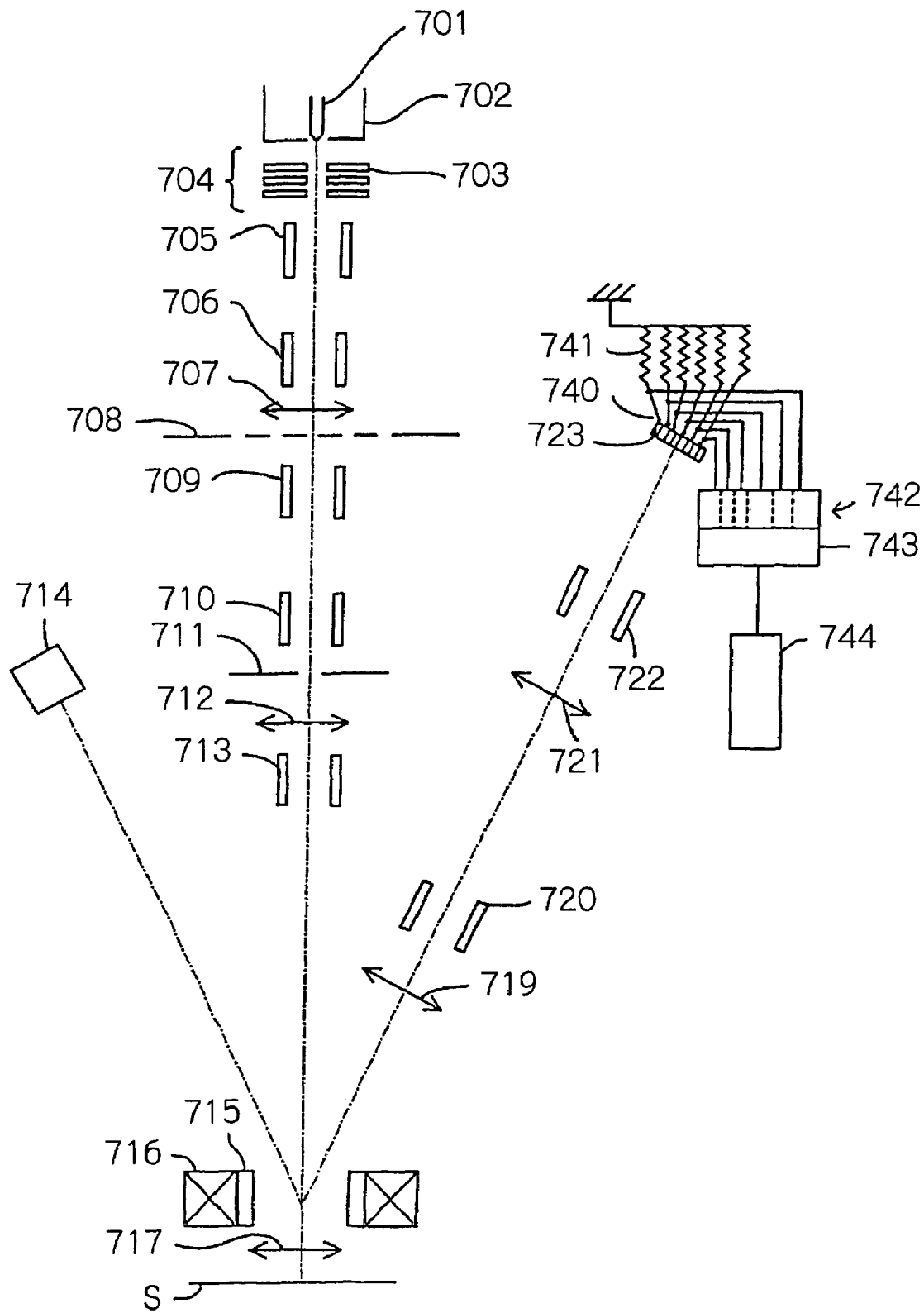
FIG. 14 is a schematic representation showing an electron optical system to be used in an embodiment of the present invention 3-1.

Examples according to the present invention 3-1 will be described hereinafter with reference to FIGS. 14 to 17. FIG. 14 illustrates an entire layout of an electron optical system which can be applied to a pattern evaluation method according to the present invention 3-1. The electron gun may comprise the $LaB_6$ cathode 701, the Wehnelt 702 and the anode 703. The anode 703 constitutes a lens 704. As the $LaB_6$ cathode 701 referred to herein, there may be used a prism-shaped single crystal having each side width of approximately 0.5 mm in which its tip portion is sharpened at a vertex of 60° to 90° in a conical shape and abraded in a hemispherical form having a radius of curvature of 15 to 40 μm. This lens 704 can adjust an angle at which the electron beam is emitted from the electron gun. The electron beam with its discharging angle adjusted with the lens 704 is focused with the condenser lens 707 forming an image on the NA aperture 711. Reference numerals 705 and 706 refer each to an axis-aligning deflector.

The multi-aperture 708 is disposed at a position downstream of the condenser lens 707 and the multi-aperture 708 in turn generates multiple beams. These multiple beams are reduced in two stages with the reducing lens 712 and the objective lens 717 forming multiple beams each having a beam size of approximately 100 μm or smaller on the sample S. Reference numerals 709 and 710 refer each to a deflector for aligning the axis of the NA aperture 711 with the reducing lens 712. These multiple beams scan the sample S in two-dimensional directions with the scanning deflectors 713 and 715 to evaluate a pattern formed on the sample S.

Figure 15:
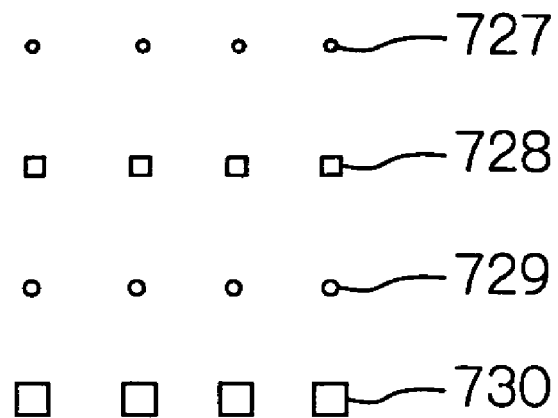
FIG. 15 is a plane view showing various dots to be used for a pattern of a marker.
Figure 16:
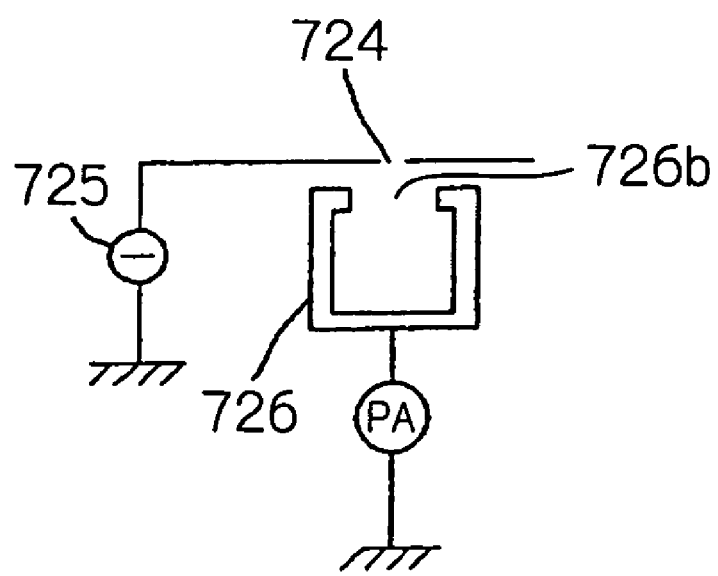
FIG. 16 is a schematic representation showing a configuration of a Faraday cup to be used as a single secondary electron detector.

The characteristics of the multiple beams are needed to be evaluated before evaluation of the pattern on the sample. For evaluation of the multiple beams, a marker formed on the same Z coordinates as the sample is scanned with the multiple beams. The secondary electrons generated from the marker are accelerated and focused with an objective lens, and the focused secondary electrons are deflected with the beam separators 715 and 716 to the left when looked at FIG. 14 and then detected with the single secondary electron detector 714. This procedure can evaluate at least one characteristic selected from beam separation, beam intensity and beam resolution. For the evaluation of the beam separation, there may be used a dot pattern composed of heavy metal dots as indicated by reference numeral 727 on a flat substrate (see FIG. 15). Four different kinds of dots are shown in FIG. 15. Each separation of the dots is set to be satisfactorily larger than the maximum separation between the beams and a diameter of each dot is set to be smaller than the minimal separation of the beams. Therefore, images of the dots corresponding to the number of the multiple beams can be formed with information of the beam separation by subjecting to two-dimensional canning with the multiple beams in the vicinity of one dot. The distance between the multiple beams can be measured from the images of the dots.

In order to measure the beam current, i.e., the beam intensity, for each beam, a Faraday cup as illustrated in FIG. 15 may be used. Above the Faraday cup 726 having an upper opening 726b, an aperture 724 with the positive electric power 725 is disposed. The beam current which does not strike the aperture 724 is not measured. Only the beams passed through the aperture 724 is measured with an ammeter PA. The beam current can be measured for each beam when the radial dimension of the aperture 724 is set to be smaller than the beam separation.

Figure 17B:
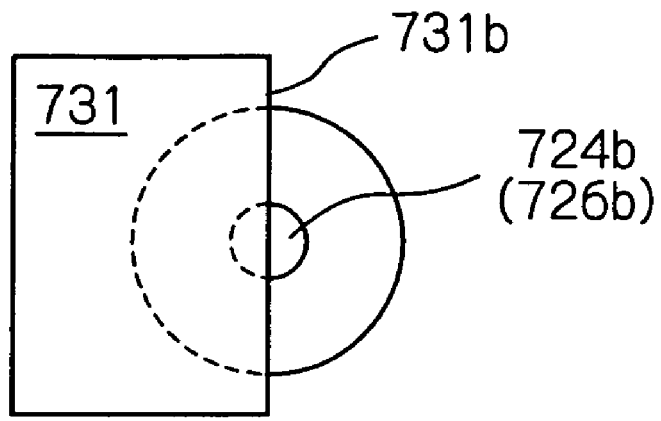
FIG. 17b is a schematic plan view of a Farady cup and a knife edge for measuring a beam solving power.
Figure 17C:
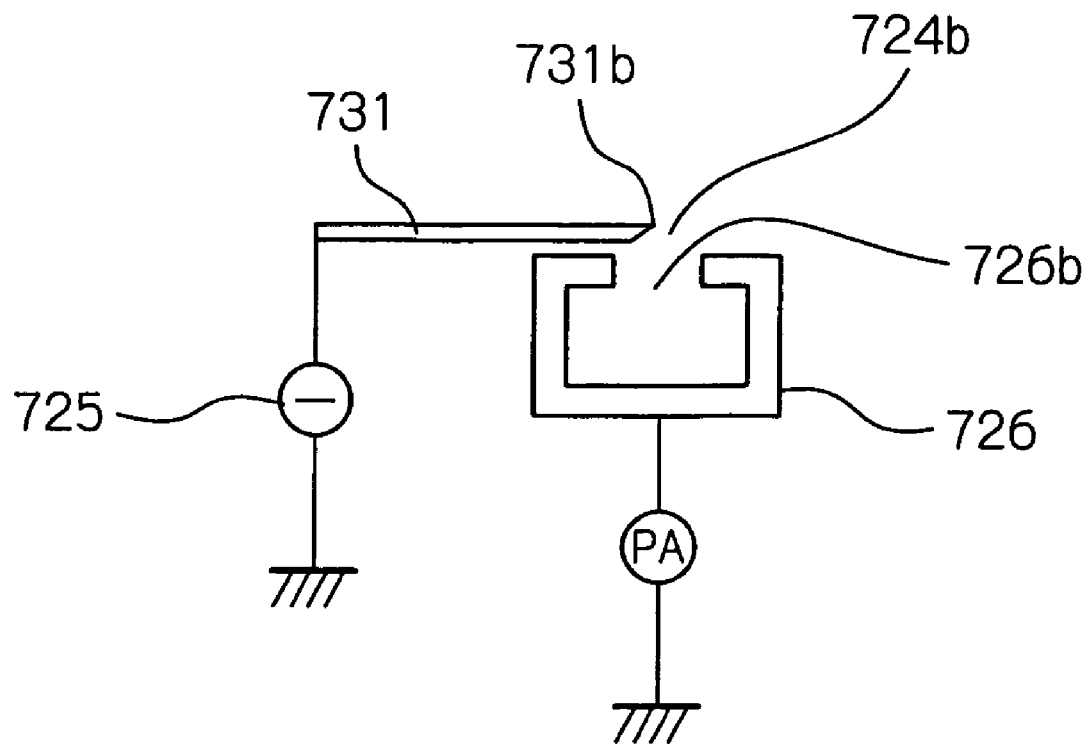
FIG. 17c is a schematic elevational section of the Farady cup shown in FIG. 17b.

For the measurement for the beam resolution, as shown in FIG. 17, there may be used a slit in the form of a knife edge 731b of a plate 731 magnifying parallel to the x-axis, which has a width of a dimension smaller than the minimal beam separation in the y-axial direction and a length of a dimension larger than the maximum beam separation in the x-axial direction. As clearly shown in FIGS. 17b and 17c, the knife edge 731b of the plate 731 is disposed above the upper opening 726b of the Farady cup 726, and a semi-circular opening 724b seen from the above of the Farady cup 726 is formed by the upper opening 726b of the Farady cup cut off by the knife edge 731b of the plate 731. The knife edge-shaped slit 731b is scanned crosswise with the multiple beams. If the scanning amplitude is large enough, a signal wave form as indicated by reference numeral 733 can be obtained as a Faraday cup current. Suppose that the beam separation obtained by projecting each beam onto the y-axis is set to be "$dy_m$" and a rise time for elevating the signal 733 from 12% to 88% at the rise portion of each stage is expressed as "t", the resolution Δyi for each beam can be computed by the following formula:

$$\Delta yi = (t_1/t_2) \times dy_m.$$

The beam size in the x-axial direction, Δxi, can also be computed by obtaining a similar signal wave form as follows:

$$\Delta xi = (t_1/t'_2) \times dx_m.$$

It is needed herein that the knife edge-shaped Faraday cup aperture having a length of a dimension larger than the y-axial beam separation for the beam group as indicated by reference numeral 32 and the beam group as indicated by reference numeral 34 is scanned crosswise by the beams.

The dots 728, 729 and 730 are set each to have a dimension larger than the radial dimension of the dot 727, as shown in FIG. 15. If the dots are too small, the resulting signals become so small that it is difficult to find them. Therefore, these larger dots 728, 729 and 730 are used to confirm the beam positions and then the smaller dots 727 are searched. If it would be found that the beams are not arranged as originally designed by evaluating the dots in the manner as described above, then they are arranged as originally designed by adjusting the lenses or deflectors. The evaluation is finished as they are found originally designed. More specifically, if the beam separation is too wide, the adjustment can be effected by shortening the focal distance of the reducing lens. On the other hand, if the beam size is too large, the beam size can be adjusted by re-alignment of the focus of the objective lens, re-alignment of axes or re-correction of astigmatism. Further, if the beam intensity is lacking, the adjustment can be effected by increasing the current of the electron gun. As the evaluation of the primary beams is completed, the direction of deflection of the beam separator is inversed and the secondary electron group is deflected toward the directions of the secondary optical systems 719 and 721.

In the sample S as there is a large difference between the primary beam and the secondary beam in which the primary beam has an energy of several hundreds eV while the secondary beam has an energy of several eV, it is necessary to simultaneously focus the primary and secondary beams with the objective lens 717. In order to focus them in this manner, the distance between the reducing lens 712 and the objective lens 717 may be made longer than the distance between the objective lens 717 and the first magnifying lens 719.

Theoretically, as the dimension of the former is set to be more than double the dimension of the latter, each of the primary and secondary beams can meet the combining conditions by a relatively large landing energy of the primary beams. More specifically, an image point of the secondary electron with the objective lens can be focused at a position close to the first magnifying lens 719. The image of the secondary electrons magnified with the first magnifying lens 719 is further magnified with the magnifying lens 721 forming an image of the secondary electrons in front of the MCP 723. The secondary electrons of each beam are then multiplied with the MCP 723 and absorbed with the multi-anode 740 converting into a voltage signal with the resistance 741. The voltage signal is then amplified with the multi-amplifier 742 and then converted into a digital signal with the A/D converter 743. A two-dimensional image is formed with the image-forming circuit 744 and the image of each beam is linked together forming an image of the sample.

The pattern of the dots 730 is used for uniting the signal intensity of each beam. As the size of the dot 730 is set to be sufficiently larger than the beam separation, the signal intensity is sufficiently large. As the signals obtained with the multi-amplifier 742 are each divided into the signal of each beam, no confusion with the adjacent signals may be caused to occur. Uniting the signal amplitudes can be effected by adjusting a gain of the multi-amplifier 742.

In accordance with the present invention 3-1, the primary and secondary optical systems of the multi-beams can be evaluated independently from each other so that the pattern evaluation can be carried out with a high precision by using the multi-beams as designed. An embodiment illustrative of the present invention 3-2 will be described with reference to FIG. 18.

Embodiment of the Invention 3-2

Figure 18:
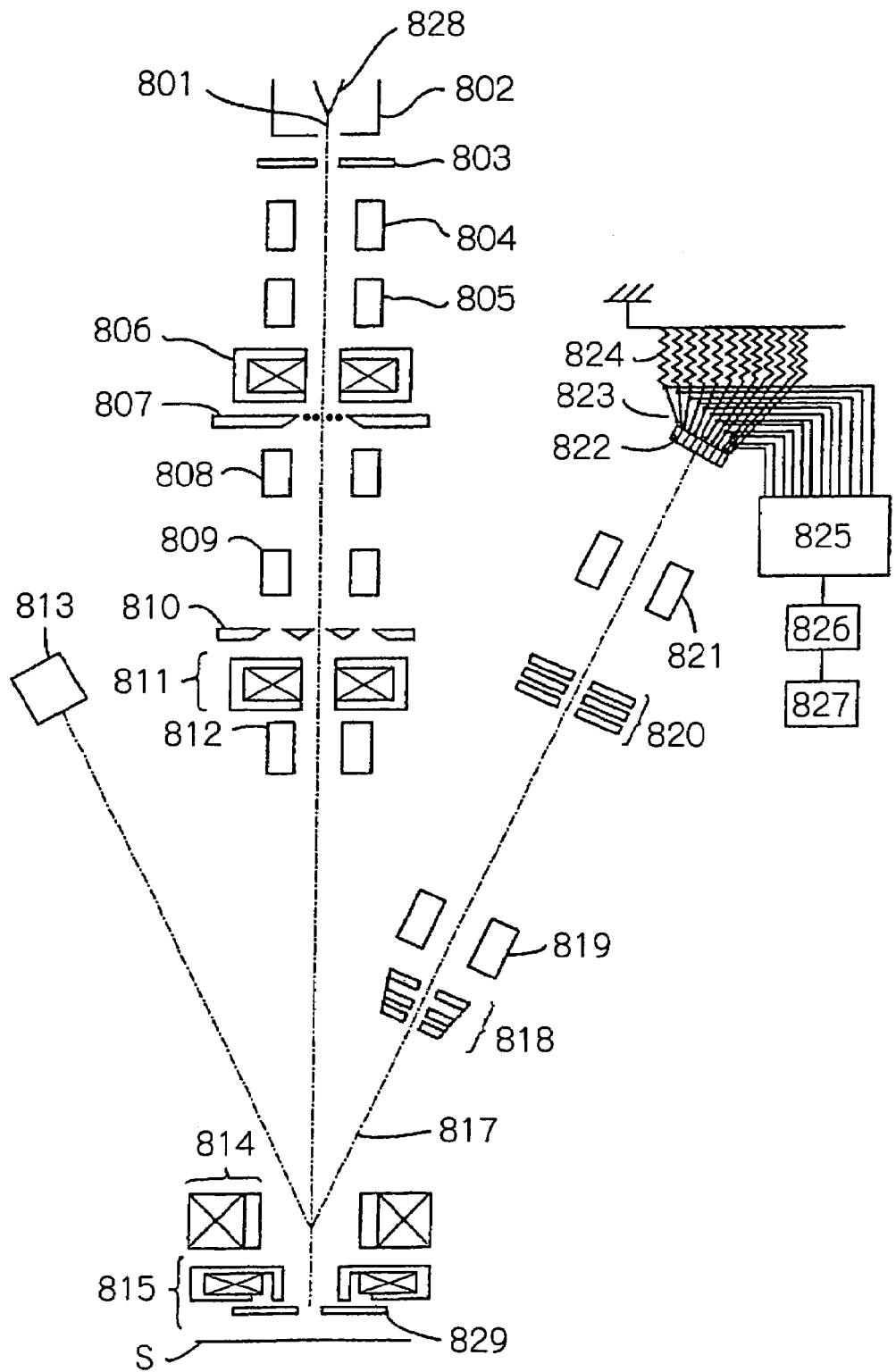
FIG. 18 is a schematic representation showing an electron optical system to be used in an embodiment of the present invention 3-2.

FIG. 18 illustrates details of the electron optical system to be used for the pattern evaluation method according to the present invention 3-2. The electron gun may comprise the cathode 801, the Wehnelt 802 and the anode 803. The cathode 801 is welded to the tungsten filament 828 for heating. The cathode 801 is heated by passing a current through the filament 828, and a current is supplied to the electron gun. The three electrodes are set each to have a given voltage in order to form diverging beams without forming a cross-over by the electron beams emitted from the electron gun. It has been found apparent by simulation that this results in the beam assuming a negative value for a third order spherical aberration. It is found apparent likewise by simulation that a false cross-over is formed behind the cathode when the trajectory of the diverging beam is magnified in the cathode direction.

The diverging beam emitted from the electron gun is converged with the condenser lens 806 forming a cross-over on the NA aperture 810. The multi-aperture 807 is disposed beneath the condenser lens 806 and the multiple apertures 807 generate multiple beams. If the cross-over having a dimension substantially smaller than the dimension of the NA aperture 810 is formed at the NA aperture 810 or in the vicinity thereof, the electron beambeams are not substantially blocked and substantially all the beams pass through the NA aperture without being blocked. Moreover, as the dimension of the NA aperture is set to be sufficiently larger than the dimension of the cross-over, no problem may occur even if the NA aperture does not strictly coincide with the position of the cross-over. Further, the aberration is determined by an angle of the aperture defined by the cross-over dimension so that no problem with aberration occurs. Therefore, it is not needed to strictly set an allowance value for adjustment of lenses.

An image of the cross-over is formed with the reducing lens 811 at the z-coordinate position at which the aberration slightly above the principal plane of the objective lens 815 becomes minimal. It is to be noted herein, however, that the aberration is greater at the aperture distant from the optical axis of the multiple aperture 807 than at the aperture closer to the optical axis thereof. An aberration may occur in the cross-over in the vicinity of the principal plane of the objective lens due to a difference between a spherical aberration of the cross-over to be formed with the electron gun and a spherical aberration by the condenser lens 806 and the reducing lens 807. In accordance with the present invention, as the cross-over to be formed by the electron gun has a negative spherical aberration, only an aberration corresponding to the difference between the two aberrations is caused to occur.

Therefore, in the event where the beams pass through the aperture distant from the optical axis of the multiple aperture 807, which exerts smaller influences than conventional ones, are arranged to cross the optical axis thereof at the z-coordinate position where the aberration is small at the principal plane of the objective lens, the difference in aberration from the beams passed through the aperture closer to the optical axis thereof the multiple aperture 807 can be alleviated. The scanning of the sample plane can be conducted by using the two-stage deflectors composed of the electrostatic deflector 812 and the electrostatic deflector inside the beam separator 814. The ratio of deflections between the two-stage deflectors may be set such that the main point of deflection is located at the position which is different from the cross-over position and is located slightly above the principal plane of the objective lens and where the deflection aberration becomes smallest.

The secondary electrons emitted from the scanning point on the sample S are attracted by an accelerating electric field formed by applying a voltage of approximately −4 kV to the sample and approximately +16 kV to the axially symmetric electrode 129 disposed below the objective lens, and the attracted secondary electrons are then accelerated and condensed. The secondary electrons emitted at an angle of +/−90° or smaller with respect to the normal line of the sample plane pass through the objective lens in the form of a small beam. The secondary electrons passed through the objective lens are separated with the beam separator 814 from the primary optical system and directed toward the secondary optical system 817. At this point, as the secondary electrons are made in the form of a very small beam, almost all the secondary electrons generated from the sample are led to the direction of the detector without mounting the NA aperture. Moreover, in order to improve a contrast of signals, a small aperture may be disposed in front of each detector to prevent a secondary electron of the adjacent beam from deviating from an original course.

A secondary electron group corresponding to multiple beams striking the secondary optical system 817 is treated with the magnifying lenses 818 and 820 to enlarge an separation between the mutual electrons, forming an magnified image of the scanning position with the MCP 822. The secondary electrons multiplied for each beam with the MCP 822 are absorbed with the multi-anode 823 and converted into a voltage signal with the resistance 824, then amplifying and converting into a digital signal with the amplifier and the A/D converter 825. A two-dimensional image is formed by the image-forming circuit 826 and the evaluation of defect inspection and so on is conducted with the comparator 827.

In order to enable an evaluation of beam resolution power and so on with the primary beam alone, a marker disposed at the z-coordinate position identical to the sample plane is scanned. The secondary electrons emitted from the marker are led to the single secondary electron detector 813 by reversing the direction of deflection of the beam separator 814. This permits an individual evaluation of each of multiple beams. The deflectors 804 and 805 are disposed for axial alignment with the condenser lens 806 and the multiple aperture 807, and the deflectors 808 and 809 are disposed for axial alignment with the NA aperture 810 and the reducing lens 811. The magnifying lens 818 is configured such that the outer lens shape is in a conical form so as to be readily disposed closer to the beam separator. The deflector 819 is driven in synchronization with the scanning of the primary beam and the secondary beam is arranged passing always through the center of the lens 820. The deflector 821 is driven in synchronization with the scanning and a correction is made to enable the secondary electrons to irradiate the MCP 822 at its given position.

In accordance with the present invention 3-2, the primary beam may be evaluated for intensity, resolution, relative position, posture and so on before the secondary beam is introduced into the secondary optical system. This enables an accurate adjustment of beams. Further, the primary and secondary beams are not intercepted at the NA aperture so that the beams each having a substantially equal intensity can be irradiated to provide secondary electron signals having an equal intensity.

Figure 19:
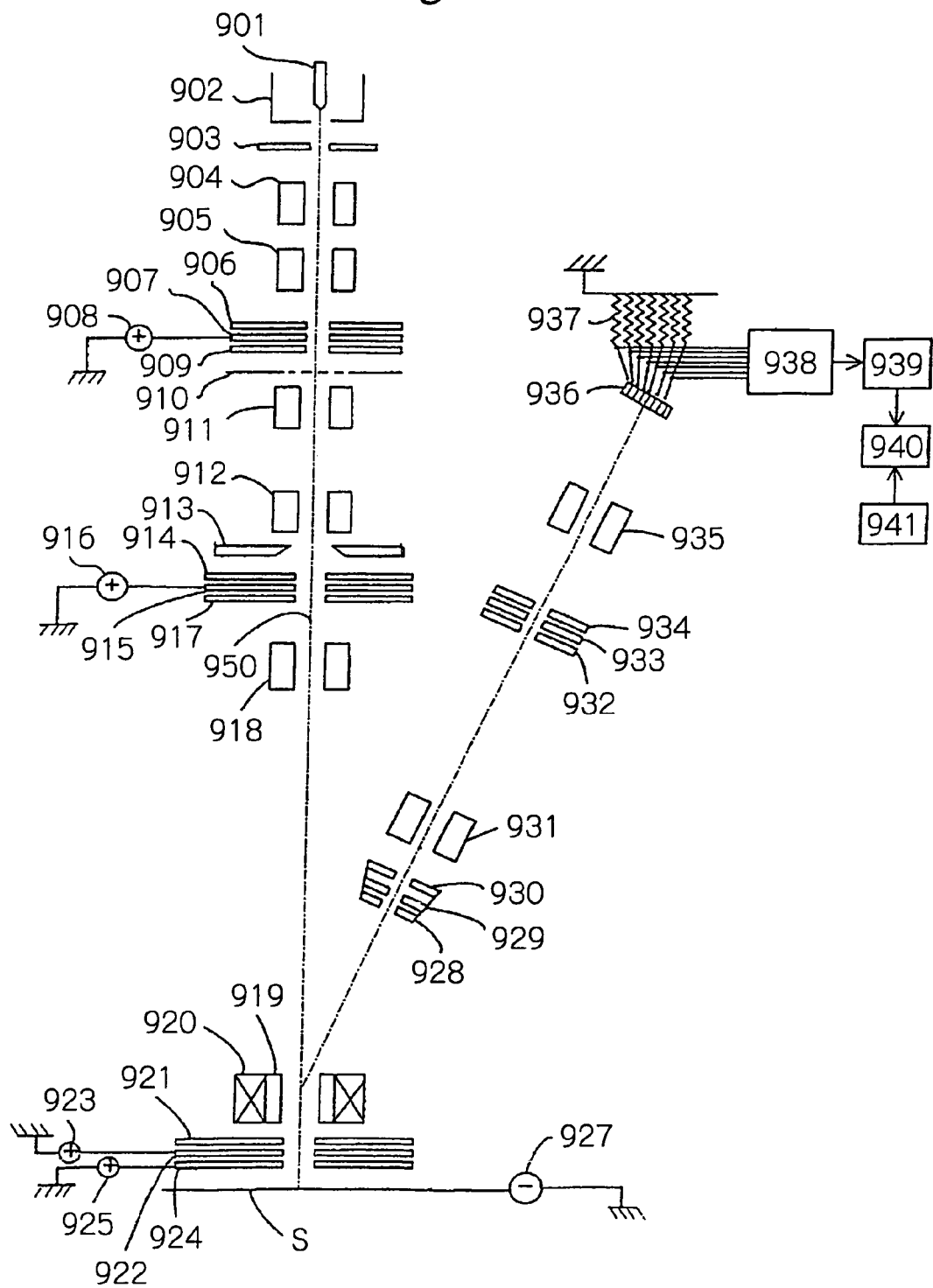
FIG. 19 is a schematic representation showing an electron optical system to be used in an embodiment of the present invention 3-3.
Figure 20:
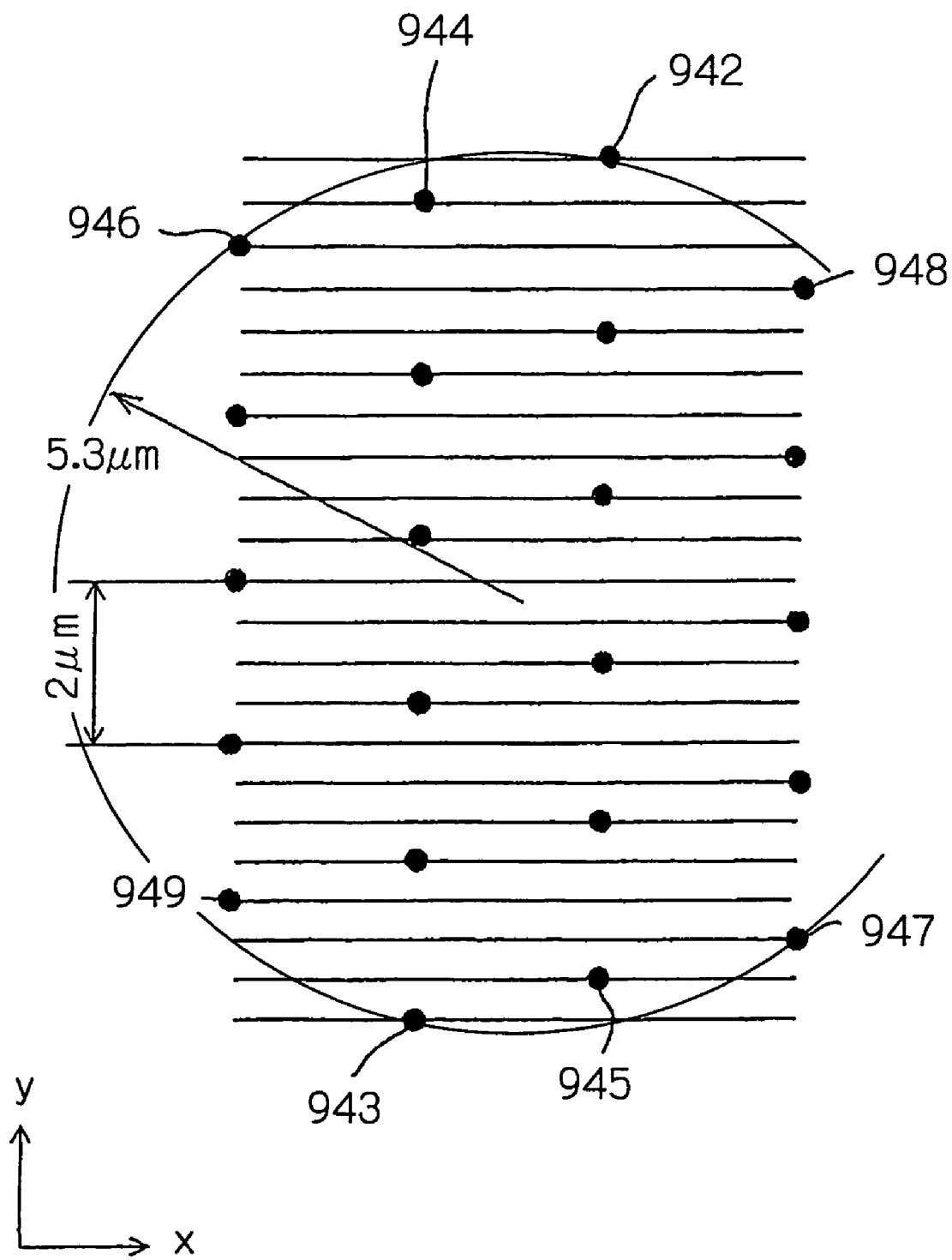
FIG. 20 is a view showing arrangements for multiple beams to be used in an embodiment of the present invention 3-3.

An embodiment of the present invention 3-3 will be described hereinafter in more detail with reference to FIGS. 19 and 20. FIG. 19 is a schematic representation illustrating an electron optical system to be used for the pattern evaluation method according to the present invention 3-2. An electron gun composed of the single crystal $LaB_6$ cathode 901, the Wehnelt 902 and the anode 903 is used under space-charge limit conditions to generate primary electron beams having a small shot noise. The deflectors 904 and 905 for axial alignment are disposed in a two stage to axially align the condenser lenses 906, 907 and 909 with the multiple aperture 910. The central electrode 907 of the condenser lenses is supplied with voltage from the positive high-voltage power source 908 enabling focussing the beams with a low aberration. This results in focusing the cross-over images formed by the electron gun at the NA aperture 913 with a small aberration.

Further, a small aberration can be likewise realized even if the condenser lens is replaced with an electromagnetic lens. For the beams passed through an aperture close to the optical axis and through an aperture remote therefrom, the principal light beams pass through the NA aperture 913. The deflectors 911 and 912 are disposed below the multiple aperture 910 in a two stage, thereby enabling an axial alignment of the NA aperture 913 with the reducing lenses 914, 915 and 917. The central electrode 915 of the reducing lenses is supplied with a high voltage from the positive power source 916 forming a reduced image of the multiple aperture 910. The reducing lenses 914, 915 and 917 can form an image of the NA aperture 913 at a position close to the upper electrode 921 of the objective lenses 921, 922 and 924. A spherical aberration can be made smaller by subjecting the reducing lens to positive voltage operations.

Moreover, a spherical aberration can be likewise made smaller by replacing the reducing lens with an electromagnetic lens. This replacement can make an aberration at a cross-over smaller and an aberration in respect of the reduced image of the multiple aperture 910 smaller as well. The reduced image of the multiple aperture 910 is further reduced by means of the objective lenses 921, 922 and 924, forming multiple beams on the sample S. For the objective lenses 921, 922 and 924, the central electrode 922 is supplied with a positive voltage from the power source 923 to enable operations for causing a lower aberration, and the lower electrode 924 can also be supplied with a positive voltage from the power source 925 to enable further reducing an aberration. The replacement of this lens with an electromagnetic lens can achieve a lower aberration. The sample S is scanned with multiple beams with the two-stage deflectors 918 and 919.

The secondary electrons emitted from the scanning point of the sample S is accelerated by an accelerating electric field formed by a positive voltage of the lower electrode 922 of the objective lenses 921, 922 and 924 and a negative voltage to be supplied to the sample S from the power source 927 and condensed smaller, then passing through the objective lenses 921, 922 and 924 and striking the beam separators 919 and 920 by which they in turn are deflected toward the direction of the secondary optical system. In the secondary optical system, the image of the electron beams is magnified by means of the first magnifying lenses 928, 929 and 930 as well as the second magnifying lenses 932, 933 and 934, disposed behind the beam separators 919 and 920, forming an image of the multiple beams in front of the MCP 936. The conditions for forming an image of primary electrons may include forming the point 950 immediately below the reducing lenses 914, 915 and 917 as an object point and, as a matter of course, forming an image point on the sample S. As the secondary electron has a beam energy far smaller than that of the primary electron, the image points of the secondary beams are formed in the vicinity of the beam separators 919 and 920 under objective lens conditions as set equally to the conditions for focusing the primary beams. The resulting image points of the secondary beams correspond to the object points of the first magnifying lenses 928, 929 and 930.

In order to operate the first magnifying lenses 928, 929 and 930 as magnifying lenses, it is needed to shorten a distance between the lens electrode 929 and the object point. This condition can be met by selecting the case of making an angle of deflection of the beam separators 919 and 920 and the case of sharpening the outer shape of the magnifying lenses 928, 929 and 930 in the form of a cone or a truncated cone with an upper half circle of its vertex having a smaller diameter. In the former, however, the problem resides in that a deflection chromatic aberration in the primary beam is so large that the primary beam cannot be finely narrowed down. For this reason, the latter is adopted for this embodiment of the present invention.

More specifically, in this embodiment, the outer shape of the magnifying lenses is arranged as a whole in the form of a truncated cone in such a manner that an outer diameter of the front electrode 928 is set to be smallest and an outer diameter of the central electrode 929 is set to be somewhat larger than that of the front electrode while an outer diameter of the rear electrode 930 is set to be largest. Further, in order to exert no influence on the passage of the primary beam, the lenses 928, 929 and 930 are disposed closer to the object point close to the beam separators 919 and 920. The secondary electron beams corresponding to the multiple beams irradiating the MCP 936 are each multiplied, absorbed with the multi-anode disposed close to the rear of the MCP 936, converted into an electric signal with the resistance 937, amplified, and converted into a digital signal with the A/D converter. A two-dimensional image is then formed with the two-dimensional image forming circuit 939. The two-dimensional image is compared with pattern data 941 with the comparator 940 to effect an evaluation for defect inspection and so on. Reference numerals 931 and 935 refer to deflectors, respectively.

In order to raise a throughput by an electron beam, the greater the number of beams in the multiple beams the better is the throughput. In the embodiment of the present invention, the number of the beams can be made greater by arranging multiple beams as indicated by reference numerals 942 to 949, inclusive, in FIG. 20. In this embodiment, 22 beams are formed within an area having a radius of 5.3 µm or smaller from the optical axis, in which a minimal separation between the beams is set to 2 µm and an separation between the beams projected in the y-direction is set to 0.5 µm. A two-dimensional image can be readily formed by scanning the beams in the x-direction. The process according to the present invention 3-3 can carry out a pattern evaluation with a high throughput because plural beams can be formed at a position close to one optical axis.

The present inventions 3-1 to 3-3 can be used for the method for manufacturing a semiconductor device as shown in FIGS. 7 and 8. When the pattern evaluation method for the evaluation of patterns can be used for an inspection step of the manufacturing method of FIG. 7, even a semiconductor having a fine pattern can be inspected with a high throughput resulting in an inspection of all numbers and improvements in a yield of products.

Figure 21:
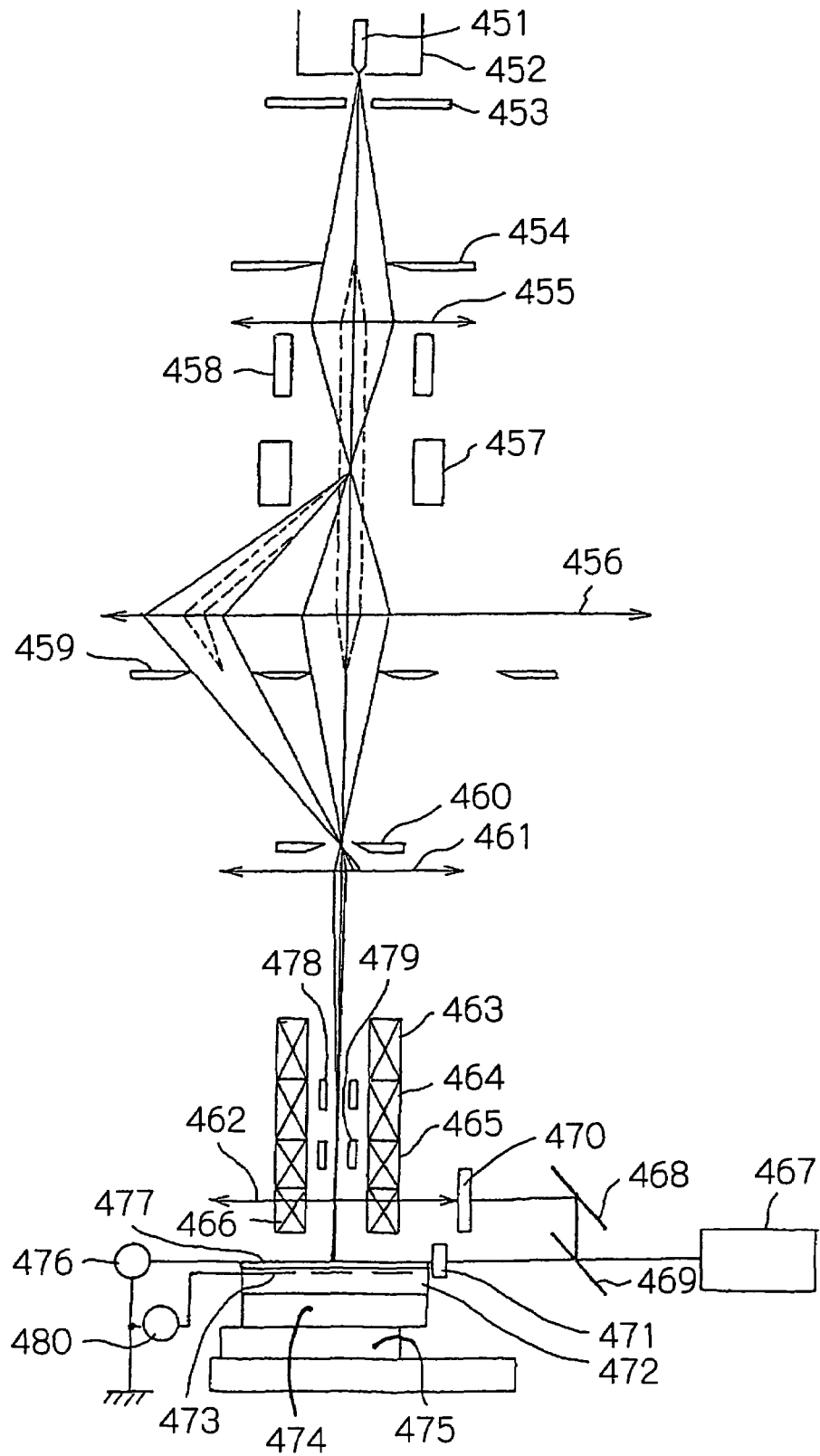
FIG. 21 is a schematic representation showing a pattern-drawing system to be used for the pattern-delineating method in an embodiment of present invention 4-1.

An example of the present invention 4-1 will be described with reference to FIG. 21 which in turn is a schematic representation showing a system to be used for the pattern-delineating method for forming patterns according to the present invention 4-1. An electron gun may comprise the $LaB_6$ cathode 451, the Wehnelt 452 and the anode 453. The cathode 451 can be operated under space-charge limit conditions making a shot noise smaller and further an edge roughness can be made smaller even if a pattern is formed at a dose as low as approximately 1 µc/cm$^2$. The electron beams emitted from the electron gun are accelerated to 2.5 keV and transmitted to the square-shaped beam-shaping aperture 454. The beams shaped square form an image with the aperture 454 at the character mask 459 with the shaping lenses 455 and 456. A cross-over is formed at an immediate point between the lenses 455 and 456 and the deflector 457 is disposed at that position. The deflector 457 can shift a character of the character mask 459 or change a dimension of a variable shaping beam. Further, the blanking deflector 458 for turning on or off the emitting of the electron beams is disposed at an upstream position distant from the cross-over.

The beam patterned with the character mask 459 is restricted with the NA aperture 460 so as for the aberration to meet the specification value and reduced with the reducing lens 461 and the objective lens 462 to a defined contraction ratio. The beam is then aligned and focused on the wafer 477. At this point, a positive high voltage of +12.5 keV is applied to the wafer 477 so that the wafer 477 is irradiated with electron beams having energy of +15 keV corresponding to the difference between the positive high voltage of +12.5 keV and the cathode voltage of −2.5 keV. As the electron beams having this energy transmit throughout an entire thickness of 500 nm of a monolayered resist and can sensitize the resist, the monolayered resist can be used. The high-voltage power source 476 can be adjusted to provide an optimal beam energy for the monolayered resist as the resist varies with a thickness. The x-directional length of the scanning field is 1 mm. The magnetic fields of the four-stage electromagnetic deflectors 463, 464, 465 and 466 are superimposed on the magnetic field of the electromagnetic lens 462 to provide a beam edge resolution of 0.05 µm on the wafer 477 by implementing an aberration correction.

The beam position in the 50 µm subfield can be made to vary at a high speed by using the electrostatic deflectors 478 and 479 disposed inside the electromagnetic deflector. The deflectors 478 and 479 are arranged such that the surface of the main ceramic body is partially coated with metal as an electrode in order to prevent an eddy current. The wafer 477 is chucked in a flat state with the electrostatic chuck 472. A pattern is drawn by moving the y-stage 474 continually in one direction and the x-stage 475 stepwise for moving the stripes. In the event where a positive voltage of 12.5 keV is applied to the wafer 477, a positive high-voltage of approximately 10 keV is applied to the electrostatic chuck electrode 473. As the wafer 477 may have a layer which may cause an element breakage when a high voltage is applied rapidly thereto, the power sources 476 and 480 are controlled to maintain the difference in voltage between the electrostatic chuck electrode 473 and the wafer 477 at 2.5 keV and at the same time the voltage to be applied to the wafer 477 is elevated or lowered at a rate of 100 V/sec or lower.

In order to measure the position of the wafer 477, the light transmitted from the laser oscillator 467, passed through the beam splitter 469 and reflected from the beam-moving mirror 471 and the light transmitted from the laser oscillator (light receiver) 467 separated from the beam splitter 469 are sent to the reflecting mirror 468 and the laser-stationary mirror 470. The two lights reflected with these mirrors are caused to interfere with each other and a variation with the intensity is detected with the light receiver 467 to compute the speed at which the wafer 477 is being moved. The integration of this speed can compute the position of the wafer 477. The laser-stationary mirror 470 is attached to a pole piece of the objective lens 462 to measure the relative position of the mirror mount and the wafer 477 in most accurate manner.

As the beam energy needed at the time of varying the dimension of the variable shaping beam, selecting the character on the character mask or effecting blanking is as small as 2.5 keV, it is easy to control the electron beams at a high speed. On the other hand, the landing energy can be elevated to 15 keV by applying an accelerating voltage to the wafer so that the beam transmits throughout an entire thickness of a monolayered resist to sensitize the resist. Therefore, a throughput can be improved and a cost-of-owner can be made smaller.

As described above, the pattern-delineating method according to the present invention 4-1 can readily control electron beams at a high speed in an upstream stage. On the other hand, a large energy can be provided by accelerating the electron beams in a stage before the wafer is irradiated with the electron beams so that the monolayered resist can be used on the wafer. Moreover, as a lens other than the objective lens uses electron beams having a small energy, an electrostatic lens can be used to form an electron optical system of a compact size and at a low cost.

Figure 22:
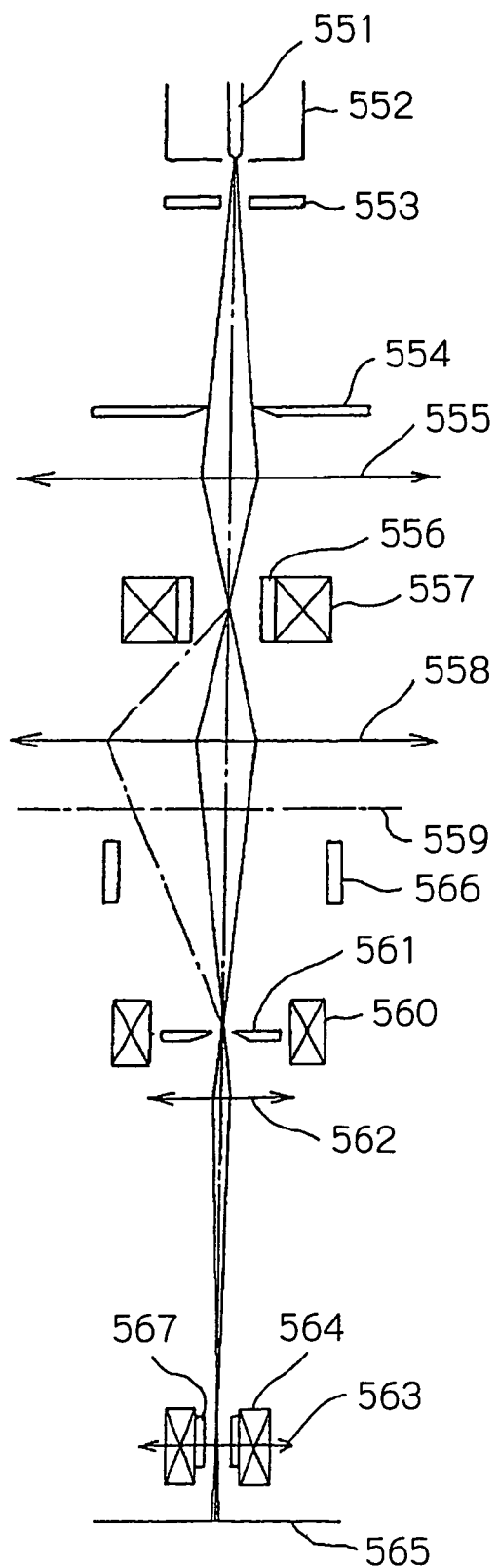
FIG. 22 is a schematic representation showing an electron beam system to be used in the present invention 4-2.

The following is a description regarding the present invention 4-2 with reference to FIG. 22 to FIG. 25. FIG. 22 illustrates an electron optical system to be used for the pattern-delineating method according to the present invention 4-2. An electron gun may comprise the cathode 551 to which a voltage of −2.5 keV is applied, the Wehnelt 552 and the anode 553. The cathode 551 may be made of single crystal $LaB_6$ and can decrease a shot noise to ¼ or lesser as compared with the case of a ZrO/W shottkey cathode, when the cathode 551 is operated under space-charge limit conditions. Therefore, even if a pattern is formed with a small dose, an edge roughness can be controlled at a low level. The electron beams emitted from the electron gun is transformed into a square image by passing through the square shaping aperture 554. The image is focused on the character mask 559 with the lenses 555 and 558. The cross-over to be formed by the electron gun is focused at the center of deflection of the deflector 557 for selecting a character with the lens 555, forming an image which in turn is further focused on the NA aperture 561 with the lens 558 and then focused at a position close to the objective lens 563 with the reducing lens 562.

The selection of the character mask 559 and the shift between the character mask and the variable shaping beam are effected with the electromagnetic deflector 557. Upon varying the beam size of the variable shaping beam, the electrostatic deflector 556 is used. For blanking the beam, the blanking deflector 566 and the NA aperture 561 acting as a blanking aperture are used. An image by the variable shaping beam or an image by the character mask 559 is formed with the reducing lens 562 and the objective lens 563 as a reduced image on the wafer 565. For the objective lens 563, there may be used an electromagnetic lens. By decreasing aberration by means of the objective lens 563 and the electromagnetic deflector 564, a 1.6 mm width can be scanned. For alignment within the subfields, a sub-field deflector 567 which is an electrostatic deflector is used. In the drawing, reference numeral 560 refers to a deflector for correction.

A description will be made regarding the pattern-delineating method according to a first embodiment of the present invention 4-2 with reference to FIG. 23. The system of FIG. 22 can realize a throughput at a rate of approximately 10 wafers/hour, in the event where a number of patterns is small as in the case of forming a contact hole. In the event where a large number of patterns are required, however, the system of FIG. 22 can realize a throughput at a rate as many as approximately 3 wafers/hour. Therefore, a majority of forming patterns for layers is conducted by ArF lithography. Now, a description will be made hereinafter regarding the case of forming patterns by electron beams on a total number of three layers comprising a gate layer and two contact hole layers.

In the contact hole layer, a probability at which a boundary line of a stripe crosses a pattern is so low that attention is needed to be paid to the fact that a gate pattern does not cross a boundary line of a stripe in the gate layer. In this case, an intersection of the gate pattern with the boundary line of the stripe can be avoided without shaping the stripes in an uneven form by making a stripe width variable within the range, for example, from 1.5 mm to 1.6 mm without using a full stripe width range of 1.6 mm. In this case, it is to be noted that, as shown in FIG. 23, a stripe width of each of a stripe divided by a gate layer 571, a stripe divided by a first contact hole layer 572 and a stripe divided by a second contact hole layer 573 is set to become equal to each other at the identical positions of the three layers when counted from each end.

Figure 23:
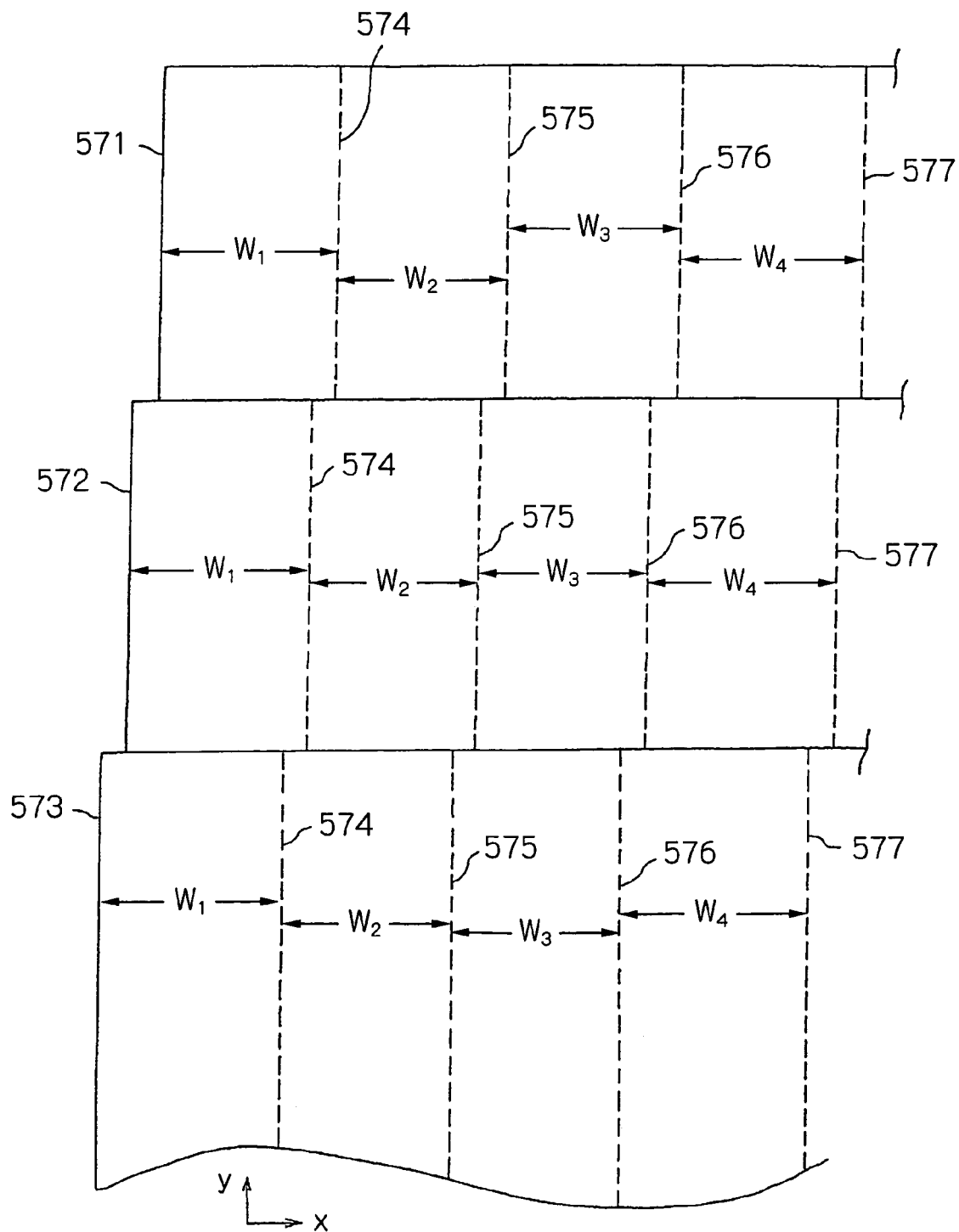
FIG. 23 is an magnified view showing three layers at locations in the vicinity of upper left side in the first embodiment of the present invention 4-2.

In FIG. 23, reference numerals 574, 575 and 576 refer each to a boundary line of a stripe divided. As specifically shown in FIG. 23, a distance of a pattern from the left-hand end to the boundary line 573 is designed to become equal among the gate layer 571, the first contact hole layer 572 and the second contact hole layer 573. It is further to be noted herein that each width W1 of the first stripes from among the three layers is set to be different from each width W2, W3, W4, et seq., of the second, third, fourth, et seq., when looked at FIG. 23 toward the right.

Figure 24:
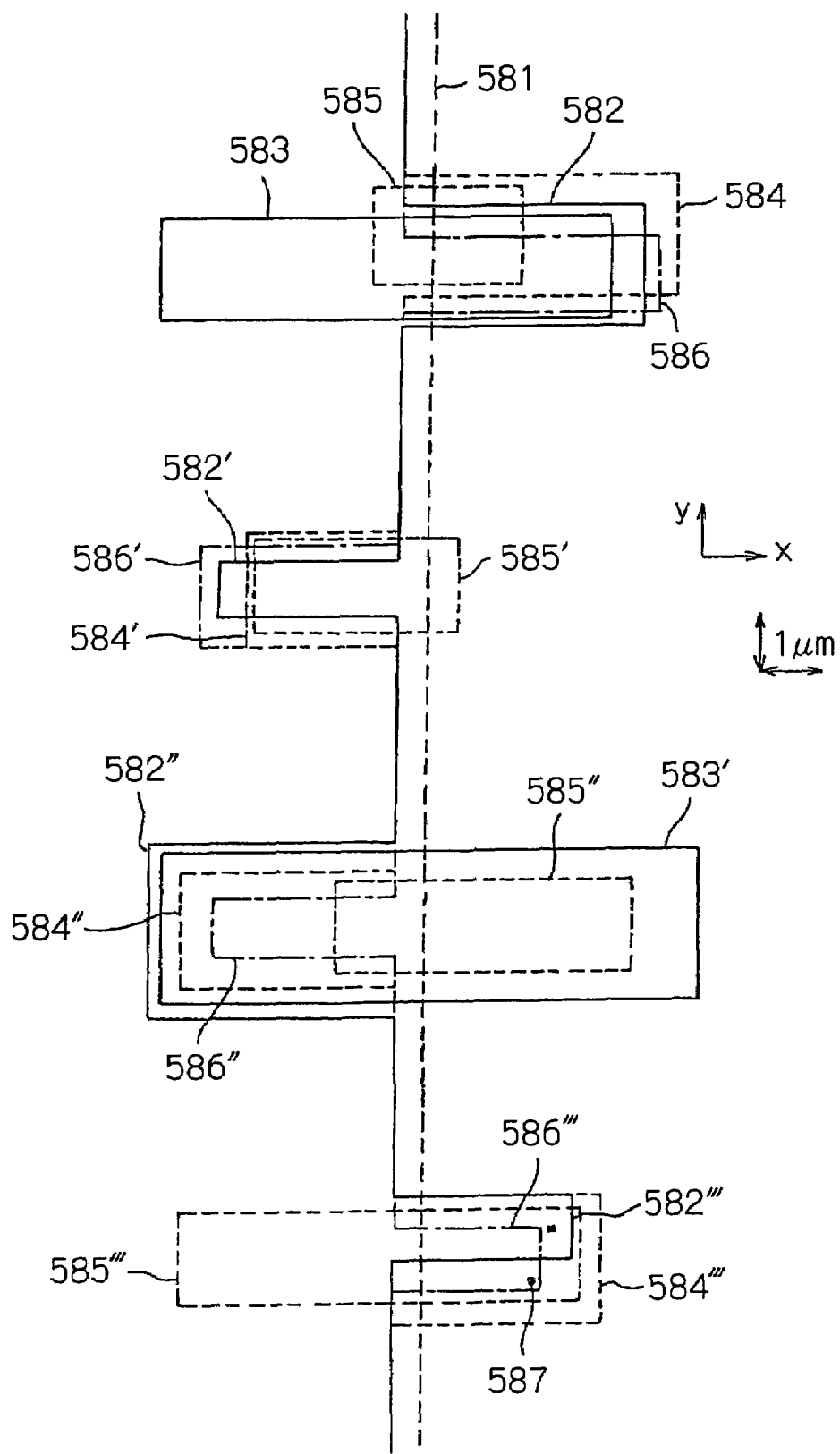
FIG. 24 is an magnified view showing a location in the vicinity of the boundary line of the stripes in the second embodiment of the present invention 4-2.

A description will now be made regarding the pattern-delineating method according to a second embodiment of the present invention 4-2 with reference to FIG. 24. In this device, patterns can also be formed with electron beams on a layer for forming a source drain, in addition to the gate layer and the contact hole layers. In the layer for forming the source drain, the transistor characteristics may become poor if its connection precision is low, although the stripes are large. Therefore, an intersection of a stripe with a pattern has to be avoided in order to ensure good transistor characteristics. FIG. 24 is an magnified view illustrating a portion in the vicinity of a boundary of stripes according to the second embodiment of the present invention. In the drawing, solid lines refer to stripe boundary lines in the source drain layer, e.g., 582, 582', 582" and 582''', and to patterns in the source drain layer, e.g., 583, 583', 583" and 583'''. Broken lines refer to stripe boundary lines in the gate layer, e.g., 584, 584', 584" and 584''', and to patterns in the gate layer, e.g., 585, 585', 585" and 585'''. Dot-chain lines refer to stripe boundary lines in the contact hole layer, e.g., 586, 586', 586" and 586'''. A pattern 587 in the contact hole layer is indicated as a black dot because it is so small. Reference numeral 581 refers to a stripe boundary line in the event where a stripe width of 1.59 mm is adopted in the source drain layer, which is determined from the substantially largest field of an electron optical mirror mount of the electron beam system, however, the intersection of the stripe boundary line with the pattern can be lowered in the event where the stripe width is set to become smaller by approximately 0.5 mm as indicated by solid line.

It is to be noted that the stripe boundary line in the source drain layer is disposed projecting to the right as indicated by reference numeral 582. This configuration results in order to avoid the intersection with the pattern 583. On the contrary, the stripe boundary line immediately thereunder as indicated by reference numeral 582' is disposed projecting to the left. This configuration is arranged in association with a left-hand projection of the stripe boundary line 584' of the gate layer in order to avoid an intersection with a pattern 585' in the gate layer. Moreover, the stripe boundary line 582" of the source drain layer located immediately thereunder is disposed projecting to the left as indicated by 582" in order to avoid an intersection with the pattern 583'. Likewise, the stripe boundary line 582''' of the source drain layer located immediately thereunder is disposed projecting to the right. This configuration is arranged in association with a right-hand projection of the stripe boundary line 584''' in the gate layer in order to avoid an intersection with the pattern 585''' although there is no pattern that has to be avoided.

The stripe boundary lines 584, 584', 584" and 584''' in the gate layer are disposed in an irregular arrangement in the same direction as the stripe boundary lines 582, 582', 582" and 582''' in the source drain layer, as shown in the drawing. The stripe boundary lines 586, 586', 586" and 586''' in the contact hole layer are disposed in an irregular arrangement in the same direction as the stripe boundary lines in the other layers, as indicated by dot-chain lines in the drawing. In the three layers as a whole, the x-directional and y-directional coordinates between the stripe boundary lines are each set to assume a difference of 1 μm or lesser.

A description will now be made regarding a summary of procedures for determining the stripe boundary lines as shown in FIG. 24. It is first determined that each pattern is formed by electron beams in the gate layer, the layer forming a source drain and the contact hole layer and patterns are formed in other layers by ArF lithography. Then, a stripe boundary line 581 is temporarily determined in a layer where the patterns are formed by the electron beams. The patterns 583, 583', 583" and 583''' are extracted, which may raise problems if they would cross the temporary boundary line 581. A shorter length of projection of each of these patterns from the temporary boundary line 581 (indicated by broken line) is shaped into a convex form directed to either the left or the right, A this time, it is to be noted as a matter of course that, for all stripes, a stripe width ranging from the boundary line of the convex portion to the boundary line of the convex portion should not exceed a substantially effective main field width of 1.6 mm.

The convex and concave portions of the boundary lines of the stripes where patterns are drawn by electron beams are disposed elongating in equal directions among all the layers. Generally, it is sufficient enough in many cases if at least two layers coincide with each other. In addition to coincidence in the directions of elongation of the convex and concave portions of the stripe boundary lines, it is more preferred to limit a difference of a dimension (in this case, e.g., 1 μm) between the x-coordinate and the y-coordinate of the stripe boundary lines of each layer. This limit can prevent worsening of precision in alignment among the layers.

Figure 25:
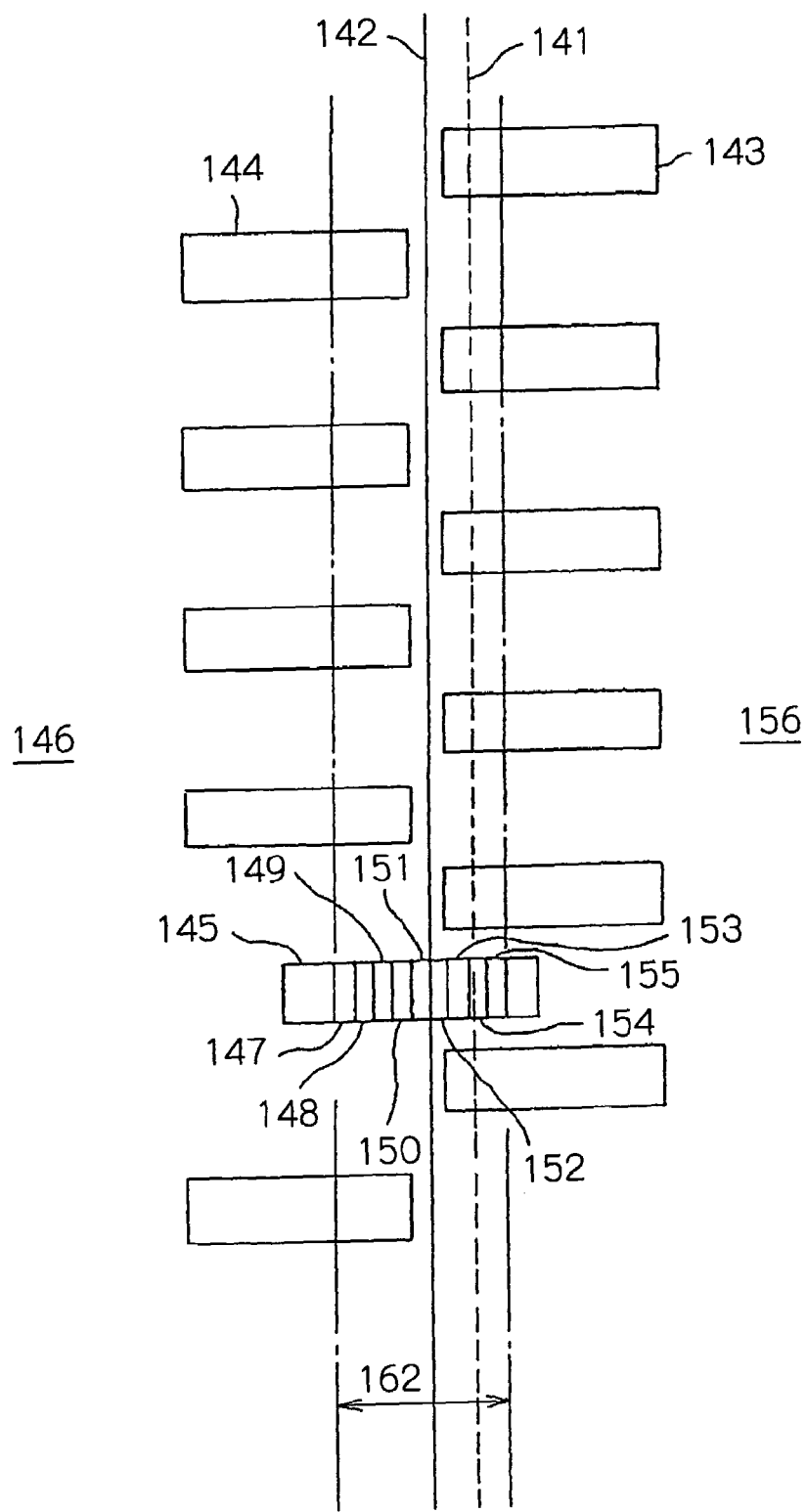
FIG. 25 is an magnified view showing a location in the vicinity of the boundary line of the stripes in the third embodiment of the present invention 4-2.

A description will now be made with reference to FIG. 25 regarding a third embodiment according to the present invention 4-2. In this embodiment, the contact hole layer and the gate layer are formed with patterns by electron beams, however, device performance will worsen if a precision of alignment among the layers is poor. In this embodiment, an attempt to solve this problem with delineation precision is made by delineating the stripes in an inclined fashion, unlike convex and concave arrangement for the stripe boundary lines as described above.

First, a pattern region is divided into stripes by a substantially larger field of an electron optical system to determine the boundary line 141. This stripe boundary line 141, however, divides the pattern 143, etc. The patterns may cause this problem if a precision of etitching between the stripes is +/−20 nm. Thus, in this embodiment, the stripe width is shortened to 0.7 mm and a stripe boundary line is set as indicated by solid line as reference numeral 142. The stripe boundary line 142 does not divide all the patterns except pattern 147. Therefore, this arrangement can greatly reduce a number of patterns that will be divided by the stripe boundary line 142.

All of the stripe boundary lines of the layer where the alignment precision between the layers may become an issue are arranged in the same manner as the stripe boundary line 142. For the layer where a pattern intersects with the stripe boundary line 142 as in the case of the pattern 145, the stripe is provided with an overlap region 162. In the overlap region 162, the pattern 145 is divided into smaller patterns, for example, nine smaller patterns 147 to 155, inclusive. Doses of the small-divided patterns upon pattern formation by the left stripe 146 are set in this order: 0.9, 0.8, 0.7, 0.6, 0.5, 0.4, 0.3, 0.2 and 0.1, while doses of the small-divided patterns upon pattern formation by the right stripe 156 are set in this order: 0.1, 0.2, 0.3, 0.4, 0.5, 0.6, 0.7, 0.8 and 0.9, respectively. A combination of the dose by the stripe 146 with the respective dose by the stripe 156 scores a total of 1.0 for each small-divided pattern, that is, in such a manner that the other pattern is provided with the same doses.

The above configuration can solve almost all problems with a poor connection precision and the issue involved in a lack of an alignment precision between the layers can be reduced to a great extent. It is provided, however, that the measures regarding a connection failure can be involved only in stitching between the stripes and are not applied to a failure of the subfields or a defect of connection between the subfields. This is because a defect of subfield stitching can be corrected with a high precision, as compared with a defect in connection of the stripes so that it should be dealt with by improvements in precision. As described above, in the embodiment according to the present invention 4-2, the problem with a poor stripe connection can be improved without worsening in the alignment precision among the layers.

Figure 26:
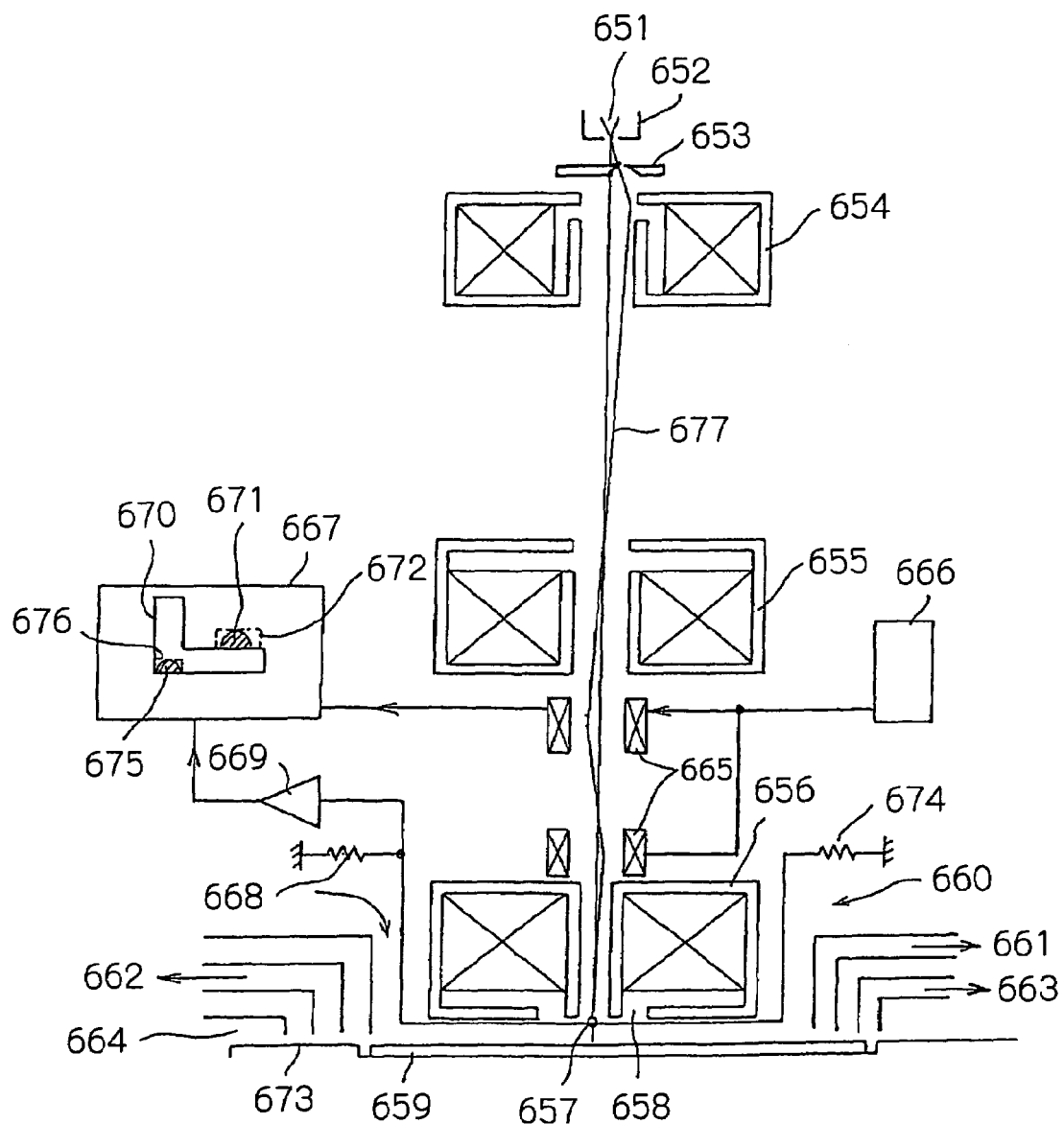
FIG. 26 is a schematic representation showing a mask repair system to be used for the first mode according to the present invention 4-3.

A description will be also made regarding the present invention 4-3 with reference to FIGS. 26 and 27. FIG. 26 illustrates an electron beam system according to the present invention 4-3. A device is commercially available in which the cathode 651 with a ZrO/W spot-welded to a tungsten filament is set to the shottkey shield 652. The anode 653 is provided with an aperture, 100 μm in diameter, at a position distant from the optical axis, although having no aperture on the optical axis. The principal light beams passed through an aperture of the anode 653 are adjusted with the electromagnetic lens 654 to form a cross-over in front of the reducing lens 655. A reduced image of the aperture of the anode 653 is formed below the reducing lens 655 with the lenses 654 and 655 and the image is further reduced to approximately 1/100 on the mask with the objective lens 656. The objective lens 656 is arranged to have an aberration of approximately 10 nm by means of the electromagnetic lens with its lens gap disposed on the mask side forming a beam with a beam size of approximately 14 nm when the beam is conformed to a dimension of the reduced image of 10 nm.

The mask surface can be supplied with gas for use in etching or deposition from the gas inlet 660 or with $H_2O$ gas having a large multiplication rate of secondary electrons. A differential exhaust mechanism is provided in order that the mask chamber is not filled with such a reactive gas, thereby capable of discharging exhaust gas from each exhaust outlet to the rotary pump 661, the mechanical booster pump 662 and the TMP pumps 663 and 664.

Further, in order to reduce an amount of those gases with the object penetrating into the mirror mount, the objective aperture 657 acting as a pressure limit aperture and a NA aperture is minimized to, e.g., 30 μmf in diameter, and maintains a pressure ratio in the order of four digits or larger between the inside and outside of the mirror mount. The objective aperture 657 can be finely adjusted in the XY direction with the XY-alignment mechanism 674 accurately on the optical axis while looking at a SEM image.

The secondary electrons emitted from the mask are multiplied upon impact with $H_2O$ gas or other gases and converted into voltage through the resistance 668 after absorption by the aperture 657. The electric signal is then amplified with the amplifier 669 and introduced into the CRT monitor 667 for brightness modulation, thereby forming a secondary electron signal for a SEM image. Simultaneously, the CRT monitor 667 is supplied with a signal from a deflection control current 666 forming a pattern image 670 of the mask on the CRT monitor 667.

As the position of the black defect 671 is confirmed on the CRT monitor 667, the scanning region 672 containing the black defect 671 is determined, and a chlorinated gas is introduced into the scanning region to repair the black defect 671. On the other hand, in the event where the white defect 675 exists, a gas derived from a tungsten compound, e.g., W(CO), is introduced to scan the region 676 for deposition on the white defect.

The above description relates to the case where the mask 659 may be made of chromium in a normal way. Where a material is $SiO_2$ as for a phase shift mask, gas containing a fluorine such as, for example, $SF_6$, $CF_4$, etc. may be used for etching and a Si compound such as, for example, silane ($SiH_4$), TEOS (tetraethoxysilane), etc. may be used for deposition. In the case where the mask is of a semi-transparent membrane made of molybdenum (Mo) a chlorinated gas or a fluorinated gas such as, for example, $CCl_4O_2$, $CF_4$, $NF_3$, etc., may be used for etching and a mixed gas composed of a molybdenum compound and a silcon compound may be used for deposition.

The gas passed through the aperture 657 is converted into ions upon impact with electrons and led to the cathode side along the trajectory 677. The ions pass straight without being curved almost thoroughly with the electromagnetic lens 654 and blocked with the aperture of the anode 653. Therefore, they do not attack the cathode 651.

A liquid or a solid may also be used as a substitute for the gas to be introduced at the time of etching or deposition. In the case of a liquid, a repair portion is sprayed and coated by means of a spin coater or a jet printing mechanism and then irradiated with electron beams. In the case of a solid, pulverized superfine particles or nano-particles are sprayed or shaped in the form of a solution in the same manner as in the case of a liquid.

In another embodiment where secondary electrons are detected, as shown in FIG. 27, a positive voltage is applied to the aperture 657 as a NA aperture from the power source 681 and the secondary electrons emitted from the scanning point of the mask 659 may be accelerated and condensed, thereafter passing through the aperture 657, leading by the beam separator 685 toward the secondary electron detector 688 along the trajectory 687 where the secondary electrons are to be detected, and forming a SEM image. If the voltage to be applied to the aperture 657 as the NA aperture would be too high, it will be emitted. On the other hand, if the voltage would be too low, secondary electron detection efficiency may be worsened. It is therefore needed to determine an appropriate voltage by experiments. Moreover, a supply of gas may be ceased to decrease a pressure of gas at the time of acquiring the SEM image, thereafter applying voltage to the aperture 657.

As described above, the invention 4-3 can control unnecessary etching and deposition to a satisfactory extent by changing the kind of gases or pressure at the time of obtaining the SEM image or at the time of etching or deposition.

Moreover, the invention 3-1 to 3-3, inclusive, can be applied to the method for manufacturing the semiconductor device as shown in FIGS. 7 and 8. When these pattern evaluation methods according to the present invention are used for the inspection step of the manufacturing method of FIG. 7, a semiconductor device having fine patterns can be inspected with a high throughput, enabling an inspection of all number of patterns and improving a yield of products.

The invention claimed is:

1. A method for evaluating a pattern on a sample plane with plural beams, comprising the steps of:
   (a) forming multiple beams by irradiating plural apertures with an electron beam emitted from an electron gun having a cathode;
   (b) forming a cross-over of a beam passed through the plural apertures on an aperture having a dimension substantially larger than a dimension of the cross-over or at a position in the vicinity of the aperture;
   (c) focusing a magnified cross-over by a condenser lens at a Z-coordinate position in the vicinity of a principal plane of an objective lens;
   (d) forming a reduced image of an image of the multiple beam on the sample plane with at least a reducing lens and an objective lens;
   (e) scanning the sample with the multiple-beams by using at least a two-stage deflector disposed between the reducing lens and the objective lens;
   (f) accelerating and focussing a secondary electron group emitted from the scanning point on the sample with an objective lens;
   (g) deflecting the secondary electron group passed through the objective lens with an electromagnetic deflector and sending it to a secondary optical system;
   (h) magnifying a mutual distance of the secondary electron group by the secondary optical system and leading the secondary electron group to plural secondary electron detectors; and
   (i) evaluating a pattern on the sample plane from a signal detected with the detector;
   wherein a cross-over to be formed by the electron gun for irradiating the plural apertures has a negative spherical aberration.

* * * * *